(12) United States Patent
Sato et al.

(10) Patent No.: US 12,190,817 B2
(45) Date of Patent: Jan. 7, 2025

(54) PIXEL CIRCUIT, DISPLAY PANEL, DISPLAY DEVICE, AND COMPOSITE DISPLAY DEVICE

(71) Applicant: KYOCERA Corporation, Kyoto (JP)

(72) Inventors: Yohei Sato, Muko (JP); Takanobu Suzuki, Itami (JP); Hiroaki Ito, Ritto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 18/563,360

(22) PCT Filed: May 9, 2022

(86) PCT No.: PCT/JP2022/019649
§ 371 (c)(1),
(2) Date: Nov. 21, 2023

(87) PCT Pub. No.: WO2022/249869
PCT Pub. Date: Dec. 1, 2022

(65) Prior Publication Data
US 2024/0221665 A1    Jul. 4, 2024

(30) Foreign Application Priority Data

May 26, 2021    (JP) ................ 2021-088712

(51) Int. Cl.
*G09G 3/3233* (2016.01)
*G09G 3/32* (2016.01)

(52) U.S. Cl.
CPC ............ *G09G 3/3233* (2013.01); *G09G 3/32* (2013.01); *G09G 2300/0426* (2013.01);
(Continued)

(58) Field of Classification Search
None
See application file for complete search history.

(56) References Cited

U.S. PATENT DOCUMENTS

2007/0001945 A1*  1/2007  Yoshida ............... G09G 3/3233
345/87
2008/0068298 A1   3/2008  Shen et al.
(Continued)

FOREIGN PATENT DOCUMENTS

JP      63-155191 A    10/1988
JP     2007-041580 A   2/2007
(Continued)

*Primary Examiner* — Parul H Gupta
(74) *Attorney, Agent, or Firm* — Procopio, Cory, Hargreaves & Savith LLP

(57) ABSTRACT

A pixel circuit includes a first and a second subpixel circuits. The first subpixel circuit includes a first and a second light emitters, and a first setter that sets the first and second light emitters to an emissive or a non-emissive state. The second subpixel circuit includes a third and a fourth light emitters, and a second setter that functions in the same manner as the first setter. The pixel circuit is in at least one of a connection different or an emitter number different state. In the connection different state, a connection between the first and second light emitters is a series or a parallel connection and a connection between the third and fourth light emitters is the other connections. In the emitter number different state, the first and second light emitters are emissive wholly or selectively and the third and fourth light emitter is in the opposite manner.

17 Claims, 26 Drawing Sheets

(52) U.S. Cl.
    CPC ........... *G09G 2300/0804* (2013.01); *G09G 2300/0842* (2013.01); *G09G 2300/0861* (2013.01); *G09G 2330/10* (2013.01)

(56) References Cited

U.S. PATENT DOCUMENTS

| | | |
|---|---|---|
| 2022/0139300 A1 | 5/2022 | Yokoyama et al. |
| 2022/0149079 A1 | 5/2022 | Kang et al. |
| 2022/0157230 A1 | 5/2022 | Suzuki |

FOREIGN PATENT DOCUMENTS

| | | |
|---|---|---|
| KR | 10-2020-0098767 A | 8/2020 |
| WO | 2020/174879 A1 | 9/2020 |
| WO | 2020/202766 A1 | 10/2020 |

* cited by examiner

FIG. 7

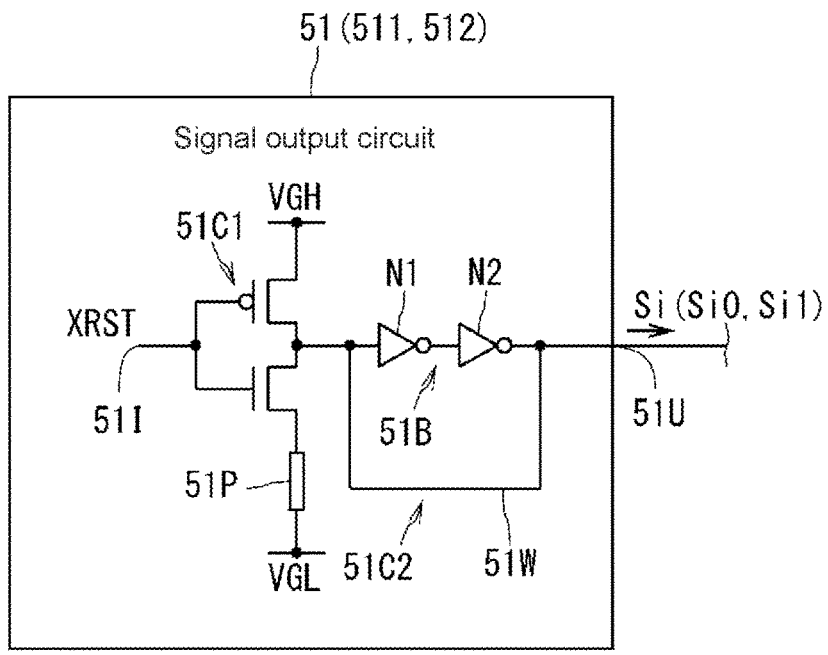

FIG. 8

| Pattern no. | Switch signal | | Setting control signal | | | | Light emitter(s) set to emissive state | |
|---|---|---|---|---|---|---|---|---|
| | Si1 | Si0 | Se4 | Se3 | Se2 | Se1 | First subpixel circuit | Second subpixel circuit |
| 1 | L | L | H | L | L | L | First and second light emitters | Third light emitter |
| 2 | H | L | L | H | L | L | First and second light emitters | Fourth light emitter |
| 3 | L | H | H | L | H | L | First light emitter | Third light emitter |
| 4 | H | H | L | H | L | H | Second light emitter | Fourth light emitter |

FIG. 9

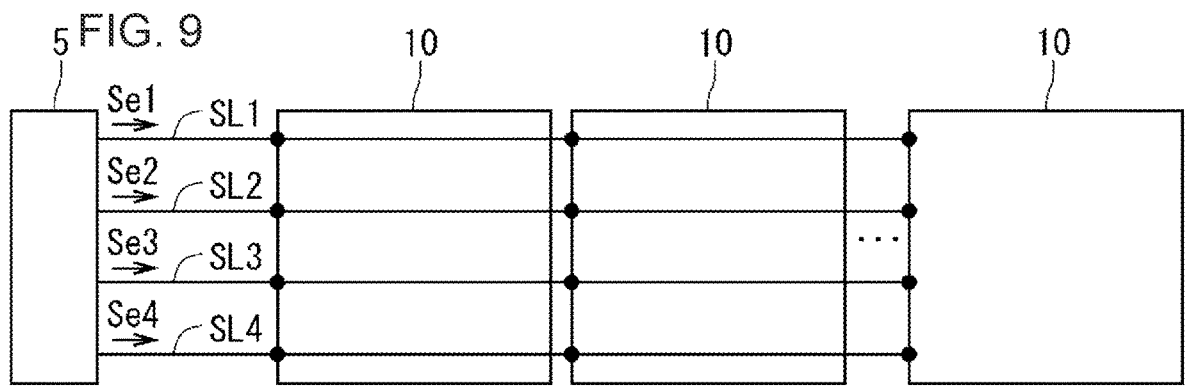

FIG. 10

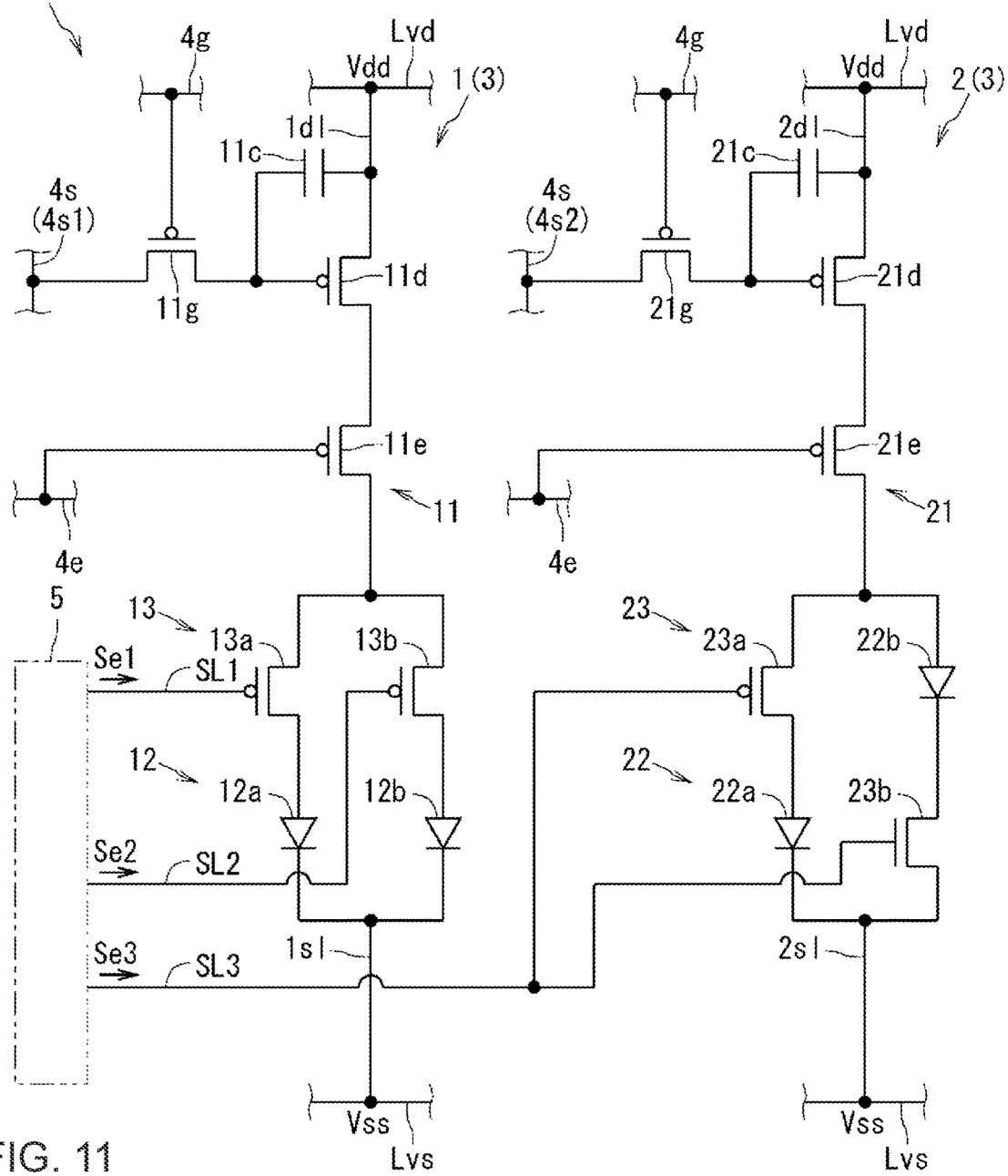

FIG. 11

| Pattern no. | Switch signal | | Setting control signal | | | Light emitter(s) set to emissive state | |
|---|---|---|---|---|---|---|---|
| | Si1 | Si0 | Se3 | Se2 | Se1 | First subpixel circuit | Second subpixel circuit |
| 1A | L | L | L | L | L | First and second light emitters | Third light emitter |
| 2A | H | L | H | L | L | First and second light emitters | Fourth light emitter |
| 3A | L | H | L | H | L | First light emitter | Third light emitter |
| 4A | H | H | H | L | H | Second light emitter | Fourth light emitter |

| Pattern no. | Switch signal | | Setting control signal | | Light emitter(s) set to emissive state | |
|---|---|---|---|---|---|---|
| | Si1 | Si0 | Se2 | Se1 | First subpixel circuit | Second subpixel circuit |
| 1B | L | L | L | L | First and second light emitters | Third light emitter |
| 2B | H | L | H | L | First light emitter | Third light emitter |
| 3B | L | H | L | H | Second light emitter | Fourth light emitter |

FIG. 14

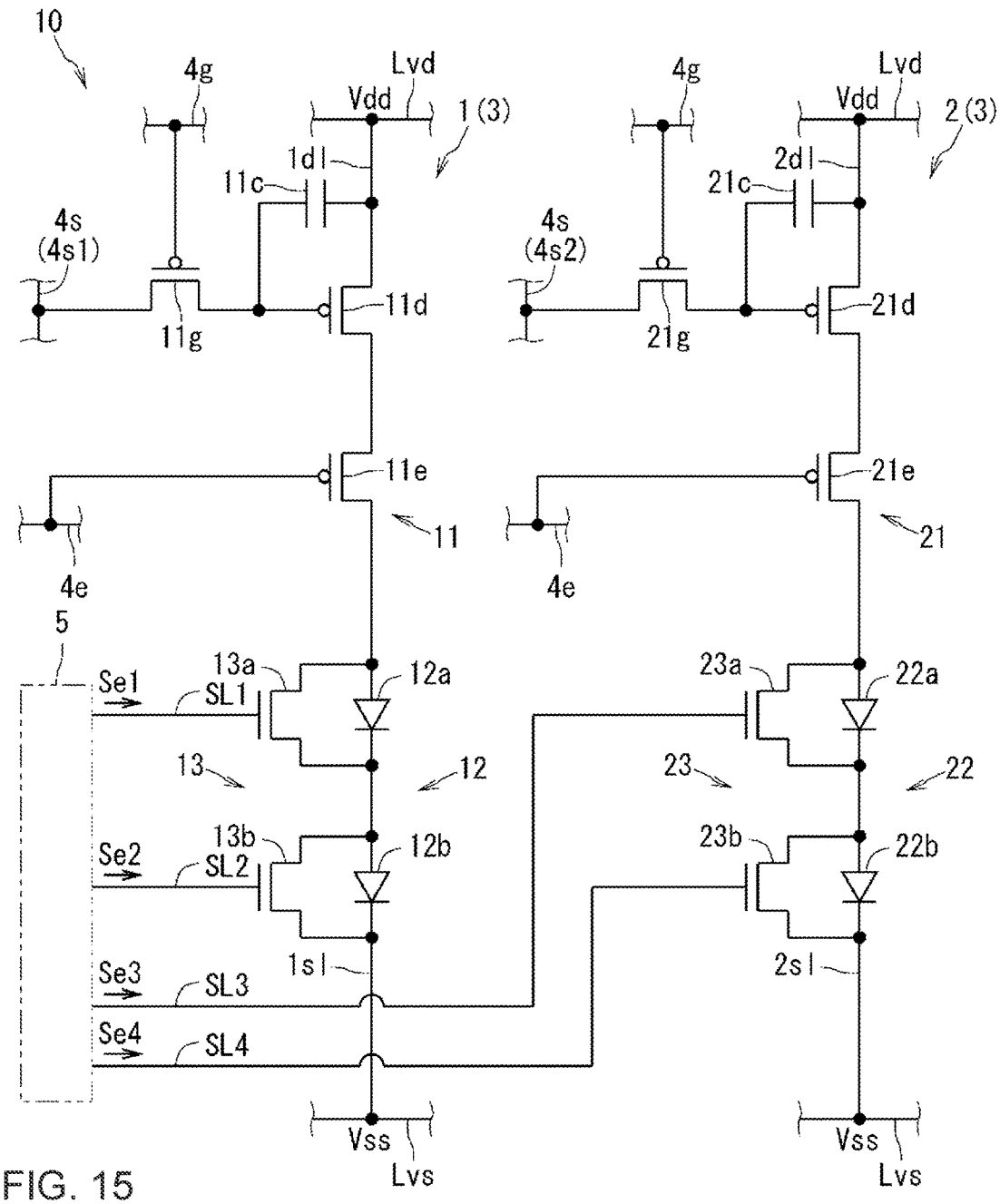

FIG. 15

| Pattern no. | Switch signal | | Setting control signal | | | | Light emitter(s) set to emissive state | |
|---|---|---|---|---|---|---|---|---|
| | Si1 | Si0 | Se4 | Se3 | Se2 | Se1 | First subpixel circuit | Second subpixel circuit |
| 1C | L | L | L | L | H | L | First light emitter | Third and fourth light emitters |
| 2C | H | L | L | L | L | H | Second light emitter | Third and fourth light emitters |
| 3C | L | H | H | L | H | L | First light emitter | Third light emitter |
| 4C | H | H | L | H | L | H | Second light emitter | Fourth light emitter |

FIG. 16

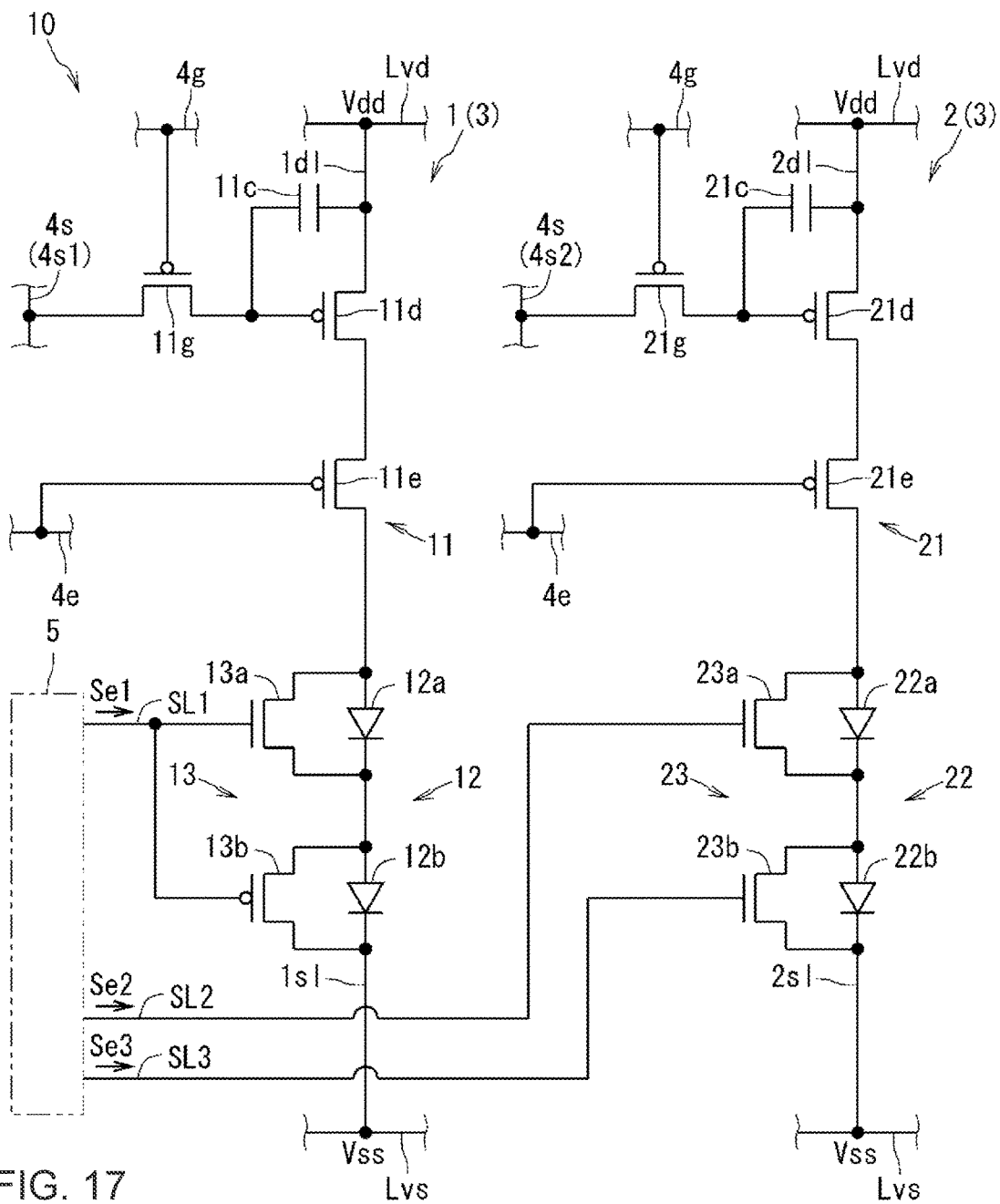

FIG. 17

| Pattern no. | Switch signal | | Setting control signal | | | Light emitter(s) set to emissive state | |
|---|---|---|---|---|---|---|---|
| | Si1 | Si0 | Se3 | Se2 | Se1 | First subpixel circuit | Second subpixel circuit |
| 1D | L | L | L | L | L | First light emitter | Third and fourth light emitters |
| 2D | H | L | L | L | H | Second light emitter | Third and fourth light emitters |
| 3D | L | H | H | L | L | First light emitter | Third light emitter |
| 4D | H | H | L | H | H | Second light emitter | Fourth light emitter |

| Pattern no. | Switch signal | | Setting control signal | | Light emitter(s) set to emissive state | |
|---|---|---|---|---|---|---|
| | Si1 | Si0 | Se2 | Se1 | First subpixel circuit | Second subpixel circuit |
| 1E | L | L | L | L | First light emitter | Third and fourth light emitters |
| 2E | L | H | H | L | First light emitter | Third light emitter |
| 3E | H | L | L | H | Second light emitter | Fourth light emitter |

| Pattern no. | Switch signal | | Setting control signal | | | | Light emitter(s) set to emissive state | |
|---|---|---|---|---|---|---|---|---|
| | Si1 | Si0 | Se4 | Se3 | Se2 | Se1 | First subpixel circuit | Second subpixel circuit |
| 1F | L | L | L | L | L | L | First and second light emitters | Third and fourth light emitters |
| 2F | H | L | H | L | H | L | First light emitter | Third light emitter |
| 3F | L | H | L | H | L | H | Second light emitter | Fourth light emitter |

| Pattern no. | Switch signal | | Setting control signal | | | Light emitter(s) set to emissive state | |
|---|---|---|---|---|---|---|---|
| | Si1 | Si0 | Se3 | Se2 | Se1 | First subpixel circuit | Second subpixel circuit |
| 1G | L | L | L | L | L | First and second light emitters | Third and fourth light emitters |
| 2G | H | L | L | H | L | First light emitter | Third light emitter |
| 3G | L | H | H | L | H | Second light emitter | Fourth light emitter |

| Pattern no. | Switch signal | | Setting control signal | | Light emitter(s) set to emissive state | |
|---|---|---|---|---|---|---|
| | Si1 | Si0 | Se2 | Se1 | First subpixel circuit | Second subpixel circuit |
| 1H | L | L | L | L | First and second light emitters | Third and fourth light emitters |
| 2H | H | L | H | L | First light emitter | Third light emitter |
| 3H | L | H | L | H | Second light emitter | Fourth light emitter |

| Pattern no. | Switch signal | | Setting control signal | | Light emitter(s) set to emissive state |
|---|---|---|---|---|---|
| | Si1 | Si0 | Se2 | Se1 | |
| 1] | L | L | L | L | First and second light emitters |
| 2] | H | L | H | L | First light emitter |
| 3] | L | H | L | H | Second light emitter |

PIXEL CIRCUIT, DISPLAY PANEL, DISPLAY DEVICE, AND COMPOSITE DISPLAY DEVICE

CROSS-REFERENCE TO RELATED APPLICATION

This application claims priority to Japanese Patent Application No. 2021-88712 filed on May 26, 2021, the entire disclosure of which is hereby incorporated by reference herein.

FIELD

The present disclosure relates to a pixel circuit, a display panel, a display device, and a composite display device.

BACKGROUND

An example display device includes multiple scanning signal lines and multiple image signal lines in a grid and includes an image display unit including a matrix of multiple pixel units at the intersections between the scanning signal lines and the image signal lines (refer to, for example, WO 2020/174879).

This display device includes, for example, the pixel units each including a subpixel including a first light emitter that emits light of a first color, a subpixel including a second light emitter that emits light of a second color, and a subpixel including a third light emitter that emits light of a third color to display color images.

PATENT LITERATURE

Patent Literature 1: WO 2020/174879

SUMMARY

One or more aspects of the present disclosure are directed to a pixel circuit, a display panel, a display device, and a composite display device.

In an aspect, a pixel circuit includes a first subpixel circuit and a second subpixel circuit. The first subpixel circuit includes a first light emitter, a second light emitter, and a first setter. The first setter is configured to set each of the first light emitter and the second light emitter selectively to one of an emissive state or a non-emissive state. The second subpixel circuit includes a third light emitter, a fourth light emitter, and a second setter. The second setter sets each of the third light emitter and the fourth light emitter selectively to one of the emissive state or the non-emissive state. The first subpixel circuit and the second subpixel circuit are in at least one of a connection different state or an emitter number different state, where the connection different state is a state in which a connection between the first light emitter and the second light emitter is one of a series connection or a parallel connection and a connection between the third light emitter and the fourth light emitter is the other of the series connection or the parallel connection, and the emitter number different state is a state in which an emission status of the first light emitter and the second light emitter set by the first setter is in one of a first emission setting or a second emission setting and an emission status of the third light emitter and the fourth light emitter set by the second setter is in the other of the first emission setting or the second emission setting, where the first emission setting is a setting to cause the first light emitter and the second light emitter or the third light emitter and the fourth light emitter to be in the emissive state, and the second emission setting is a setting to selectively cause one of the first light emitter or the second light emitter or one of the third light emitter or the fourth light emitter to be in the emissive state.

In an aspect, a display panel includes a plurality of the pixel circuits in the above aspect, and a setting controller that outputs a setting control signal to the first setter and the second setter in each of the plurality of pixel circuits. The first setter is configured to set each of the first light emitter and the second light emitter selectively to one of the emissive state or the non-emissive state in response to the setting control signal. The second setter sets each of the third light emitter and the fourth light emitter selectively to one of the emissive state or the non-emissive state in response to the setting control signal.

In an aspect, a display panel includes a plurality of the pixel circuits according to the above aspect. Each of the plurality of pixel circuits includes a setting controller that outputs a setting control signal to the first setter and the second setter.

In an aspect, a display device includes the display panel according to any one of the above aspects and a drive electrically connected to a plurality of the pixel circuits according to the above aspect.

In an aspect, a display device includes a plurality of the pixel circuits according to the above aspect and a drive electrically connected to the plurality of pixel circuits. The drive outputs a setting control signal to the first setter and the second setter in each of the plurality of pixel circuits. In each of the plurality of pixel circuits, the first setter is configured to set each of the first light emitter and the second light emitter selectively to one of the emissive state or the non-emissive state in response to the setting control signal. In each of the plurality of pixel circuits, the second setter is configured to set each of the third light emitter and the fourth light emitter selectively to one of the emissive state or the non-emissive state in response to the setting control signal.

In an aspect, a composite display device includes a plurality of the display devices according to any one of the above aspects. Each of the plurality of display devices includes a substrate including a display surface, a non-display surface opposite to the display surface, and a side surface connecting the display surface and the non-display surface. The plurality of pixel circuits is located on the display surface of the substrate. The drive is located on the non-display surface of the substrate. The plurality of display devices includes a composite display surface with side surfaces of substrates of the plurality of display devices being adjacent to or in contact with one another.

BRIEF DESCRIPTION OF DRAWINGS

FIG. 7 is a circuit diagram of a signal output circuit in a second example.

FIG. 8 is a truth table showing an example relationship between a switch signal, a setting control signal, and light emitter(s) set to an emissive state.

FIG. 9 is a block circuit diagram of the setting controller connected to multiple pixel circuits in an example manner.

FIG. 10 is a circuit diagram of a pixel circuit in a first example of a second embodiment.

FIG. 11 is a truth table showing an example relationship between a switch signal, a setting control signal, and light emitter(s) set to the emissive state.

FIG. 14 is a circuit diagram of an example pixel circuit according to a third embodiment.

FIG. 15 is a truth table showing an example relationship between a switch signal, a setting control signal, and light emitter(s) set to the emissive state.

FIG. 16 is a circuit diagram of a pixel circuit in a first example of a fourth embodiment.

FIG. 17 is a truth table showing an example relationship between a switch signal, a setting control signal, and light emitter(s) set to the emissive state.

DETAILED DESCRIPTION

An example display device includes multiple scanning signal lines and multiple image signal lines in a grid and includes an image display unit including a matrix of multiple pixel units at the intersections between the scanning signal lines and the image signal lines.

This display device includes, for example, the pixel units each including a subpixel including a first light emitter that emits light of a first color, a subpixel including a second light emitter that emits light of a second color, and a subpixel including a third light emitter that emits light of a third color. The display device can thus display, for example, color images. The first color, the second color, and the third color are, for example, red, green, and blue.

Figure 37:
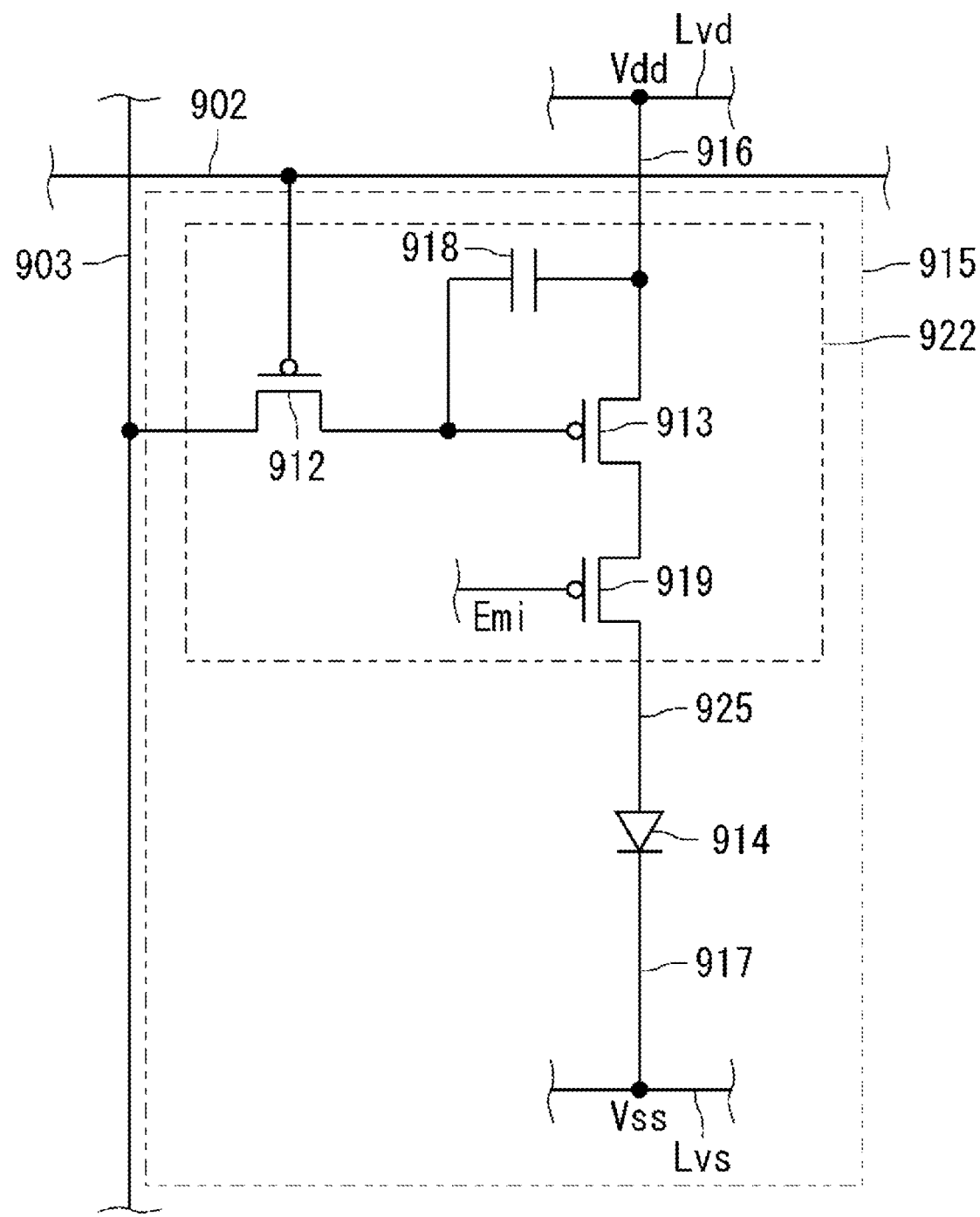
FIG. 37 is a schematic circuit diagram of s subpixel in a reference example.

FIG. 37 is a schematic circuit diagram of a subpixel 915 in a reference example. The subpixel 915 includes, for example, a light emitter 914 and an emission controller 922 that controls the emission or non-emission and the intensity of light emitted from the light emitter 914.

The light emitter 914 is, for example, a micro-light-emitting diode (LED) or an organic electroluminescence (EL) element. The light emitter 914 is located on, for example, an insulating layer on a first surface of a substrate such as a glass plate. The light emitter 914 is electrically connected to the emission controller 922 and a cathode potential input line 917 with feedthrough conductors in, for example, through-holes extending through the insulating layer in the pixel unit. The light emitter 914 includes the positive electrode connected to, for example, an anode potential input line 916 through the emission controller 922 and the negative electrode to, for example, the cathode potential input line 917.

The emission controller 922 includes, for example, a first transistor 912, a second transistor 913, a capacitor 918, and a third transistor 919.

The first transistor 912 functions as, for example, a switch for inputting an image signal into the subpixel 915. The first transistor 912 may be, for example, a p-channel thin-film transistor (also referred to as a p-channel transistor). The first transistor 912 includes the gate electrode connected to, for example, a scanning signal line 902, the source electrode to, for example, an image signal line 903, and the drain electrode to, for example, the gate electrode of the second transistor 913. In response to, for example, an on-signal (e.g., low-level or L signal) as a scanning signal input from the scanning signal line 902 into the gate electrode, the first transistor 912 enters a conductive state (also referred to as an on-state or a closed state as a switch) to allow a current to flow through the source electrode and the drain electrode. This causes, for example, an image signal from the image signal line 903 to be provided to the gate electrode of the second transistor 913 through the first transistor 912.

The second transistor 913 (also referred to as a drive element) drives the light emitter 914 with a current based on, for example, the potential difference between an anode potential Vdd provided through the anode potential input line 916 and a cathode potential Vss provided through the cathode potential input line 917 and on the level (potential) of the image signal transmitted from the image signal line 903. The anode potential input line 916 is connected to, for example, a first power line Lvd as a power line on the anode potential end. The anode potential Vdd provided from the first power line Lvd to the anode potential input line 916 is, for example, about 3 to 5 volts (V). The cathode potential input line 917 is connected to, for example, a second power line Lvs as a power line on the cathode potential end. The cathode potential Vss provided from the second power line Lvs to the cathode potential input line 917 is, for example, about −3 to 0 V. The second power line Lvs may be, for example, a ground line that is grounded. The second transistor 913 is, for example, a p-channel transistor. In this case, the second transistor 913 includes the source electrode connected to, for example, the anode potential input line 916 and the drain electrode connected to, for example, the cathode potential input line 917 through the third transistor 919 and the light emitter 914. In response to, for example, a L signal as an image signal input from the image signal line 903 into the gate electrode, the second transistor 913 enters the conductive state.

The capacitor 918 is located on, for example, a connection line connecting the gate electrode and the source electrode of the second transistor 913. The capacitor 918 retains, for example, the potential of an image signal input into the gate electrode of the second transistor 913 for the period (also referred to as a period of one frame) until the second transistor 913 receives the next image signal (also referred to as being refreshed).

The third transistor 919 is located on, for example, a drive line 925 connecting the second transistor 913 and the light emitter 914 to control the emission or non-emission of the light emitter 914. The third transistor 919 is, for example, a p-channel transistor. In this case, the third transistor 919 includes, for example, the source electrode connected to the drain electrode of the second transistor 913 and the drain electrode connected to the positive electrode of the light emitter 914. In response to, for example, a L signal as an emission control signal (also referred to as an Emi signal) input into the gate electrode, the third transistor 919 enters the conductive state. This allows, for example, a current (also referred to as a drive current) to flow from the anode potential input line 916 to the light emitter 914 through the second transistor 913, the third transistor 919, and the drive line 925, thus causing the light emitter 914 to emit light. The intensity (luminance) of light emitted from the light emitter 914 may be controlled by, for example, controlling the level (potential) of the image signal.

When, for example, one or more subpixels 915 have a connection failure between the light emitter 914 and the feedthrough conductors, the light emitter 914 may not emit light at an intended intensity, with a drive current flowing insufficiently. In another case, one or more subpixels 915 may include, for example, a defective light emitter 914 or a deteriorating or broken component. This may also cause the light emitter 914 to emit light at an unintended intensity and have an emission failure.

Figure 38:
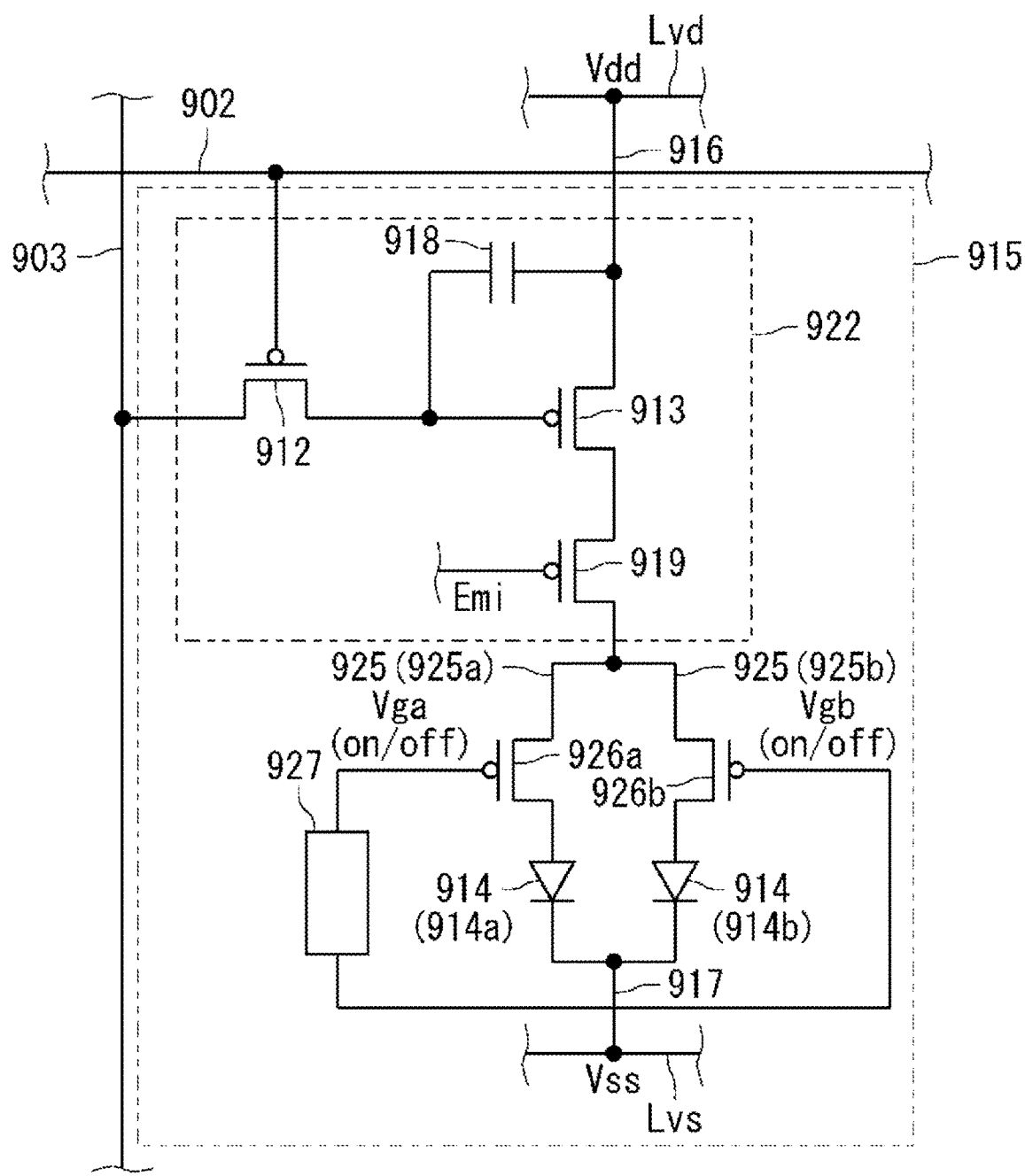
FIG. 38 is a schematic circuit diagram of a subpixel in another reference example.

As illustrated in, for example, FIG. 38, the subpixel 915 may include two light emitters 914 connected in parallel and allow one of the two light emitters 914 that has no failure to emit light continuously.

FIG. 38 is a schematic circuit diagram of a subpixel 915 in another reference example. The subpixel 915 illustrated in FIG. 38 has a circuit structure that is altered from the circuit structure of the subpixel 915 illustrated in FIG. 37, with one or more components replaced and a component added. The components replaced in the circuit structure of the subpixel 915 illustrated in FIG. 37 are the drive line 925 and the light emitter 914. The components in the circuit structure of the subpixel 915 illustrated in FIG. 38 resulting from the replacement are a first drive line 925a and a second drive line 925b as two drive lines 925, a first light emitter 914a and a second light emitter 914b as two light emitters 914, a first switch 926a, and a second switch 926b. The component added to the circuit structure of the subpixel 915 illustrated in FIG. 38 is a switch controller 927.

As illustrated in the example in FIG. 38, the first drive line 925a and the second drive line 925b are connected to the emission controller 922 and connected in parallel to each other. In this example, one of the first drive line 925a or the second drive line 925b is a normal drive line, and the other is an auxiliary drive line (also referred to as a redundant drive line). For example, the first drive line 925a is connected to the positive electrode of the first light emitter 914a, and the negative electrode of the first light emitter 914a is connected to the cathode potential input line 917. For example, the second drive line 925b is connected to the positive electrode of the second light emitter 914b, and the negative electrode of the second light emitter 914b is connected to the cathode potential input line 917. The first switch 926a may be located on, for example, the first drive line 925a to set the first drive line 925a to an in-use state (also referred to as a driving state) or a non-use state (also referred to as a non-driving state). The second switch 926b may be located on, for example, the second drive line 925b to set the second drive line 925b to the in-use state (driving state) or the non-use state (non-driving state). The switch controller 927 sets, for example, one of the first switch 926a or the second switch 926b to a nonconductive state (also referred to as or an off-state or an open state as a switch) to allow no current flow, and sets the other to the conductive state. This allows, for example, one of the first light emitter 914a or the second light emitter 914b, each as one of the two light emitters 914, that has no failure to emit light continuously. The first switch 926a and the second switch 926b may be, for example, p-channel transistors. For the first light emitter 914a to continuously emit light, for example, the switch controller 927 inputs an on-signal (Vga, a L signal) into the gate electrode of the first switch 926a and an off-signal (Vgb, a high-level or H signal) into the gate electrode of the second switch 926b. For the second light emitter 914b to continuously emit light, for example, the switch controller 927 inputs an off-signal (Vga, a H signal) into the gate electrode of the first switch 926a and an on-signal (Vgb, a L-signal) into the gate electrode of the second switch 926b.

However, different subpixels 915 included in one pixel unit may have, for example, different characteristics of components such as the light emitters 914 and the second transistor 913 and different use conditions of components such as the light emitters 914 for light emission. The characteristics of the light emitters 914 may include, for example, internal resistance and light emission efficiency. The characteristics of the second transistor 913 may include, for example, a voltage for operating in the saturation region (also referred to as a saturation operation voltage). The use conditions of the light emitters 914 for light emission may include, for example, setting values for the upper and lower limits of the drive current, the forward voltage, and the luminance of the light emitters 914.

Different light emitters 914 that emit light of the same color may have different internal resistances. Typically, light emitters 914 that emit red light (with a wavelength of about 640 to 770 nm) tend to emit light with relatively low efficiency, whereas light emitters 914 that emit green light (with a wavelength of about 490 to 550 nm) and light emitters 914 that emit blue light (with a wavelength of about 430 to 490 nm) tend to emit light with relatively high efficiency. More specifically, when being fed with the same drive current, light emitters 914 that emit red light tend to have lower luminance, whereas light emitters 914 that emit green light and light emitters 914 that emit blue light tend to have higher luminance.

When, for example, two light emitters 914 connected in parallel both emit light, the drive current is about half the drive current used when one of the two light emitters 914 connected in parallel emits light. When, for example, two light emitters 914 connected in series both emit light, the drive current is about half the drive current used when one of the two light emitters 914 emits light.

Typically, light emitters 914 that emit red light tend to have a relatively high forward voltage, whereas light emitters 914 that emit green light and light emitters 914 that emit blue light tend to have a relatively low forward voltage. The forward voltage is relatively higher for, for example, two light emitters 914 connected in parallel with one of them emitting light (referred to as single-emitting parallel connection) than for two light emitters 914 with both of them emitting light (referred to as double-emitting parallel connection). More specifically, the drive current flowing through one light emitter 914 in the double-emitting parallel connection is about half the drive current flowing through the single-emitting parallel connection, thus using a relatively low forward voltage. The single-emitting parallel connection thus consumes more power with the light emitters 914 and allows less power to be consumed by the drive thin-film transistor. The single-emitting parallel connection thus improves power efficiency of the driving thin-film transistor more than the double-emitting parallel connection.

For one of subpixels 915 in a pixel unit, for example, a forward voltage Vf applied to the light emitters 914 during emission can be a large portion of the potential difference between the anode potential Vdd and the cathode potential Vss due to at least the characteristics of the light emitters 914 or the use conditions for light emission. In the subpixel 915, for example, a large forward voltage Vf can be applied to the light emitters 914 both when the light emitters 914 have a high value of at least the internal resistance, the upper setting limit of the drive current, the upper setting limit of the forward voltage, or the upper setting limit of the luminance, and when the light emitters 914 have low emission efficiency. In this case, the voltage Vf can be a large portion of the potential difference (Vdd-Vss). This thus reduces a voltage Vds between the drain electrode and the source electrode of the second transistor 913 (also referred to as a drain-source voltage). The potential difference between the anode potential Vdd and the cathode potential Vss can decrease in response to, for example, a decrease in the anode potential Vdd corresponding to the distance between the power supply and the point on the first power line Lvd at which the anode potential input line 916 is connected, or in response to an increase in the cathode potential Vss corresponding to the distance between the power supply and the point on the second power line Lvs at which the cathode potential input line 917 is connected. The decreased potential difference between the anode potential Vdd and the cathode potential Vss can cause, for example, the operating conditions to be stricter for the second transistor 913 in the saturation region. In other words, the second transistor 913 is not easily operable in the saturation region. This can easily cause, for example, gradations (also referred to as uneven luminance), or a gradual decrease in the luminance of the display device viewed in plan. This can lower the image quality of the display device. When, for example, the second transistor 913 operates with a higher saturation operating voltage in one of the subpixels 915, the decreased potential difference between the anode potential Vdd and the cathode potential Vss causes the operating conditions to be stricter for the second transistor 913 in the saturation region. This can increase, for example, the likelihood of uneven luminance and lower image quality in the display device.

One of the subpixels 915 in a pixel unit may have, for example, a large current flowing through the light emitters 914 during emission due to at least the characteristics of the light emitters 914 or the use conditions for light emission. For example, the subpixel 915 may have a large current flowing through the light emitters 914 both when the light emitters 914 have a high value of at least the upper setting limit of the drive current, the upper setting limit of the forward voltage, or the upper setting limit of the luminance, and when the light emitters 914 have low emission efficiency. In this case, the light emitters 914 can easily deteriorate over time due to, for example, heat generated by a large current flowing through the light emitters 914, and can lower the image quality of the display device. When, for example, the light emitters 914 in the subpixel 915 have a high internal resistance, the light emitters 914 can easily deteriorate over time due to, for example, heat generation and can lower the image quality of the display device.

One of the subpixels 915 in a pixel unit may have, for example, a lower forward voltage Vf applied to the light emitters 914 during emission due to at least the characteristics of the light emitters 914 or the use conditions for light emission, and cause a higher drain-source voltage Vds of the second transistor 913. For example, the forward voltage Vf applied to the light emitters 914 in the subpixel 915 may decrease and the drain-source voltage Vds of the second transistor 913 may increase both when the light emitters 914 have a low value of at least the internal resistance, the lower setting limit of the drive current, the lower setting limit of the forward voltage, or the lower setting limit of the luminance, and when the light emitters 914 have high emission efficiency. In this case, the second transistor 913 may consume high power and can decrease the energy efficiency in the subpixel 915. This may increase, for example, power consumption in the display device.

Thus, for example, a pixel unit circuit (pixel circuit), a display panel including the pixel circuit, a display device including the pixel circuit, and a composite display device including multiple display devices are to improve the performance of the display device when at least the characteristics of the components or the use conditions of the light emitters differ between the circuits of multiple subpixels (subpixel circuits).

The inventors of the present disclosure thus have developed a technique for improving the performance of the display panel when at least the characteristics of the components or the use conditions of the light emitters differ between multiple subpixel circuits in the pixel circuit, the display panel, the display device, and the composite display device.

Figure 1:
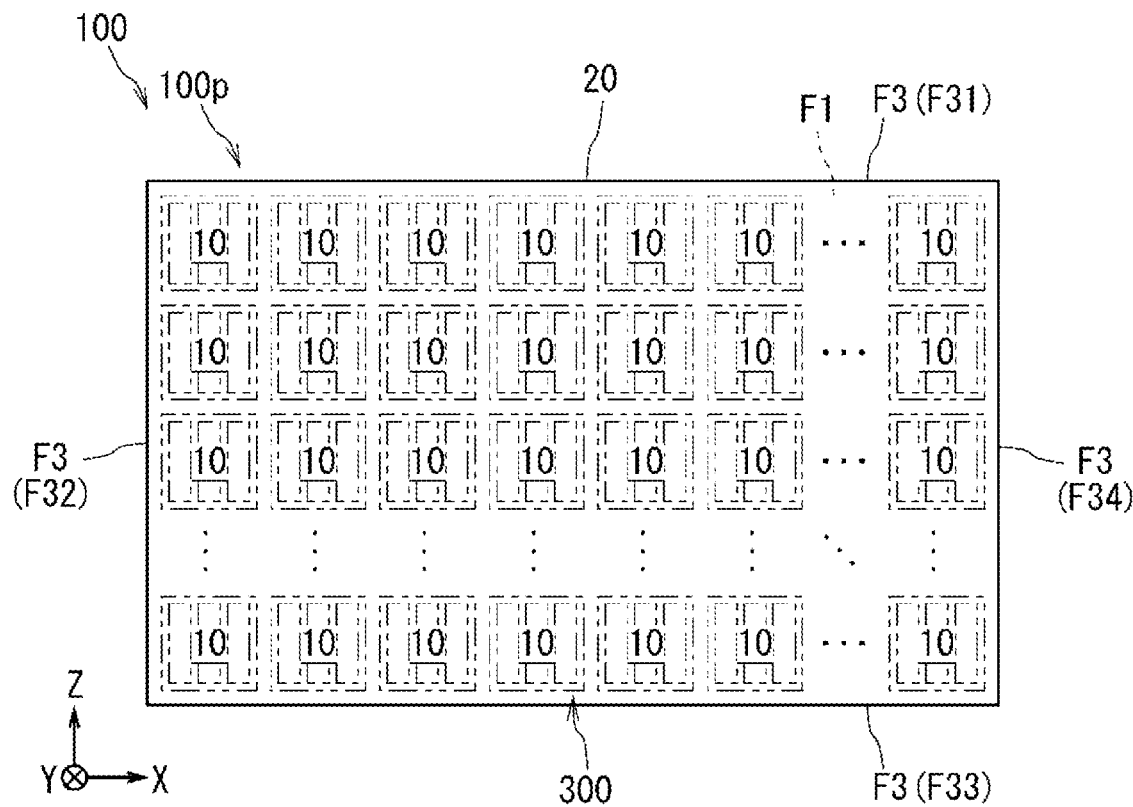
FIG. 1 is a schematic front view of an example display device according to one or more embodiments.
Figure 2:
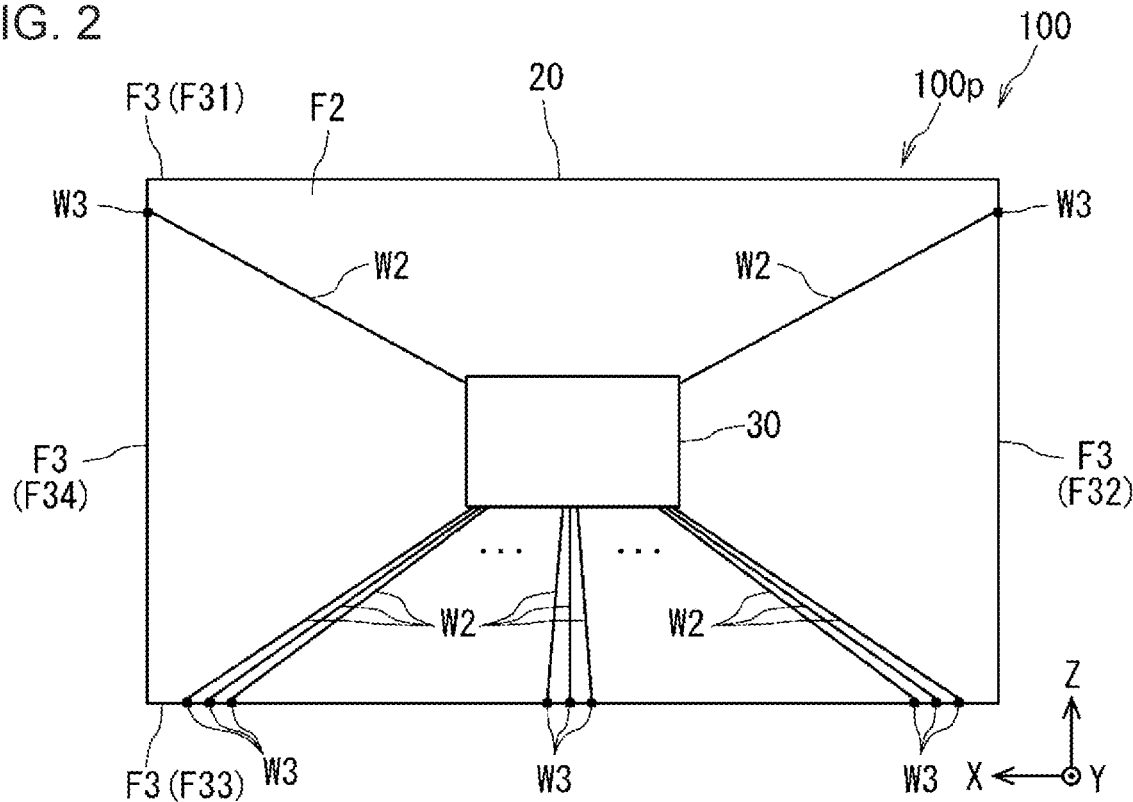
FIG. 2 is a schematic rear view of the display device according to one or more embodiments.
Figure 36:
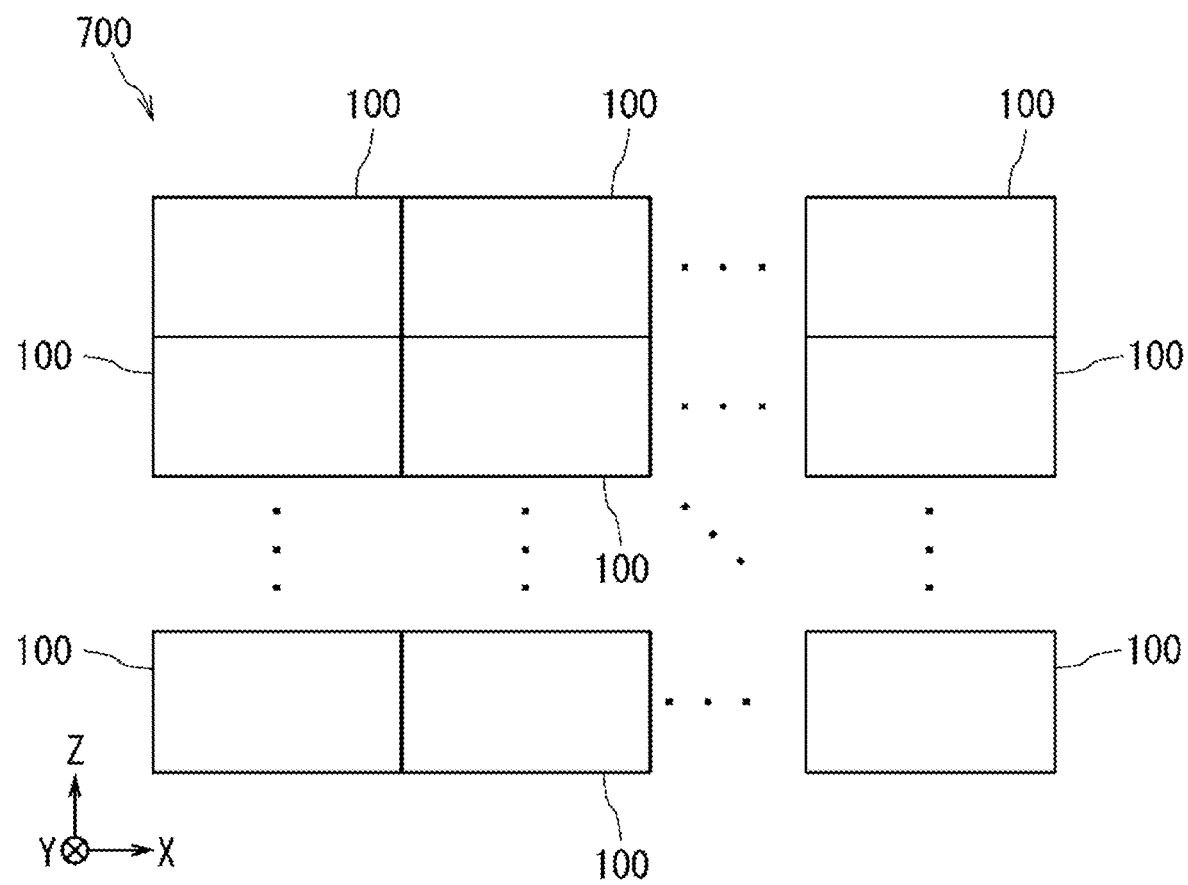
FIG. 36 is a schematic front view of an example tiled display.

One or more embodiments of the present disclosure will now be described with reference to the drawings. In the drawings, the same reference numerals denote the components with the same or similar structures and functions, and such components are not described repeatedly. The drawings are schematic. FIGS. 1, 2, and 36 illustrate the right-handed XYZ coordinate system. In this XYZ coordinate system, the positive X-direction refers to a direction parallel to a first surface F1 of a substrate 20, the positive Z-direction refers to a direction orthogonal to the positive X-direction parallel to the first surface F1, and the positive Y-direction refers to a direction perpendicular to the first surface F1.

1. First Embodiment

1-1. Overview of Display Device Structure

Figure 3:
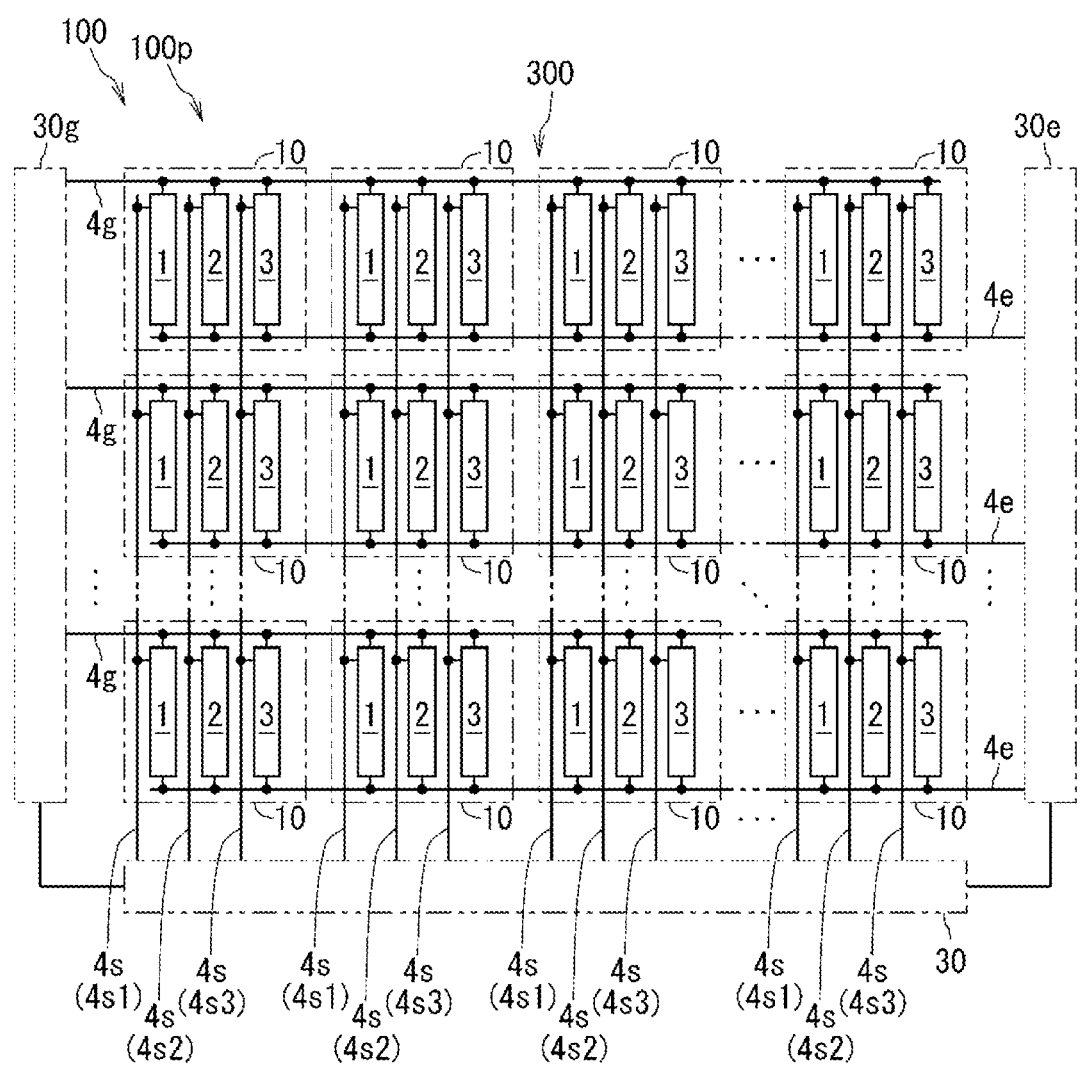
FIG. 3 is a schematic block circuit diagram of the display device with an example structure according to one or more embodiments.

FIG. 1 is a schematic front view of an example display device 100 according to a first embodiment. FIG. 2 is a schematic rear view of the display device 100 according to the first embodiment. FIG. 3 is a block circuit diagram of the display device 100 with an example structure according to the first embodiment. As illustrated in FIGS. 1 to 3, the display device 100 includes, for example, a display panel 100p and a drive 30. The display panel 100p includes, for example, multiple pixel circuits 10. The display panel 100p is, for example, a flat plate. In the first embodiment, the display panel 100p includes, for example, the substrate 20 and the multiple pixel circuits 10.

The substrate 20 includes, for example, the first surface (also referred to as a first main surface) F1, a second surface (also referred to as a second main surface) F2, and multiple side surfaces F3. The second surface F2 is opposite to the first surface F1. The side surfaces F3 connect the first surface F1 and the second surface F2. The substrate 20 is, for example, a flat plate. Each of the first surface F1 and the second surface F2 is, for example, a rectangular surface with four sides. In this case, the side surfaces F3 include a first side surface F31, a second side surface F32, a third side surface F33, and a fourth side surface F34. The first side surface F31 connects a first side of the first surface F1 and a first side of the second surface F2. In other words, the first side surface F31 includes the first side of the first surface F1 and the first side of the second surface F2 facing each other. The second side surface F32 connects a second side of the first surface F1 and a second side of the second surface F2. In other words, the second side surface F32 includes the second side of the first surface F1 and the second side of the second surface F2 facing each other. The third side surface F33 connects a third side of the first surface F1 and a third side of the second surface F2. In other words, the third side surface F33 includes the third side of the first surface F1 and the third side of the second surface F2 facing each other. The fourth side surface F34 connects a fourth side of the first surface F1 and a fourth side of the second surface F2. In other words, the fourth side surface F34 includes the fourth side of the first surface F1 and the fourth side of the second surface F2 facing each other. In the example in FIGS. 1 and 2, the first surface F1 is flat along an XZ plane and faces in the negative Y-direction. The second surface F2 is flat along an XZ plane and faces in the positive Y-direction. The first side surface F31 faces in the positive Z-direction. The second side surface F32 faces in the negative X-direction. The third side surface F33 faces in the negative Z-direction. The fourth side surface F34 faces in the positive X-direction.

The substrate 20 may be, for example, a glass plate. The glass plate may or may not be transparent. The substrate 20 may be, for example, a colored glass substrate, a frosted glass substrate, a plastic substrate, a ceramic substrate, a metal substrate, or a composite substrate including two or more of these substrates laminated together.

The pixel circuits 10 each serve as a pixel unit. The pixel circuits 10 are in, for example, a matrix. The pixel circuits 10 are in, for example, a matrix on the first surface F1 of the substrate 20. For example, multiple pixel circuits 10 are included in one column, and multiple pixel circuits 10 are, for example, included in one row. More specifically, the pixel circuits 10 are in n rows×m columns (n and m are natural numbers). The pixel circuits 10 are included in, for example, a portion (also referred to as an image display) 300 that displays images. The image display 300 is located on, for example, the first surface F1 of the substrate 20. The image display 300 covers, for example, substantially the entire first surface F1. In this case, the display device 100 includes, for example, the image display 300 located on the entire first surface F1 of the substrate 20 (also referred to as a frameless structure) or includes the image display 300 with a minimum frame portion on its periphery (also referred to as a narrow frame structure).

Each pixel circuit 10 includes, for example, multiple subpixel circuits. The multiple subpixel circuits each serve as a subpixel unit included in a pixel unit. The multiple subpixel circuits include, for example, a first subpixel circuit 1, a second subpixel circuit 2, and a third subpixel circuit 3. The first subpixel circuit 1 emits, for example, light of a first color. The second subpixel circuit 2 emits, for example, light of a second color different from the first color. The third subpixel circuit 3 emits, for example, light of a third color different from the first color or the second color. The first color, the second color, and the third color are, for example, red, green, and blue. For example, when the first color is red, the second color may be green and the third color may be blue, or the second color may be blue and the third color may be green. For example, when the first color is green, the second color may be red and the third color may be blue, or the second color may be blue and the third color may be red. For example, when the first color is blue, the second color may be red and the third color may be green, or the second color may be green and the third color may be red. Each pixel circuit 10 includes, for example, the first subpixel circuit 1, the second subpixel circuit 2, and the third subpixel circuit 3 arranged in the row direction in this order. In this case, one row includes, for example, multiple first subpixel circuits 1, multiple second subpixel circuits 2, and multiple third subpixel circuits 3. One column includes, for example, multiple first subpixel circuits 1, multiple second subpixel circuits 2, and multiple third subpixel circuits 3. Each pixel circuit 10 may include, for example, the first subpixel circuit 1, the second subpixel circuit 2, and the third subpixel circuit 3 arranged in any order.

The drive 30 is electrically connected to, for example, the multiple pixel circuits 10. The drive 30 is located on, for example, the second surface F2 of the substrate 20. The drive 30 may be, for example, drive elements such as integrated circuits (ICs) or large-scale integration (LSI) circuits mounted on the second surface F2 of the substrate 20 by chip on glass (COG). The drive 30 may be, for example, a circuit board on which drive elements are mounted. The drive 30 may also be a thin-film circuit including, for example, a thin-film transistor (TFT) including a low-temperature polysilicon (LTPS) semiconductor layer directly formed on the second surface F2 of the substrate 20 by a thin film formation method such as chemical vapor deposition (CVD). The drive 30 is electrically connected to, for example, the image display 300 on the first surface F1 of the substrate 20 with multiple wires including wires (also referred to as back wires) W2 located on the second surface F2 of the substrate 20 and wires (also referred to as side wires) W3 located on the side surfaces F3 of the substrate 20. The multiple wires are thus included in, for example, the display panel 100*p*.

As illustrated in FIG. 3, the display panel 100*p* includes, for example, multiple image signal lines 4*s*, multiple scanning signal lines (also referred to as gate signal lines) 4*g*, and multiple emission control signal lines 4*e*. The scanning signal lines 4*g* and the image signal lines 4*s* are, for example, in a grid. The display panel 100*p* also includes, for example, a scanning signal line drive 30*g* and an emission control signal line drive 30*e*.

Each image signal line 4*s* can transmit, for example, a signal (also referred to as an image signal) for controlling the degree of light emission to the corresponding first subpixel circuit 1, second subpixel circuit 2, and third subpixel circuit 3. Image signal lines 4*s* extend along, for example, one column of pixel circuits 10. In the example in FIG. 3, three image signal lines 4*s* extend along one column of pixel circuits 10. The three image signal lines 4*s* include, for example, a first image signal line 4*s*1, a second image signal line 4*s*2, and a third image signal line 4*s*3. More specifically, for example, one column of pixel circuits 10 includes the first image signal line 4*s*1 along one column of first subpixel circuits 1, the second image signal line 4*s*2 along one column of second subpixel circuits 2, and the third image signal line 4*s*3 along one column of third subpixel circuits 3. In this example, for the pixel circuits 10 in each column, the first image signal line 4*s*1 is electrically connected to each first subpixel circuit 1 in the column. The second image signal line 4*s*2 is electrically connected to each second subpixel circuit 2 in the column. The third image signal line 4*s*3 is electrically connected to each third subpixel circuit 3 in the column. Each image signal line 4*s* may receive, for example, an image signal provided from the drive 30. The drive 30 may provide image signals to the image signal lines 4*s* through, for example, selector circuits. For example, one selector circuit may be located for each column of pixel circuits 10. The selector circuit may provide image signals from the drive 30 to the first image signal line 4*s*1, the second image signal line 4*s*2, and the third image signal line 4*s*3 in time sequence (in line sequence). The selector circuit includes, for example, three transfer gates. The selector circuit may be located in, for example, an open area or the peripheral frame portion in the image display 300 on the first surface F1 of the substrate 20.

Each scanning signal line 4*g* can transmit, for example, a signal (also referred to as a scanning signal) for controlling the timing to input an image signal into the corresponding first subpixel circuit 1, second subpixel circuit 2, and third subpixel circuit 3. One scanning signal line 4*g* extends, for example, along one row of pixel circuits 10. For example, an m-th scanning signal line 4*g* (m is a natural number) extends along an m-th row of pixel circuits 10. The m-th scanning signal line 4*g* is electrically connected to, for example, the first subpixel circuits 1, the second subpixel circuits 2, and the third subpixel circuits 3 in each pixel circuit 10 in the m-th row. The multiple scanning signal lines 4*g* may receive scanning signals in time sequence (in line sequence) provided from, for example, the scanning signal line drive 30*g*. The scanning signal line drive 30*g* includes, for example, a circuit such as a shift register. The scanning signal line drive 30*g* is located on, for example, the first surface F1 of the substrate 20. In this case, the scanning signal line drive 30*g* may be located in, for example, an open area or the peripheral frame portion in the image display 300. The scanning signal line drive 30*g* can provide scanning signals in time sequence (in line sequence) to the multiple scanning signal lines 4*g* in response to, for example, signals from the drive 30.

The emission control signal lines 4*e* can transmit, for example, a signal (also referred to as an emission control signal) for controlling the timing to emit light to each of the first subpixel circuit 1, the second subpixel circuit 2, and the third subpixel circuit 3. One emission control signal line 4*e* extends, for example, along a row of pixel circuits 10. For example, an m-th emission control signal line 4*e* (m is a natural number) extends along an m-th row of pixel circuits 10. The m-th emission control signal line 4*e* is electrically connected to, for example, the first subpixel circuits 1, the second subpixel circuits 2, and the third subpixel circuits 3 included in the pixel circuit 10 in the m-th row. The multiple emission control signal lines 4*e* may receive emission control signals in time sequence (in line sequence) provided from, for example, the emission control signal line drive 30*e*. The emission control signal line drive 30*e* includes, for example, a circuit such as a shift register. The emission control signal line drive 30*e* is located on, for example, the first surface F1 of the substrate 20. In this case, the emission control signal line drive 30*e* may be located in, for example, an open area or in the peripheral frame portion in the image display 300. The emission control signal line drive 30*e* can provide, for example, emission control signals to the multiple emission control signal lines 4*e* in time sequence (in line sequence) in response to signals from the drive 30.

1-2. Structure of Pixel Circuit

Figure 4:
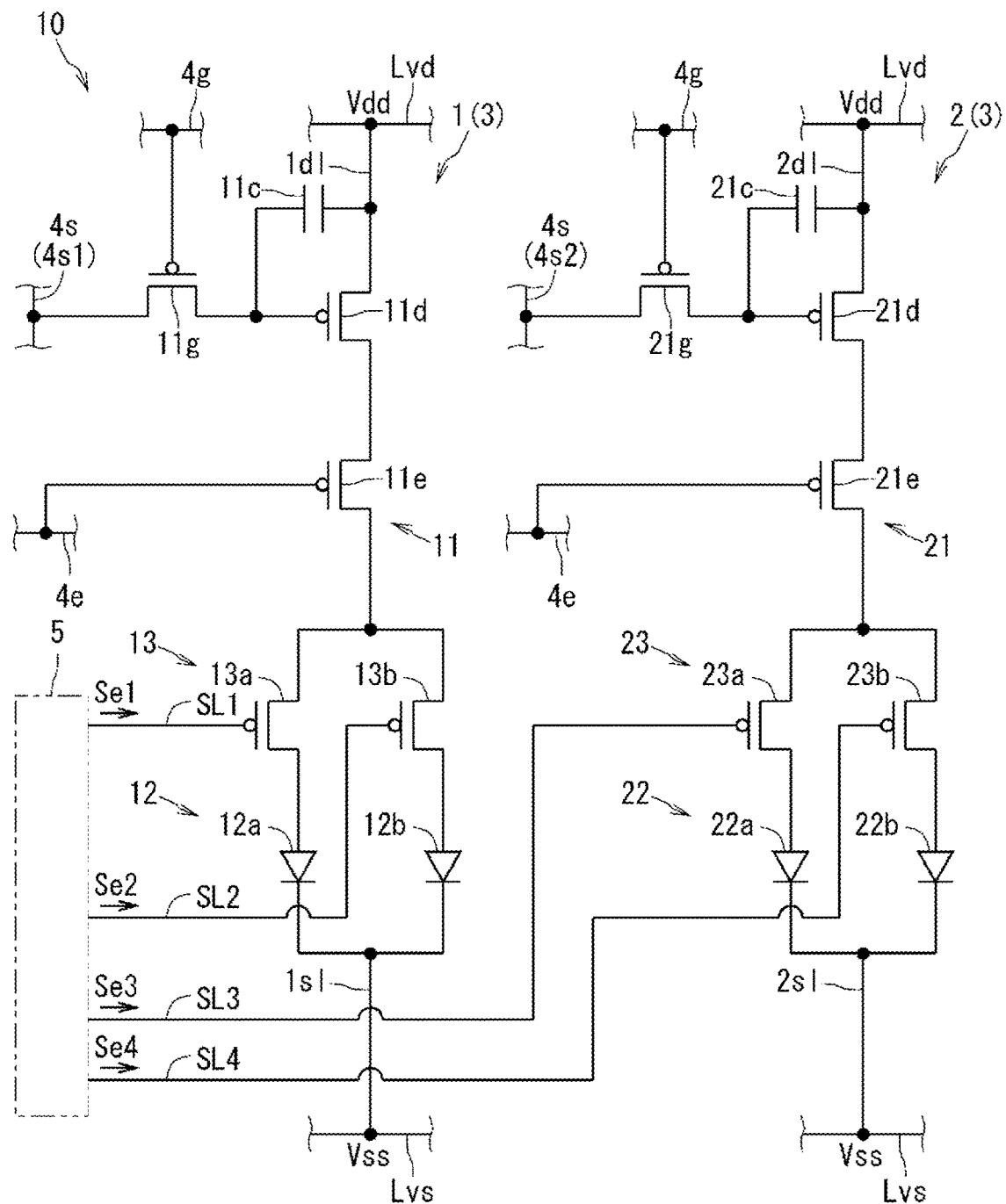
FIG. 4 is a circuit diagram of an example pixel circuit according to a first embodiment.

FIG. 4 is a circuit diagram of an example pixel circuit 10 in the first embodiment. As illustrated in FIG. 4, the pixel circuit 10 includes, for example, the first subpixel circuit 1 and the second subpixel circuit 2. In the first embodiment, the third subpixel circuit 3 has, for example, the same or similar structure as the first subpixel circuit 1 or the second subpixel circuit 2. The third subpixel circuit 3 is thus not illustrated for ease of explanation.

First Subpixel Circuit

The first subpixel circuit 1 includes, for example, a first light emitter unit 12 and a first setter 13. The first subpixel circuit 1 also includes, for example, a first emission controller 11.

The first light emitter unit 12 includes, for example, a first light emitter 12*a* and a second light emitter 12*b*. The first light emitter 12*a* and the second light emitter 12*b* can emit light of a first color (e.g., red light). The first light emitter 12*a* and the second light emitter 12*b* may be, for example, the same type of light emitters. The first light emitter 12*a* and the second light emitter 12*b* are, for example, micro-LEDs or organic EL elements. More specifically, the first light emitter 12*a* and the second light emitter 12*b* are, for example, micro-LEDs or organic EL elements that emit light of the first color. In the first embodiment, the first light emitter 12*a* and the second light emitter 12*b* are connected, for example, in parallel. The first light emitter 12*a* and the second light emitter 12*b* are located on, for example, an insulating layer on the first surface F1 of the substrate 20. The first light emitter 12*a* and the second light emitter 12*b* are electrically connected to, for example, other components included in the first subpixel circuit 1 with feedthrough conductors such as through-holes extending through the insulating layer. In the first embodiment, the first light emitter unit 12 is connected to a first power line Lvd serving as a power line for the anode potential through, for example, the first setter 13, the first emission controller 11, and a first anode potential input line 1d1. More specifically, the positive electrode as a first electrode of each of the first light emitter 12a and the second light emitter 12b is connected to, for example, the first power line Lvd through the first setter 13, the first emission controller 11, and the first anode potential input line 1d1. The first power line Lvd is connected to, for example, a power supply that provides an anode potential to the first power line Lvd. The first light emitter unit 12 is connected to, for example, a second power line Lvs serving as a power line for the cathode potential with a first cathode potential input line 1s1. More specifically, the negative electrode as a second electrode of each of the first light emitter 12a and the second light emitter 12b is connected to, for example, the second power line Lvs with the first cathode potential input line 1s1. The second power line Lvs is connected to, for example, a power supply that provides a cathode potential to the second power line Lvs.

The first emission controller 11 can control, for example, the light emission of the first light emitter unit 12. More specifically, the first emission controller 11 can control, for example, the emission or non-emission of the first light emitter 12a and the second light emitter 12b and the intensity of light emitted from the first light emitter 12a and the second light emitter 12b. The first emission controller 11 includes, for example, a first transistor 11g, a second transistor 11d, a first capacitor 11c, and a third transistor 11e.

The first transistor 11g functions as, for example, a switch for inputting an image signal into the first emission controller 11. The first transistor 11g is, for example, a p-channel thin-film transistor (p-channel transistor). In this case, for example, the first transistor 11g includes the gate electrode connected to the scanning signal line 4g, the source electrode connected to the first image signal line 4s1, and the drain electrode connected to the gate electrode of the second transistor 11d. In response to, for example, an on-signal (low-level or L signal in this example) as a scanning signal input from the scanning signal line 4g into the gate electrode, the first transistor 11g enters the conductive state to allow a current to flow through the source electrode and the drain electrode. This causes, for example, an image signal from the first image signal line 4s1 to be provided to the gate electrode of the second transistor 11d through the first transistor 11g.

The second transistor 11d (also referred to as a drive element) drives the first light emitter unit 12 with a current based on the potential difference between the anode potential Vdd provided through the first anode potential input line 1d1 and the cathode potential Vss provided through the first cathode potential input line 1s1 and on the level (potential) of the image signal transmitted from the first image signal line 4s1. The anode potential Vdd provided from the first power line Lvd to the first anode potential input line 1d1 is, for example, about 3 to 5 V The cathode potential Vss provided from the second power line Lvs to the first cathode potential input line 1s1 is, for example, about −3 to 0 V The second power line Lvs may be, for example, a ground line that is grounded. The second transistor 11d is, for example, a p-channel transistor. In this case, for example, the second transistor 11d includes the source electrode connected to the first anode potential input line 1d1 and the drain electrode connected to the first cathode potential input line 1s1 through the third transistor 11e, the first setter 13, and the first light emitter unit 12. In response to, for example, a L signal as an image signal input from the first image signal line 4s1 into the gate electrode, the second transistor 11d enters the conductive state to allow a current to flow through the source electrode and the drain electrode. This allows, for example, a drive current to flow to the first light emitter unit 12 from the first anode potential input line 1d1 through the second transistor 11d, the third transistor 11e, and the first setter 13. The first light emitter unit 12 may have the light intensity (luminance) controllable based on, for example, the level (potential) of the image signal. In other words, the second transistor 11d can control, for example, the light intensity of the first light emitter unit 12, or more specifically, control the light intensity of each of the first light emitter 12a and the second light emitter 12b in the first light emitter unit 12.

The first capacitor 11c is located on, for example, the connection line connecting the gate electrode and the source electrode of the second transistor 11d. The first capacitor 11c retains, for example, a potential Vsig of the image signal input into the gate electrode of the second transistor 11d for the period (period of one frame) until the second transistor 11d receives the next image signal (or is refreshed).

The third transistor 11e functions as, for example, a switch for controlling the emission or non-emission of the first light emitter unit 12. The third transistor 11e is located on, for example, the connection line (also referred to as a first drive line) connecting the second transistor 11d and the first light emitter unit 12. The third transistor 11e is, for example, a p-channel transistor. In this case, for example, the third transistor 11e includes the source electrode connected to the drain electrode of the second transistor 11d and the drain electrode connected to the first light emitter unit 12 through the first setter 13. More specifically, for example, the drain electrode of the third transistor 11e is connected to the positive electrode of each of the first light emitter 12a and the second light emitter 12b through the first setter 13. For example, the gate electrode of the third transistor 11e is connected to the emission control signal line 4e. In response to, for example, an on-signal (L signal in this example) as an emission control signal input from the emission control signal line 4e into the gate electrode, the third transistor 11e enters the conductive state to allow a current to flow through the source electrode and the drain electrode. This allows, for example, a drive current to flow from the first anode potential input line 1d1 to the first light emitter unit 12 through the second transistor 11d and the third transistor 11e, causing the first light emitter unit 12 to emit light.

The first setter 13 can set, for example, each of the first light emitter 12a and the second light emitter 12b selectively to one of the state in which the light emitter can emit light (also referred to as an emissive state) or the state in which the light emitter cannot emit light (also referred to as a non-emissive state). The emissive state refers to, for example, the state in which the light emitter can emit light based on the potential difference between the anode potential Vdd from the first power line Lvd and the cathode potential Vss from the second power line Lvs. The non-emissive state refers to, for example, the state in which the light emitter cannot emit light based on the potential difference between the anode potential Vdd from the first power line Lvd and the cathode potential Vss from the second power line Lvs. The first setter 13 can set each of the first light emitter 12a and the second light emitter 12b selectively to one of the emissive state or the non-emissive state based on a signal (also referred to as a setting control signal) from a setting controller 5, which includes, for example, circuits. In other words, the setting controller 5 can output, for example, the setting control signal to the first setter 13. The setting controller 5 may be a control circuit included in the drive 30. The setting controller 5 may be functionally implemented by program software stored in a random-access memory (RAM) or a read-only memory (ROM) in a drive element, such as an IC or an LSI circuit included in the drive 30. In some embodiments, the setting controller 5 may be functionally implemented by program software stored in a RAM and a ROM in a drive element other than the drive 30. The setting controller 5 may also be a control circuit on a circuit board separate from the drive 30.

The display device 100 may include the substrate 20 including a display surface (first surface F1), a non-display surface (second surface F2) opposite to the display surface, and the side surfaces F3 connecting the display surface and the non-display surface. The pixel circuits 10 may be located on the display surface of the substrate 20, whereas the drive 30 may be located on the non-display surface of the substrate 20. This structure can narrow the frame portion (non-display portion) on the display surface, or eliminate the frame portion. The drive 30 may be a drive element such as an IC or an LSI, or may be a circuit board such as a flexible printed circuit (FPC) board on which the drive element is mounted. The circuit board may be located on the non-display surface of the substrate 20. The circuit board may include connection electrodes connected to connection terminals on the non-display surface of the substrate 20.

The first setter 13 includes, for example, a fourth transistor 13*a* as a first switch and a fifth transistor 13*b* as a second switch.

The fourth transistor 13*a* as the first switch can set, for example, the first light emitter 12*a* selectively to one of the emissive state or the non-emissive state. The fourth transistor 13*a* is connected in series to, for example, the first light emitter 12*a*. The fourth transistor 13*a* is, for example, a p-channel transistor. In this case, for example, the fourth transistor 13*a* includes the source electrode connected to the drain electrode of the third transistor 11*e*, the drain electrode connected to the positive electrode of the first light emitter 12*a*, and the gate electrode connected to the setting controller 5 with a signal line (also referred to as a first setting control signal line) SL1. The setting controller 5 can output, for example, a first setting control signal Se1 to the gate electrode of the fourth transistor 13*a*. The setting controller 5 can selectively output, for example, one of a first signal (L signal in this example) or a second signal (high-level or H signal in this example) as the first setting control signal Se1. In this example, the first signal is an on-signal that enables conduction between the gate and the drain of the transistor. The second signal is an off-signal that disables conduction between the gate and the drain of the transistor. In other words, the first signal sets the light emitter to the emissive state, and the second signal sets the light emitter to the non-emissive state.

In response to, for example, a L signal that is the first signal as the first setting control signal Se1 input from the setting controller 5 into the gate electrode, the fourth transistor 13*a* enters the conductive state to allow a current to flow through the source electrode and the drain electrode. This sets, for example, the first light emitter 12*a* to the emissive state. In response to, for example, a H signal that is the second signal as the first setting control signal Se1 input from the setting controller 5 into the gate electrode, the fourth transistor 13*a* enters the nonconductive state to allow no current to flow through the source electrode and the drain electrode. This sets, for example, the first light emitter 12*a* to the non-emissive state.

The fifth transistor 13*b* as the second switch can set, for example, the second light emitter 12*b* selectively to one of the emissive state or the non-emissive state. The fifth transistor 13*b* is connected in series to, for example, the second light emitter 12*b*. The fifth transistor 13*b* is, for example, a p-channel transistor. In this case, for example, the fifth transistor 13*b* includes the source electrode connected to the drain electrode of the third transistor 11*e*, the drain electrode connected to the positive electrode of the second light emitter 12*b*, and the gate electrode connected to the setting controller 5 with a signal line (also referred to as a second setting control signal line) SL2. The setting controller 5 can output, for example, a second setting control signal Se2 to the gate electrode of the fifth transistor 13*b*. The setting controller 5 can selectively output, for example, one of a L signal that is the first signal or a H signal that is the second signal as the second setting control signal Se2.

In response to, for example, a L signal that is the first signal as the second setting control signal Se2 input from the setting controller 5 into the gate electrode, the fifth transistor 13*b* enters the conductive state to allow a current to flow through the source electrode and the drain electrode. This sets, for example, the second light emitter 12*b* to the emissive state. In response to, for example, a H signal that is the second signal as the second setting control signal Se2 input from the setting controller 5 into the gate electrode, the fifth transistor 13*b* enters the nonconductive state to allow no current to flow through the source electrode and the drain electrode. This sets, for example, the second light emitter 12*b* to the non-emissive state.

In the first subpixel circuit 1, the first setter 13 can set, for example, both the first light emitter 12*a* and the second light emitter 12*b* to the emissive state by switching both the fourth transistor 13*a* as the first switch and the fifth transistor 13*b* as the second switch to the conductive state.

The fourth transistor 13*a* as the first switch may be located on, for example, the negative electrode end of the first light emitter 12*a*. In this case, for example, the first light emitter 12*a* includes the positive electrode connected to the drain electrode of the third transistor 11*e* and the negative electrode connected to the second power line Lvs through the fourth transistor 13*a* as the first switch and the first cathode potential input line 1*s*1. More specifically, for example, the fourth transistor 13*a* includes the source electrode connected to the negative electrode of the first light emitter 12*a* and the drain electrode connected to the second power line Lvs with the first cathode potential input line 1*s*1. The fifth transistor 13*b* as the second switch may be located on, for example, the negative electrode end of the second light emitter 12*b*. In this case, for example, the second light emitter 12*b* includes the positive electrode connected to the drain electrode of the third transistor 11*e* and the negative electrode connected to the second power line Lvs through the fifth transistor 13*b* as the second switch and the first cathode potential input line 1*s*1. More specifically, for example, the fifth transistor 13*b* includes the source electrode connected to the negative electrode of the second light emitter 12*b* and the drain electrode connected to the second power line Lvs with the first cathode potential input line 1*s*1.

Second Subpixel Circuit

The second subpixel circuit 2 includes, for example, a second light emitter unit 22 and a second setter 23. The second subpixel circuit 2 also includes, for example, a second emission controller 21.

The second light emitter unit 22 includes, for example, a third light emitter 22*a* and a fourth light emitter 22*b*. The third light emitter 22*a* and the fourth light emitter 22*b* can emit light of a second color (e.g., green light or blue light). The third light emitter 22a and the fourth light emitter 22b may be, for example, the same type of light emitters. The third light emitter 22a and the fourth light emitter 22b are, for example, micro-LEDs or organic EL elements. More specifically, the third light emitter 22a and the fourth light emitter 22b are, for example, micro-LEDs or EL elements that emit light of the second color. In the first embodiment, the third light emitter 22a and the fourth light emitter 22b are connected, for example, in parallel. The third light emitter 22a and the fourth light emitter 22b are located on, for example, an insulating layer on the first surface F1 of the substrate 20. The third light emitter 22a and the fourth light emitter 22b are electrically connected to, for example, other components included in the second subpixel circuit 2 with feedthrough conductors such as through-holes extending through the insulating layer. In the first embodiment, the second light emitter unit 22 is connected to the first power line Lvd through, for example, the second setter 23, the second emission controller 21, and a second anode potential input line 2d1. More specifically, for example, the positive electrode as a first electrode of each of the third light emitter 22a and the fourth light emitter 22b is connected to the first power line Lvd through the second setter 23, the second emission controller 21, and the second anode potential input line 2d1. The second light emitter unit 22 is connected to, for example, the second power line Lvs with a second cathode potential input line 2s1. More specifically, for example, the negative electrode as a second electrode of each of the third light emitter 22a and the fourth light emitter 22b is connected to the second power line Lvs with the second cathode potential input line 2s1.

The second emission controller 21 can control, for example, the light emission of the second light emitter unit 22. More specifically, the second emission controller 21 can control, for example, the emission or non-emission of the third light emitter 22a and the fourth light emitter 22b and the intensity of light emitted from the third light emitter 22a and the fourth light emitter 22b. The second emission controller 21 has, for example, the same structure as the first emission controller 11. The second emission controller 21 includes, for example, a sixth transistor 21g, a seventh transistor 21d, a second capacitor 21c, and an eighth transistor 21e.

The sixth transistor 21g functions as, for example, a switch for inputting an image signal into the second emission controller 21. The sixth transistor 21g is, for example, a p-channel transistor. In this case, for example, the sixth transistor 21g includes the gate electrode connected to the scanning signal line 4g, the source electrode connected to the second image signal line 4s2, and the drain electrode connected to the gate electrode of the seventh transistor 21d. In response to, for example, an on-signal (L signal in this example) as a scanning signal input from the scanning signal line 4g into the gate electrode, the sixth transistor 21g enters the conductive state to allow a current to flow through the source electrode and the drain electrode. This causes, for example, an image signal from the second image signal line 4s2 to be provided to the gate electrode of the seventh transistor 21d through the sixth transistor 21g.

The seventh transistor 21d (drive element) drives the second light emitter unit 22 with a current based on the potential difference between the anode potential Vdd provided from the second anode potential input line 2d1 and the cathode potential Vss provided from the second cathode potential input line 2s1 and on the level (or potential) of the image signal transmitted from the second image signal line 4s2. The anode potential Vdd provided from the first power line Lvd to the second anode potential input line 2d1 is, for example, about 3 to 5 V. The cathode potential Vss provided from the second power line Lvs to the second cathode potential input line 2s1 is, for example, about −3 to 0 V. The seventh transistor 21d is, for example, a p-channel transistor. In this case, for example, the seventh transistor 21d includes the source electrode connected to the second anode potential input line 2d1 and the drain electrode connected to the second cathode potential input line 2s1 through the eighth transistor 21e, the second setter 23, and the second light emitter unit 22. In response to, for example, a L signal as an image signal input from the second image signal line 4s2 into the gate electrode, the seventh transistor 21d enters the conductive state to allow a current to flow through the source electrode and the drain electrode. This allows, for example, a drive current to flow to the second light emitter unit 22 from the second anode potential input line 2d1 through the seventh transistor 21d, the eighth transistor 21e, and the second setter 23. The second light emitter unit 22 may have the light intensity (luminance) controllable based on, for example, the level (potential) of the image signal. In other words, the seventh transistor 21d can control, for example, the light intensity of the second light emitter unit 22, or more specifically, the light intensity of each of the third light emitter 22a and the fourth light emitter 22b in the second light emitter unit 22.

The second capacitor 21c is located on, for example, the connection line connecting the gate electrode and the source electrode of the seventh transistor 21d. The second capacitor 21c retains, for example, a potential Vsig of the image signal input into the gate electrode of the seventh transistor 21d for the period (period of one frame) until the seventh transistor 21d receives the next image signal (or is refreshed).

The eighth transistor 21e functions as, for example, a switch for controlling the emission or non-emission of the second light emitter unit 22. The eighth transistor 21e is located on, for example, the connection line (also referred to as a second drive line) connecting the seventh transistor 21d and the second light emitter unit 22. The eighth transistor 21e is, for example, a p-channel transistor. In this case, for example, the eighth transistor 21e includes the source electrode connected to the drain electrode of the seventh transistor 21d and the drain electrode connected to the second light emitter unit 22 through the second setter 23. More specifically, for example, the drain electrode of the eighth transistor 21e is connected to the positive electrode of each of the third light emitter 22a and the fourth light emitter 22b through the second setter 23. The gate electrode of the eighth transistor 21e is connected to the emission control signal line 4e. In response to, for example, an on-signal (L signal in this example) as an emission control signal input from the emission control signal line 4e into the gate electrode, the eighth transistor 21e enters the conductive state to allow a current to flow through the source electrode and the drain electrode. This allows, for example, a drive current to flow from the second anode potential input line 2d1 to the second light emitter unit 22 through the seventh transistor 21d and the eighth transistor 21e, causing the second light emitter unit 22 to emit light.

The second setter 23 can set, for example, each of the third light emitter 22a and the fourth light emitter 22b selectively to one of the emissive state or the non-emissive state. The second setter 23 can set, for example, each of the third light emitter 22a and the fourth light emitter 22b selectively to one of the emissive state or the non-emissive state based on, for example, a signal (setting control signal)

from the setting controller 5. In other words, the setting controller 5 can output, for example, the setting control signal to the second setter 23.

The second setter 23 includes, for example, a ninth transistor 23a as a third switch and a tenth transistor 23b as a fourth switch.

The ninth transistor 23a as the third switch can set, for example, the third light emitter 22a selectively to one of the emissive state or the non-emissive state. The ninth transistor 23a is connected in series to, for example, the third light emitter 22a. The ninth transistor 23a is, for example, a p-channel transistor. In this case, for example, the ninth transistor 23a includes the source electrode connected to the drain electrode of the eighth transistor 21e, the drain electrode connected to the positive electrode of the third light emitter 22a, and the gate electrode connected to the setting controller 5 with a signal line (also referred to as a third setting control signal line) SL3. The setting controller 5 can output, for example, a third setting control signal Se3 to the gate electrode of the ninth transistor 23a. The setting controller 5 can selectively output, for example, one of a L signal that is the first signal or a H signal that is the second signal as the third setting control signal Se3.

In response to, for example, a L signal that is the first signal as the third setting control signal Se3 input from the setting controller 5 into the gate electrode, the ninth transistor 23a enters the conductive state to allow a current to flow through the source electrode and the drain electrode. This sets, example, the third light emitter 22a to the emissive state. In response to, for example, a H signal that is the second signal as the third setting control signal Se3 input from the setting controller 5 into the gate electrode, the ninth transistor 23a enters the nonconductive state to allow no current to flow through the source electrode and the drain electrode. This sets, for example, the third light emitter 22a to the non-emissive state.

The tenth transistor 23b as the fourth switch can set, for example, the fourth light emitter 22b selectively to one of the emissive state or the non-emissive state. The tenth transistor 23b is connected in series to, for example, the fourth light emitter 22b. The tenth transistor 23b is, for example, a p-channel transistor. In this case, for example, the tenth transistor 23b includes the source electrode connected to the drain electrode of the eighth transistor 21e, the drain electrode connected to the positive electrode of the fourth light emitter 22b, and the gate electrode connected to the setting controller 5 with a signal line (also referred to as a fourth setting control signal line) SL4. The setting controller 5 can output, for example, a fourth setting control signal Se4 to the gate electrode of the tenth transistor 23b. The setting controller 5 can selectively output, for example, one of a L signal that is the first signal or a H signal that is the second signal as the fourth setting control signal Se4.

In response to, for example, a L signal that is the first signal as the fourth setting control signal Se4 input from the setting controller 5 into the gate electrode, the tenth transistor 23b enters the conductive state to allow a current to flow through the source electrode and the drain electrode. This sets, for example, the fourth light emitter 22b to the emissive state. In response to, for example, a H signal that is the second signal as the fourth setting control signal Se4 input from the setting controller 5 into the gate electrode, the tenth transistor 23b enters the nonconductive state to allow no current to flow through the source electrode and the drain electrode. This sets, for example, the fourth light emitter 22b to the non-emissive state.

In the second subpixel circuit 2, the second setter 23 can selectively set, for example, one of the third light emitter 22a or the fourth light emitter 22b to the emissive state by selectively switching one of the ninth transistor 23a as the third switch or the tenth transistor 23b as the fourth switch to the conductive state. In other words, in the second subpixel circuit 2, the second setter 23 can selectively set, for example, one of the third light emitter 22a or the fourth light emitter 22b to the non-emissive state by selectively switching one of the ninth transistor 23a as the third switch or the tenth transistor 23b as the fourth switch to the nonconductive state.

The ninth transistor 23a as the third switch may be located on, for example, the negative electrode end of the third light emitter 22a. In this case, for example, the third light emitter 22a includes the positive electrode connected to the drain electrode of the eighth transistor 21e and the negative electrode connected to the second power line Lvs through the ninth transistor 23a as the third switch and the second cathode potential input line 2s1. More specifically, for example, the ninth transistor 23a includes the source electrode connected to the negative electrode of the third light emitter 22a and the drain electrode connected to the second power line Lvs with the second cathode potential input line 2s1. The tenth transistor 23b as the fourth switch may be located on, for example, the negative electrode end of the fourth light emitter 22b. In this case, for example, the fourth light emitter 22b includes the positive electrode connected to the drain electrode of the eighth transistor 21e and the negative electrode connected to the second power line Lvs through the tenth transistor 23b as the fourth switch and the second cathode potential input line 2s1. More specifically, for example, the tenth transistor 23b includes the source electrode connected to the negative electrode of the fourth light emitter 22b and the drain electrode connected to the second power line Lvs with the second cathode potential input line 2s1.

1-3. Setting Controller

Figure 5:
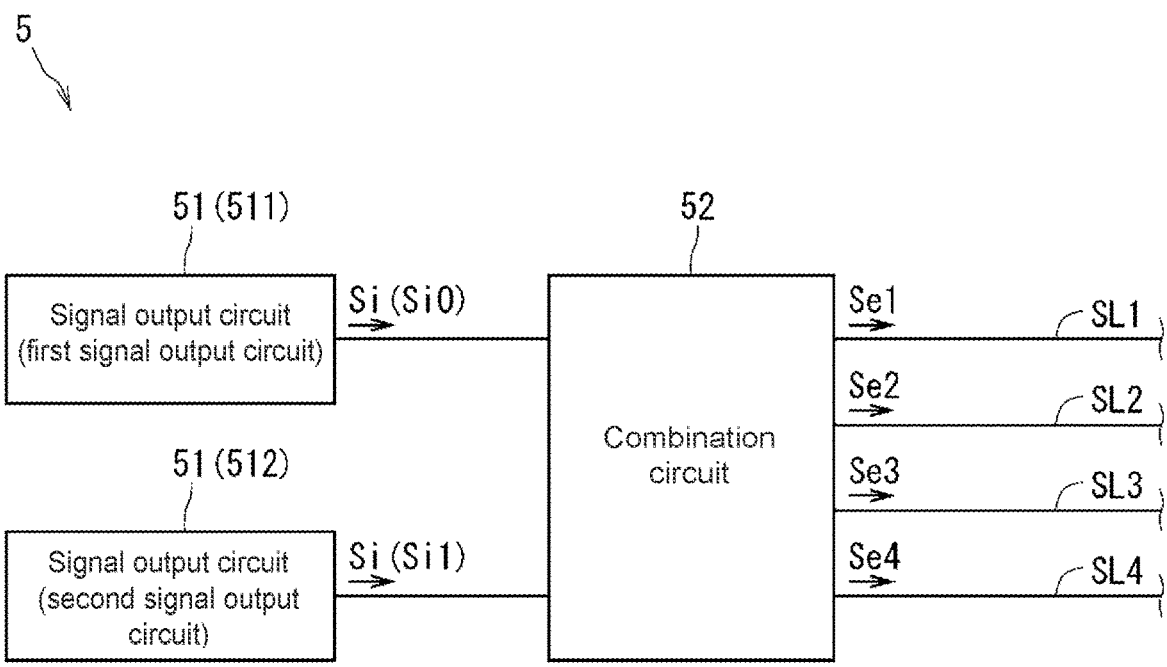
FIG. 5 is a schematic block circuit diagram of a setting controller with an example structure.

The setting controller 5 may be included in, for example, each of the multiple pixel circuits 10. In other words, for example, each of the multiple pixel circuits 10 may include the setting controller 5. FIG. 5 is a schematic block diagram of the setting controller 5 with an example structure. As illustrated in FIG. 5, the setting controller 5 includes, for example, multiple signal output circuits 51 and a combination circuit 52.

Signal Output Circuit

The multiple signal output circuits 51 include, for example, a first signal output circuit 511 and a second signal output circuit 512. Each signal output circuit 51 can selectively output, for example, one of a L signal that is the first signal or a H signal that is the second signal as a switch signal Si. For example, the first signal output circuit 511 can selectively output one of a L signal that is the first signal or a H signal that is the second signal as a first switch signal Si0. For example, the second signal output circuit 512 can selectively output one of a L signal that is the first signal or a H signal that is the second signal as a second switch signal Si1.

Each signal output circuit 51 may be, for example, a flip-flop circuit that can switch the switch signal Si to either a L signal or a H signal and retain the status of the resulting signal, a circuit that stores data such as a latch circuit (also referred to as a storage circuit), or a circuit that switches the switch signal Si between a L signal and a H signal in response to cutting of one or more wires (also referred to as a fuse circuit).

Figure 6:
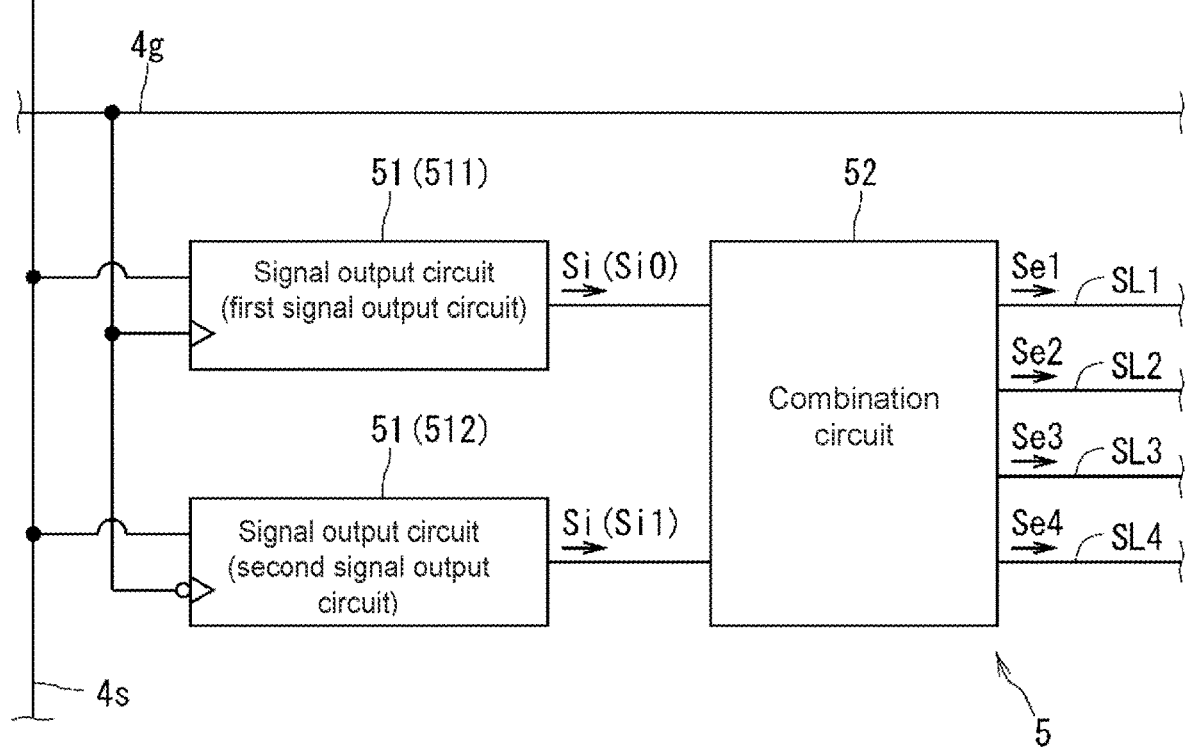
FIG. 6 is a block circuit diagram of a signal output circuit in a first example.

FIG. 6 is a circuit diagram of the signal output circuits 51 in a first example. As illustrated in FIG. 6, each of the signal output circuits 51 may be, for example, a storage circuit. The storage circuit as each signal output circuit 51 is set to continue outputting either a L signal or a H signal as the switch signal Si once, for example, receiving an input (writing) of a signal (setting signal) as data for setting the status of the signal. In this example, the image signal line 4s may be used as a signal line (also referred to as a setting-signal write signal line) for inputting (writing) a setting signal into the signal output circuits 51. The scanning signal line 4g may be used as a signal line (also referred to as a specific signal input signal line) for inputting a signal (also referred to as a specific signal) specifying the timing at which the setting signal is input (written) into the signal output circuits 51.

As illustrated in, for example, FIG. 6, one image signal line 4s may be connected to the first signal output circuit 511 and to the second signal output circuit 512. One scanning signal line 4g may be, for example, connected to the first signal output circuit 511 and to the second signal output circuit 512 through a NOT circuit. This structure allows, for example, one single scanning signal line 4g to specify, in time sequence, the first timing at which the setting signal is input (written) from the image signal line 4s into the storage circuit as the first signal output circuit 511 and the second timing at which the setting signal is input (written) from the image signal line 4s into the storage circuit as the second signal output circuit 512. For example, a L signal as a specific signal from the scanning signal line 4g is input into the storage circuit as the first signal output circuit 511. The L signal as the specific signal from the scanning signal line 4g is converted into, by the NOT circuit, a H signal as a signal that is not a specific signal (also referred to as an unspecific signal). The resulting H signal is input into the storage circuit as the second signal output circuit 512. This may allow, for example, the setting signal to be input (written) from the image signal line 4s into the storage circuit as the first signal output circuit 511 and the setting signal to be input (written) from the image signal line 4s into the storage circuit as the second signal output circuit 512, or allows the setting signal to be input (written) from the image signal line 4s into the storage circuit as the second signal output circuit 512 and the setting signal to be input (written) from the image signal line 4s into the storage circuit as the first signal output circuit 511. The specific signal may be, for example, a H signal. The storage circuit as the first signal output circuit 511 receives, for example, an input (writing) of a L signal or a H signal as the setting signal from the image signal line 4s upon receiving the specific signal from the scanning signal line 4g. The storage circuit as the second signal output circuit 512 receives, for example, an input (writing) of a L signal or a H signal as the setting signal from the image signal line 4s upon receiving the specific signal from the scanning signal line 4g.

When, for example, each pixel circuit 10 includes the setting controller 5, each pixel circuit 10 may include, as the setting-signal write signal lines, the first image signal line 4s1 connected to the first subpixel circuit 1, the second image signal line 4s2 connected to the second subpixel circuit 2, and the third image signal line 4s3 connected to the third subpixel circuit 3. In each pixel circuit 10, for example, the scanning signal line 4g connected to the first subpixel circuit 1, the second subpixel circuit 2, and the third subpixel circuit 3 may be used as the specific signal input lines.

FIG. 7 is a circuit diagram of a signal output circuit 51 in a second example. As illustrated in FIG. 7, each signal output circuit 51 is, for example, a fuse circuit. The fuse circuit as the signal output circuit 51 includes, for example, a first circuit 51C1, a second circuit 51C2, a signal input section 51I, and a signal output section 51U.

The signal input section 51I receives signals input from outside the signal output circuit 51. The signal input section 51I receives, for example, signals from the drive 30 through a predetermined wire.

The first circuit 51C1 is, for example, a complementary metal-oxide-semiconductor (CMOS) NOT circuit as an inverter logic circuit. The CMOS NOT circuit includes, for example, a p-channel transistor and an n-channel transistor connected in series between a positive power line to provide a positive potential VGH and a negative power line to provide a negative potential VGL. The negative potential VGL may be, for example, a reference potential (GND) or 0 V. More specifically, the p-channel transistor includes the source electrode connected to the positive power line and the drain electrode connected to the drain electrode of the n-channel transistor. The source electrode of the n-channel transistor is connected to the negative power line. The COMS NOT circuit includes an input end (also referred to as a first input end) at which the gate electrode of the p-channel transistor is connected to the gate electrode of the n-channel transistor and an output end (also referred to as a first output end) at which the drain electrode of the p-channel transistor is connected to the drain electrode of the n-channel transistor. The COMS NOT circuit can reverse the logical level of the voltage of a signal input into the first input end to output the resulting voltage from the first output end. The first input end of the CMOS NOT circuit is connected to the signal input section 51I. The first circuit 51C1 can thus output, from the first output end, a H signal in response to, for example, a L signal input from the signal input section 51I into the first input end, and output, from the first output end, a L signal in response to a H signal input from the signal input section 51I into the first input end. The first circuit 51C1 includes, for example, a specific wire portion 51P on the wire connecting the source electrode of the n-channel transistor and the negative power line. In this case, each signal output circuit 51 includes, for example, the specific wire portion 51P. The specific wire portion 51P is a portion to be cut (described later). The specific wire portion 51P located on the insulating layer on the first surface F1 of the substrate 20 may be easily cut by, for example, melting with laser beam irradiation, mechanical cutting using, for example, a grinder, or chemical cutting using, for example, etching. More specifically, the specific wire portion 51P is a portion that can permanently be in one of a conductive state or a nonconductive state (also referred to as a permanent conductive-nonconductive selector).

The second circuit 51C2 includes, for example, a buffer circuit portion 51B including two NOT gates N1 and N2 in a cascade connection and a wire portion 51W connected in parallel to the buffer circuit portion 51B. The second circuit 51C2 also includes, for example, an input end (also referred to as a second input end) connected to the first output end of the first circuit 51C1 and an output end (also referred to as a second output end) connected to the signal output section 51U. The buffer circuit portion 51B can output a stabilized and corrected voltage level of the signal input from the first output end of the first circuit 51C1 to the second input end. The second circuit 51C2 can output a stabilized and corrected L signal from the second output end in response to, for example, a L signal input from the first circuit 51C1 into the second input end, and output a stabilized and corrected H signal from the second output end in response to a H signal input from the first circuit 51C1 into the second input end.

In the fuse circuit as the signal output circuit 51 with the above structure, for example, a L signal is input into the signal input section 51I. In this case, the first circuit 51C1 reverses the L signal to output a H signal. The second circuit 51C2 outputs a stabilized and corrected H signal. The signal output section 51U thus outputs a H signal as the switch signal Si to the combination circuit 52. In the fuse circuit as the signal output circuit 51 with the above structure, for example, a H signal is input into the signal input section 51I. In this case, the first circuit 51C1 reverses the H signal to output a L signal. The second circuit 51C2 outputs a stabilized and corrected L signal. The signal output section 51U thus outputs a L signal as the switch signal Si to the combination circuit 52.

The fuse circuit as the signal output circuit 51 switches, for example, the relationship between the signal input into the signal input section 51I and the signal output from the signal output section 51U based on whether the specific wire portion 51P is cut.

When, for example, the specific wire portion 51P is yet to be cut (also referred to as being in an uncut state), the fuse circuit as the signal output circuit 51 outputs a H signal from the signal output section 51U in response to a L signal input into the signal input section 51I and outputs a L signal from the signal output section 51U in response to a H signal input into the signal input section 51I. When, for example, the specific wire portion 51P is cut (also referred to as being in a cut state), the fuse circuit as the signal output circuit 51 outputs a H signal from the signal output section 51U in response to a L signal input into the signal input section 51I and continues outputting the same signal in response to H signals subsequently input into the signal input section 51I. Thus, the fuse circuit as the signal output circuit 51 in the cut state continues outputting a H signal from the signal output section 51U in response to a H signal input into the signal input section 51I, once the fuse circuit receives an input L signal into the signal input section 51I and start outputting a H signal from the signal output section 51U. In this state, the signal output circuit 51 stores, for example, the state in which the second circuit 51C2 continues outputting a H signal from the signal output section 51U.

The structure in this example may use the relationship between the input and the output in the fuse circuit that changes based on whether the specific wire portion 51P is cut to switch the switch signal Si output from the fuse circuit as the signal output circuit 51 between a L signal and a H signal.

For example, the fuse circuit as the signal output circuit 51 in the uncut state outputs, in a first period, a H signal as the switch signal Si from the signal output section 51U in response to a signal XRST input into the signal input section 51I being a L signal. In a second period subsequent to the first period, for example, the fuse circuit as the signal output circuit 51 in the uncut state outputs a L signal as the switch signal Si from the signal output section 51U in response to the signal XRST input into the signal input section 51I being a H signal. In this case, for example, the fuse circuit as the signal output circuit 51 in the uncut state inputs a L signal as the switch signal Si into the combination circuit 52.

For example, the fuse circuit as the signal output circuit 51 in the cut state outputs, in the first period, a H signal as the switch signal Si from the signal output section 51U in response to the signal XRST input into the signal input section 51I being a L signal. In the second period subsequent to the first period, for example, the fuse circuit as the signal output circuit 51 in the cut state continues outputting a H signal as the switch signal Si from the signal output section 51U in response to the signal XRST input into the signal input section 51I being a H signal. In this case, for example, the fuse circuit as the signal output circuit 51 in the cut state inputs a H signal as the switch signal Si into the combination circuit 52.

In the manner described above, for example, the fuse circuit as the signal output circuit 51 can switch, in the second period, the switch signal Si to be output to the combination circuit 52 from a L signal at a first potential to a H signal at a second potential in response to the specific wire portion 51P being cut. This structure is less likely to increase, for example, the circuit size of the signal output circuit 51.

Combination Circuit

The combination circuit 52 can output, for example, the setting control signal based on multiple switch signals Si input from the multiple signal output circuits 51. In this example, the combination circuit 52 can output a L signal that is the first signal or a H signal that is the second signal as each of the first setting control signal Se1, the second setting control signal Se2, the third setting control signal Se3, and the fourth setting control signal Se4 based on the combination of a L signal and a H signal as the switch signals Si input from the respective signal output circuits 51.

FIG. 8 is a truth table showing an example relationship between the switch signal Si input into the combination circuit 52, the setting control signal output from the combination circuit 52, and the light emitter(s) set to the emissive state. The combination circuit 52 in this example yields various logical outputs to cause, for example, the inputs of a first switch signal Si0 and a second switch signal Si1 to be in the relationship with the outputs of the first setting control signal Se1, the second setting control signal Se2, the third setting control signal Se3, and the fourth setting control signal Se4 in the manner shown in FIG. 8. As shown in the example in FIG. 8, four logical output patterns (more specifically, patterns 1 to 4) may be yielded as combinations of the inputs of the first switch signal Si0 and the second switch signal Si1 and the outputs of the first setting control signal Se1, the second setting control signal Se2, the third setting control signal Se3, and the fourth setting control signal Se4.

When, for example, pattern 1 is used, in response to a L signal as the first switch signal Si0 and a L signal as the second switch signal Si1, the combination circuit 52 outputs a L signal that is the first signal as the first setting control signal Se1, a L signal that is the first signal as the second setting control signal Se2, a L signal that is the first signal as the third setting control signal Se3, and a H signal that is the second signal as the fourth setting control signal Se4. In this state, the first setter 13 sets, for example, both the first light emitter 12a and the second light emitter 12b to the emissive state by switching both the fourth transistor 13a as the first switch and the fifth transistor 13b as the second switch to the conductive state. The second setter 23 selectively sets, for example, the third light emitter 22a to the emissive state by switching the ninth transistor 23a as the third switch to the conductive state, and selectively sets the fourth light emitter 22b to the non-emissive state by switching the tenth transistor 23b as the fourth switch to the nonconductive state. This sets, for example, the first light emitter 12a, the second light emitter 12b, and the third light emitter 22a to the emissive state and the fourth light emitter 22b to the non-emissive state.

When, for example, pattern 2 is used, in response to a L signal as the first switch signal Si0 and a H signal as the second switch signal Si1, the combination circuit 52 outputs a L signal that is the first signal as the first setting control signal Se1, a L signal that is the first signal as the second setting control signal Se2, a H signal that is the second signal as the third setting control signal Se3, and a L signal as the first signal as the fourth setting control signal Se4. In this state, the first setter 13 sets, for example, both the first light emitter 12a and the second light emitter 12b to the emissive state by switching both the fourth transistor 13a as the first switch and the fifth transistor 13b as the second switch to the conductive state. The second setter 23 selectively sets, for example the third light emitter 22a to the non-emissive state by switching the ninth transistor 23a as the third switch to the nonconductive state, and selectively sets the fourth light emitter 22b to the emissive state by switching the tenth transistor 23b as the fourth switch to the conductive state. This sets, for example, the first light emitter 12a, the second light emitter 12b, and the fourth light emitter 22b to the emissive state and the third light emitter 22a to the non-emissive state.

When, for example, pattern 3 is used, in response to a H signal as the first switch signal Si0 and a L signal as the second switch signal Si1, the combination circuit 52 outputs a L signal that is the first signal as the first setting control signal Se1, a H signal that is the second signal as the second setting control signal Se2, a L signal that is the first signal as the third setting control signal Se3, and a H signal that is the second signal as the fourth setting control signal Se4. This sets, for example, the first light emitter 12a and the third light emitter 22a to the emissive state and the second light emitter 12b and the fourth light emitter 22b to the non-emissive state.

When, for example, pattern 4 is used, in response to a H signal as the first switch signal Si0 and a H signal as the second switch signal Si1, the combination circuit 52 outputs a H signal that is the second signal as the first setting control signal Se1, a L signal that is the first signal as the second setting control signal Se2, a H signal that is the second signal as the third setting control signal Se3, and a L signal that is the first signal as the fourth setting control signal Se4. This sets, for example, the second light emitter 12b and the fourth light emitter 22b to the emissive state and the first light emitter 12a and the third light emitter 22a to the non-emissive state.

1-4. Improving Characteristics of Display Device

The first light emitter 12a and the second light emitter 12b are connected, for example, in parallel. The third light emitter 22a and the fourth light emitter 22b are connected, for example, in parallel. In other words, the pixel circuit 10 has, for example, the state (also referred to as a first connection same state) in which the connection between the first light emitter 12a and the second light emitter 12b and the connection between the third light emitter 22a and the fourth light emitter 22b are the same parallel connection.

The pixel circuit 10 can set, for example, both the first light emitter 12a and the second light emitter 12b to the emissive state with the first setter 13 and can selectively set one of the third light emitter 22a or the fourth light emitter 22b to the emissive state with the second setter 23. In other words, the pixel circuit 10 sets, for example, the emission status of the first light emitter 12a and the second light emitter 12b with the first setter 13 to a setting (also referred to as a first emission setting or a both emissive setting) in which both light emitters are in the emissive state. The pixel circuit 10 can set, for example, the emission status of the third light emitter 22a and the fourth light emitter 22b with the second setter 23 to a setting (also referred to as a second emission setting or an either emissive setting) in which one of the light emitters are selectively in the emissive state.

The pixel circuit 10 thus has an emitter number setting mode in which the emission status of the first light emitter 12a and the second light emitter 12b set by the first setter 13 is in one of the first emission setting to cause both light emitters to be in the emissive state or the second emission setting to selectively cause one of the light emitters to be in the emissive state and the emission status of the third light emitter 22a and the fourth light emitter 22b set by the second setter 23 is in the other of the first emission setting or the second emission setting. The emitter number setting corresponds to, for example, setting the number of light emitters to be in the emissive state in each of the first subpixel circuit 1 and the second subpixel circuit 2. In other words, for example, the emitter number setting in the first subpixel circuit 1 corresponds to setting the number of light emitters to be in the emissive state in the first subpixel circuit 1. The emitter number setting in the second subpixel circuit 2 corresponds to setting the number of light emitters to be in the emissive state in the second subpixel circuit 2. The emitter number setting mode is one of a mode (same mode) in which the number of light emitters set to the emissive state is the same or a mode (different mode) in which the number of light emitters set to the emissive is different. The emitter number setting mode is hereafter also referred to simply as a setting mode, with the mode in which the number of light emitters set to be emissive is different (different state) being referred to as an emitter number different state or an emitter number different mode. In other words, the emitter number different state (emitter number different mode) is a state in which the emission status of the first light emitter 12a and the second light emitter 12b set by the first setter 13 is in one of the first emission setting to cause both light emitters to be in the emissive state or in the second emission setting to selectively cause one of the light emitters to be in the emissive state and the emission status of the third light emitter 22a and the fourth light emitter 22b set by the second setter 23 is in the other of the first emission setting or the second emission setting. In the first embodiment, the pixel circuit 10 thus has, for example, the first connection same state and the emitter number different mode.

In this example, a reference normal mode in the pixel circuit 10 causes the first light emitter 12a and the second light emitter 12b connected in parallel to be both in the emissive state and one of the third light emitter 22a or the fourth light emitter 22b connected in parallel to be selectively in the emissive state. The setting mode in the pixel circuit 10 refers to, for example, the setting of the emissive states of the first light emitter 12a, the second light emitter 12b, the third light emitter 22a, and the fourth light emitter 22b in the pixel circuit 10. In this example, the pixel circuit 10 has the first connection same state and the emitter number different mode as the normal mode. The first emitter number different mode causes, for example, both the first light emitter 12a and the second light emitter 12b connected in parallel to be in the emissive state and one of the third light emitter 22a or the fourth light emitter 22b connected in parallel to be selectively in the emissive state.

When, for example, one of the first light emitter 12a or the second light emitter 12b connected in parallel in the first subpixel circuit 1 selectively emits light, a higher forward voltage (also referred to as a first-A forward voltage) Vf1a may be applied to the first light emitter 12a or the second light emitter 12b due to at least the characteristics of the first light emitter 12a and the second light emitter 12b or the use conditions for light emission. For example, the first-A forward voltage Vf1a may increase in the first subpixel circuit 1 both when the first light emitter 12a and the second light emitter 12b have a high value of at least the internal resistance, the upper setting limit of the drive current, the upper setting limit of the forward voltage, or the upper setting limit of the luminance, and when the first light emitter 12a and the second light emitter 12b have low emission efficiency. In this example, the first-A forward voltage Vf1a may be higher than a forward voltage (also referred to as a second-A forward voltage) Vf2a applied to one of the third light emitter 22a or the fourth light emitter 22b when one of the third light emitter 22a or the fourth light emitter 22 selectively emits light. In this case, the first-A forward voltage Vf1a uses, for example, a large portion of the potential difference (Vdd−Vss) between the anode potential Vdd and the cathode potential Vss, thus reducing the voltage (drain-source voltage) Vds between the drain electrode and the source electrode of the second transistor 11d. This causes the operating conditions to be stricter for the second transistor 11d to operate in the saturation region. In other words, the second transistor 11d is not easily operable in the saturation region. When, for example, the second transistor 11d in the first subpixel circuit 1 has a high saturation operation voltage, the operating conditions to be stricter for the second transistor 11d in the saturation region in response to a decrease in the potential differences (Vdd−Vss) resulting from a voltage drop at the anode potential Vdd corresponding to the distance from the power supply. The saturation operation voltage of the second transistor 11d may be higher for, for example, a greater distance (also referred to as the channel length) between the drain electrode and the source electrode of the second transistor 11d.

In the first embodiment, the normal mode described above sets, for example, both the first light emitter 12a and the second light emitter 12b connected in parallel in the first subpixel circuit 1 to the emissive state and causes both the first light emitter 12a and the second light emitter 12b to emit light. This allows, for example, the drive current flowing through each of the first light emitter 12a and the second light emitter 12b to be about half the current flowing when one of the first light emitter 12a or the second light emitter 12b connected in parallel to have the same light intensity selectively emits light, and may decrease the forward voltage applied to each of the first light emitter 12a and the second light emitter 12b. In this case, for example, a larger portion of the potential difference (Vdd−Vss) may be used by the drain-source voltage Vds of the second transistor 11d in the first emission controller 11. Thus, the operating conditions for the second transistor 11d in the saturation region are less likely to be stricter in response to, for example, a decrease in the potential difference (Vdd−Vss) resulting from a voltage drop at the anode potential Vdd. This reduces gradations (uneven luminance), or a gradual decrease in the luminance of the display device 100, thus improving the image quality of the display device 100.

When, for example, one of the first light emitter 12a or the second light emitter 12b connected in parallel in the first subpixel circuit 1 selectively emits light, a larger drive current (also referred to as a first-A current) may flow through the first light emitter 12a or the second light emitter 12b due to at least the characteristics of the first light emitter 12a and the second light emitter 12b or the use conditions for light emission. For example, the first subpixel circuit 1 may have a greater drive current flowing through the first light emitter 12a or the second light emitter 12b both when the first light emitter 12a and the second light emitter 12b have a high value of at least the upper setting limit of the drive current, the upper setting limit of the forward voltage, or the upper setting limit of the luminance, and when the first light emitter 12a and the second light emitter 12b have low emission efficiency. In this example, when one of the third light emitter 22a or the fourth light emitter 22b selectively emits light, the first-A current may be about twice the drive current (also referred to as a second-A current) flowing through the third light emitter 22a or the fourth light emitter 22b. This may increase, for example, heat generated by the first light emitter 12a or the second light emitter 12b, which thus easily deteriorates over time. In the first subpixel circuit 1, for example, the first light emitter 12a and the second light emitter 12b with a greater internal resistance may also easily deteriorate over time due to, for example, heat generation.

In the first embodiment, the normal mode described above sets, for example, both the first light emitter 12a and the second light emitter 12b connected in parallel in the first subpixel circuit 1 to the emissive state and causes both the first light emitter 12a and the second light emitter 12b to emit light. This may decrease the current flowing through each of the first light emitter 12a and the second light emitter 12b to substantially half the current flowing when, for example, one of the first light emitter 12a or the second light emitter 12b connected in parallel to have the same light intensity selectively emits light. The first light emitter 12a or the second light emitter 12b is thus, for example, less likely to deteriorate over time. The display device 100 may thus have higher image quality.

When, for example, both the third light emitter 22a and the fourth light emitter 22b connected in parallel in the second subpixel circuit 2 emit light, a smaller drive current (also referred to as a second-B current) may flow through the third light emitter 22a and the fourth light emitter 22b due to at least the characteristics of the third light emitter 22a and the fourth light emitter 22b or the use conditions for light emission. For example, the second-B current may decrease in the second subpixel circuit 2 when the third light emitter 22a and the fourth light emitter 22b have a low value in at least one of the internal resistance, the lower setting limit of the drive current, the lower setting limit of the forward voltage, or the lower setting limit of the luminance or have high emission efficiency. In this example, when the first light emitter 12a and the second light emitter 12b are both set to emit light, the second-B current may be about half the drive current (also referred to as a first-B current) flowing through the first light emitter 12a and the second light emitter 12b both set to emit light. In this case, for example, the low drive current is further decreased to a still lower drive current, which can change the light intensity of each of the third light emitter 22a and the fourth light emitter 22b to an unintentionally low level. This may not easily allow adjustment of the gradations of the luminance in the subpixels, and may reduce the accuracy in luminance gradations in the display device 100 (also referred to as accuracy reduction in luminance gradations).

In the first embodiment, the normal mode described above selectively sets, for example, one of the third light emitter 22a or the fourth light emitter 22b connected in parallel in the second subpixel circuit 2 to the emissive state and selectively causes one of the third light emitter 22a or the fourth light emitter 22b to emit light. This increases the current flowing through the third light emitter 22a or the fourth light emitter 22b to be substantially twice the current flowing when, for example, the third light emitter 22a and the fourth light emitter 22b connected in parallel to have the same light intensity both emit light. The change in the light intensity of the third light emitter 22a or the fourth light emitter 22b allows, for example, the luminance gradations in the second subpixel circuit 2 to be easily adjusted finely. The display device 100 is thus less likely to have, for example, lower image quality.

In the first embodiment described above, when, for example, the first subpixel circuit 1 and the second subpixel circuit 2 have at least different component characteristics or different use conditions of the light emitters, the first connection same state and the first emitter number different mode as the normal mode are used as appropriate for at least the component characteristics or the use conditions of the light emitters. The display device 100 can thus achieve, for example, higher performance.

Setting Normal Mode

In the first embodiment, the use of, for example, pattern 1 or pattern 2 described above causes the emission status of the first light emitter 12a, the second light emitter 12b, the third light emitter 22a, and the fourth light emitter 22b to enter the normal mode. More specifically, the pixel circuit 10 has, for example, the normal mode in which the first light emitter 12a and the second light emitter 12b connected in parallel are both set to the emissive state and one of the third light emitter 22a or the fourth light emitter 22b connected in parallel is selectively set to the emissive state.

In this case, the first setter 13 sets, for example, both the first light emitter 12a and the second light emitter 12b to the emissive state by switching both the fourth transistor 13a as the first switch and the fifth transistor 13b as the second switch to the conductive state. For example, the second setter 23 selectively sets one of the third light emitter 22a or the fourth light emitter 22b to the emissive state by selectively switching one of the ninth transistor 23a as the third switch or the tenth transistor 23b as the fourth switch to the conductive state. As described above, when, for example, the first subpixel circuit 1 and the second subpixel circuit 2 have at least different component characteristics or different use conditions of the light emitters, the first connection same state and the first emitter number different mode are used as appropriate for at least the component characteristics or the use conditions of the light emitters, thus improving the performance of the display device 100.

For any emission failure with the fourth light emitter 22b resulting from, for example, a connection failure or a defective component, pattern 1 may be used to set the emission status of the first light emitter 12a, the second light emitter 12b, the third light emitter 22a, and the fourth light emitter 22b to the normal mode. For any emission failure with the third light emitter 22a resulting from, for example, a connection failure or a defective component, pattern 2 may be used to set the emission status of the first light emitter 12a, the second light emitter 12b, the third light emitter 22a, and the fourth light emitter 22b to the normal mode.

An emission failure with the third light emitter 22a and the fourth light emitter 22b in each pixel circuit 10 may be detected in, for example, the pre-shipment inspection or the maintenance of the display device 100. Pattern 1 or pattern 2 may be used as a pattern corresponding to the normal mode as appropriate for, for example, the emission failure with the third light emitter 22a or the fourth light emitter 22b. For example, pattern 1 may be used to set the first light emitter 12a, the second light emitter 12b, and the third light emitter 22a to the emissive state and the fourth light emitter 22b to the non-emissive state. This setting mode may be used as a first normal mode. For example, pattern 2 may be used to set the first light emitter 12a, the second light emitter 12b, and the fourth light emitter 22b to the emissive state and the third light emitter 22a to the non-emissive state. This setting mode may be used as a second normal mode.

Setting Failure Mode

In the first embodiment, the use of, for example, pattern 3 or pattern 4 causes the emission status of the first light emitter 12a, the second light emitter 12b, the third light emitter 22a, and the fourth light emitter 22b to enter a mode for responding to an emission failure (also referred to as a failure mode) in the pixel circuit 10. In this case, the first setter 13 selectively sets, for example, one of the first light emitter 12a or the second light emitter 12b to the non-emissive state by switching one of the fourth transistor 13a as the first switch or the fifth transistor 13b as the second switch to the nonconductive state. This may selectively cause, for example, one of the first light emitter 12a or the second light emitter 12b with no emission failure in the first subpixel circuit 1 to emit light.

For any emission failure with the second light emitter 12b resulting from, for example, a connection failure or a defective component, pattern 3 corresponding to the failure mode may be used instead of pattern 1 or pattern 2 corresponding to the normal mode. In this case, for example, the first setter 13 sets the second light emitter 12b to the non-emissive state selectively from the first light emitter 12a and the second light emitter 12b by switching the fifth transistor 13b as the second switch to the nonconductive state selectively from the fourth transistor 13a as the first switch or the fifth transistor 13b. This allows, for example, the first light emitter 12a with no emission failure in the first subpixel circuit 1 to emit light selectively from the first light emitter 12a and the second light emitter 12b. In this example, each of the first light emitter 12a and the third light emitter 22a is set to the emissive state, and each of the second light emitter 12b and the fourth light emitter 22b is set to the non-emissive state. This setting mode may be used as a first failure mode.

For any emission failure with the first light emitter 12a resulting from, for example, a connection failure or a defective component, pattern 4 corresponding to the failure mode may be used instead of pattern 1 or pattern 2 corresponding to the normal mode. In this case, for example, the first setter 13 sets the first light emitter 12a to the non-emissive state selectively from the first light emitter 12a and the second light emitter 12b by switching the fourth transistor 13a as the first switch to the nonconductive state selectively from the fourth transistor 13a and the fifth transistor 13b as the second switch. This allows, for example, the second light emitter 12b with no emission failure in the first subpixel circuit 1 to emit light selectively from the first light emitter 12a and the second light emitter 12b. In this example, each of the second light emitter 12b and the fourth light emitter 22b may be set to the emissive state, and each of the first light emitter 12a and the third light emitter 22a may be set to the non-emissive state. This setting mode may be referred to as a second failure mode.

1-5. Variations of First Embodiment

The display panel 100p may include, for example, the setting controller 5 for each of the multiple pixel circuits 10. In other words, the display panel 100p may include, for example, the pixel circuits 10 and setting controllers 5 each outputting a setting control signal to the first setter 13 and the second setter 23 in the corresponding pixel circuit 10. In this case, for example, the setting controllers 5 may be located in the open area of the image display 300 on the first surface F1 of the substrate 20, in the frame portion, or on the second surface F2 of the substrate 20. One setting controller 5 may be located for, for example, multiple pixel circuits 10 in one row or for multiple pixel circuits 10 in one column. FIG. 9 is a block circuit diagram of the setting controller 5 connected to multiple pixel circuits 10 in an example manner. As illustrated in the example in FIG. 9, the first setting control signal line SL1, the second setting control signal line SL2, the third setting control signal line SL3, and the fourth setting control signal line SL4 connected to the setting controller 5 may be each connected to the multiple pixel circuits 10. This structure allows, for example, the pixel circuits 10 in one column or the pixel circuits 10 in one row to be set collectively to the normal mode or the failure mode. More specifically, the structure allows, for example, the pixel circuits 10 in one column or the pixel circuits 10 in one row to be changed collectively from the first normal mode or the second normal mode to either the first failure mode or the second failure mode. For example, the light emitters in each column of pixel circuits 10 or each row of pixel circuits 10 are grouped into a group (also referred to as a first emitter group) of first light emitters 12a and third light emitters 22a and a group (also referred to as a second emitter group) of second light emitters 12b and fourth light emitters 22b. The light emitters in one of the groups with a relatively lower ratio of light emitters with an emission failure may be set to the emissive state.

For example, the display panel 100p may include a single setting controller 5 for the multiple pixel circuits 10. In this case, for example, the setting controller 5 may be located in the open area of the image display 300 on the first surface F1 of the substrate 20, in the frame portion, or on the second surface F2 of the substrate 20. This structure allows, for example, the single setting controller 5 to collectively set all the pixel circuits 10 to either the normal mode or the failure mode. More specifically, for example, the setting mode of all the pixel circuits 10 may be changed from the first normal mode or the second normal mode to either the first failure mode or the second failure mode. In this example, the light emitters in all the pixel circuits 10 may be grouped into a group (first emitter group) of first light emitters 12a and third light emitters 22a and a group (second emitter group) of second light emitters 12b and fourth light emitters 22b. The light emitters in one of the groups with a relatively lower ratio of light emitters with an emission failure may be set to the emissive state.

The fourth transistor 13a as the first switch may be, for example, an n-channel thin-film transistor (also referred to as an n-channel transistor). In this case, the setting control signal input into the gate electrode of the fourth transistor 13a is, for example, a H signal as the first signal or a L signal as the second signal. The fifth transistor 13b as the second switch may be, for example, an n-channel transistor. In this case, the setting control signal input into the gate electrode of the fifth transistor 13b is, for example, a H signal as the first signal or a L signal as the second signal. For example, the ninth transistor 23a as the third switch may be an n-channel transistor. In this case, the setting control signal input into the gate electrode of the ninth transistor 23a is, for example, a H signal as the first signal or a L signal as the second signal. For example, the tenth transistor 23b as the fourth switch may be an n-channel transistor. In this case, the setting control signal input into the gate electrode of the tenth transistor 23b is, for example, a H signal as the first signal or a L signal as the second signal.

1-6. Overview of First Embodiment

In the example described above, the pixel circuit 10 has the first connection same state and the first emitter number different mode. More specifically, the pixel circuit 10 includes, for example, the first light emitter 12a and the second light emitter 12b connected in parallel and the third light emitter 22a and the fourth light emitter 22b connected in parallel. In the normal mode, for example, the first setter 13 sets both the first light emitter 12a and the second light emitter 12b to the emissive state by switching both the fourth transistor 13a as the first switch and the fifth transistor 13b as the second switch to the conductive state. In the normal mode, for example, the second setter 23 selectively sets one of the third light emitter 22a or the fourth light emitter 22b to the emissive state by selectively switching one of the ninth transistor 23a as the third switch or the tenth transistor 23b as the fourth switch to the conductive state. This causes, for example, both the first light emitter 12a and the second light emitter 12b connected in parallel in the first subpixel circuit 1 to emit light and selectively causes one of the third light emitter 22a or the fourth light emitter 22b connected in parallel in the second subpixel circuit 2 to emit light.

When, for example, one of the first light emitter 12a or the second light emitter 12b connected in parallel in the first subpixel circuit 1 selectively emits light, a higher forward voltage (first-A forward voltage) Vf1a may be applied to the first light emitter 12a or the second light emitter 12b due to at least the characteristics of the first light emitter 12a and the second light emitter 12b or the use conditions for light emission. In another example, the second transistor 11d may have a high saturation operation voltage. In this case, the above structure may decrease, for example, the forward voltage applied to each of the first light emitter 12a and the second light emitter 12b to be lower than the voltage applied when one of the first light emitter 12a or the second light emitter 12b connected in parallel to have the same light intensity selectively emits light. In this case, for example, a larger portion of the potential difference between the anode potential Vdd and the cathode potential Vss may be used by the drain-source voltage Vds of the second transistor 11d in the first emission controller 11 in the first subpixel circuit 1. Thus, the operating conditions for the second transistor 11d in the saturation region are less likely to be stricter in response to, for example, a decrease in the potential difference (Vdd−Vss) in the first subpixel circuit 1 resulting from a voltage drop at the anode potential Vdd. This reduces gradations (uneven luminance), or a gradual decrease in the luminance of the display device 100, thus improving the image quality of the display device 100.

When, for example, the first light emitter 12a or the second light emitter 12b connected in parallel in the first subpixel circuit 1 selectively emits light, a higher current (first-A current) may flow through the first light emitter 12a or the second light emitter 12b due to at least the characteristics of the first light emitter 12a and the second light emitter 12b or the use conditions for light emission. In this case, the above structure may decrease, for example, the current flowing through each of the first light emitter 12a and the second light emitter 12b in the first subpixel circuit 1 to substantially half the current flowing when one of the first light emitter 12a or the second light emitter 12b connected in parallel to have the same light intensity selectively emits light. In this case, for example, the first subpixel circuit 1 has less deterioration of the first light emitter 12a or the second light emitter 12b over time. The display device 100 can thus have higher image quality. The above structure decreases, for example, the current flowing through the first light emitter 12a and the second light emitter 12b having high internal resistance to substantially half, thus causing less deterioration over time resulting from heat generation and improving the image quality of the display device 100.

When, for example, both the third light emitter 22a and the fourth light emitter 22b connected in parallel in the second subpixel circuit 2 emit light, a smaller current (second-B current) may flow through each of the third light emitter 22a and the fourth light emitter 22b due to at least the characteristics of the third light emitter 22a and the fourth light emitter 22b or the use conditions for light emission. In this case, the above structure may increase, for example, the current flowing through the third light emitter 22a or the fourth light emitter 22b in the second subpixel circuit 2 to be substantially twice the current flowing when both the third light emitter 22a and the fourth light emitter 22b connected in parallel to have the same light intensity emit light. This allows, for example, the second subpixel circuit 2 to easily adjust the luminance gradations finely by increasing the light intensity of the third light emitter 22a or the fourth light emitter 22b, and is less likely to lower the image quality of the display device 100.

In the first embodiment, the normal mode is used to cause both the first light emitter 12a and the second light emitter 12b connected in parallel in the first subpixel circuit 1 to emit light and selectively cause one of the third light emitter 22a or the fourth light emitter 22b connected in parallel to emit light as appropriate for, for example, the component characteristics and the use conditions of the light emitters in the first subpixel circuit 1 and the second subpixel circuit 2. The display device 100 may thus achieve higher performance when, for example, the first subpixel circuit 1 and the second subpixel circuit 2 have at least different component characteristics or different use conditions of the light emitters.

The first subpixel circuit 1 may cause, for example, both the first light emitter 12a and the second light emitter 12b connected in parallel to emit light to improve the usage of the light emitters for light emission in the pixel circuit 10, the display panel 100p, and the display device 100. This reduces, for example, an excess number of light emitters to be arranged wastefully.

2. Other Embodiments

The present disclosure is not limited to the above first embodiment and may be changed or varied in various manners without departing from the spirit and scope of the present disclosure.

2-1. Second Embodiment

Figures 12, 13:
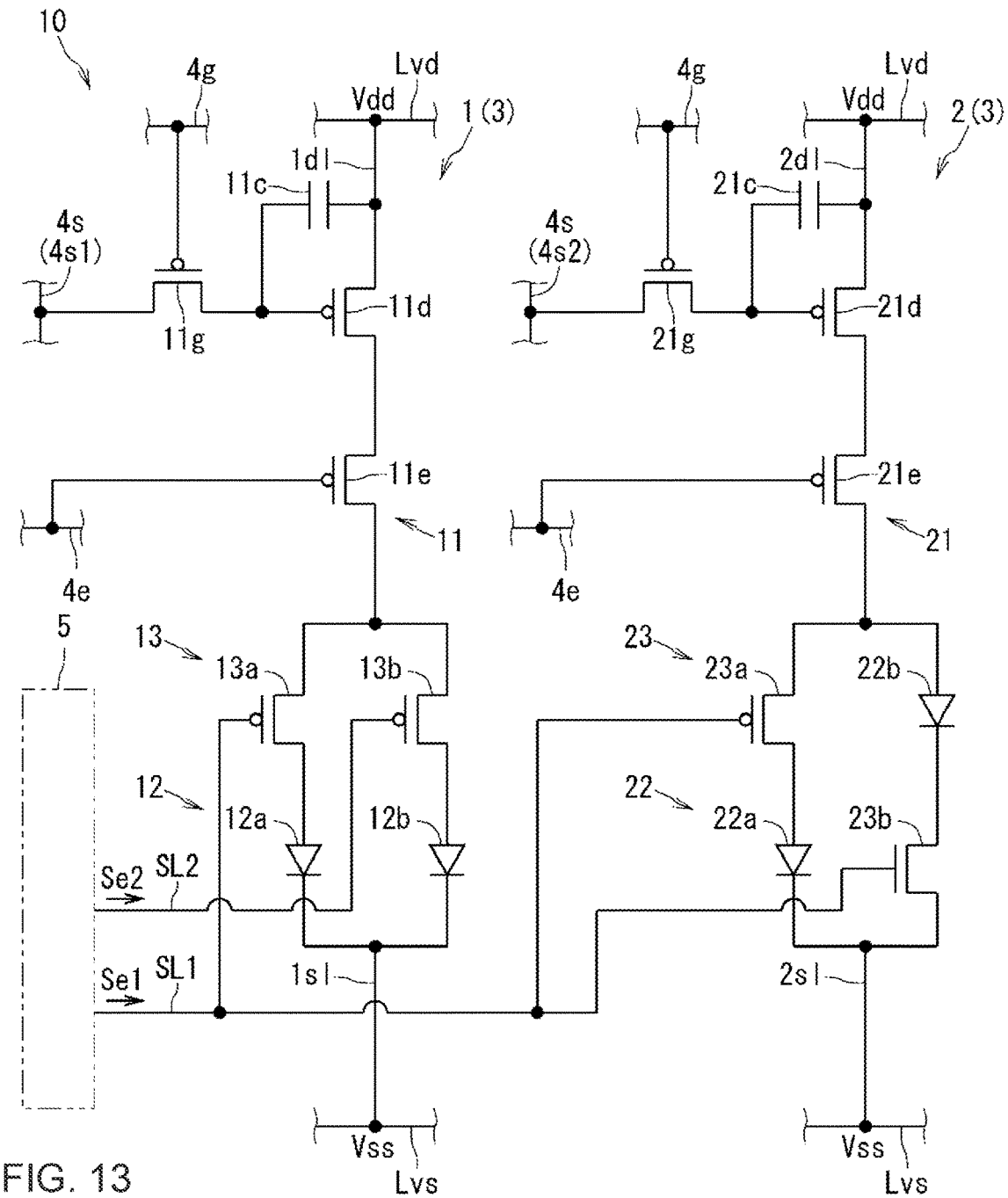
FIG. 12 is a circuit diagram of a pixel circuit in a second example of the second embodiment.
FIG. 13 is a truth table showing an example relationship between a switch signal, a setting control signal, and light emitter(s) set to the emissive state.

In the first embodiment, as illustrated in the examples in FIGS. 10 and 12, the second subpixel circuit 2 may include the ninth transistor 23a as the third switch that is of a first conductivity type and the tenth transistor 23b as the fourth switch that is of a second conductivity type, which is opposite to the first conductivity type. In some embodiments, the ninth transistor 23a as the third switch may be of the second conductivity type, and the tenth transistor 23b as the fourth switch may be of the first conductivity type. The transistor of the first conductivity type includes, for example, electron holes as its major carrier, whereas the transistor of the second conductivity type includes electrons as its major carrier. For example, one of the ninth transistor 23a or the tenth transistor 23b is a p-channel transistor as the transistor of the first conductivity type, and the other may be an n-channel transistor as the transistor of the second conductivity type. In some embodiments, the transistor of the first conductivity type may be an n-channel transistor, and the transistor of the second conductivity type may be a p-channel transistor.

This structure allows, for example, one setting control signal input into the second setter 23 to selectively set one of the third light emitter 22a or the fourth light emitter 22b to the emissive state. This may simplify the wiring structure using, for example, fewer wires for providing the setting control signal to the second setter 23. The display device 100 and the display panel 100p may thus include, for example, multiple pixel circuits 10 arranged with narrower pitches to improve resolution. The display device 100 may thus achieve, for example, higher performance.

First Example of Second Embodiment

FIG. 10 is a circuit diagram of a pixel circuit 10 according to a first example of a second embodiment. The pixel circuit 10 according to the first example of the second embodiment is altered from the pixel circuit 10 according to the first embodiment illustrated in FIG. 4, with the tenth transistor 23b as the fourth switch being replaced with an n-channel transistor and moved to the negative electrode end of the fourth light emitter 22b. In this example, the fourth light emitter 22b includes the positive electrode connected to the drain electrode of the eighth transistor 21e and the negative electrode connected to the second power line Lvs through the tenth transistor 23b and the second cathode potential input line 2s1. More specifically, the tenth transistor 23b includes, for example, the drain electrode connected to the negative electrode of the fourth light emitter 22b and the source electrode connected to the second power line Lvs with the second cathode potential input line 2s1. The gate electrode of each of the ninth transistor 23a and the tenth transistor 23b is connected to, for example, the setting controller 5 with the third setting control signal line SL3. More specifically, the third setting control signal line SL3 connected to the setting controller 5 branches to, for example, the gate electrodes of the ninth transistor 23a and the tenth transistor 23b. The fourth setting control signal line SL4 is, for example, eliminated. This allows, for example, the gate electrode of each of the ninth transistor 23a and the tenth transistor 23b to commonly receive the third setting control signal Se3 from the setting controller 5.

FIG. 11 is a truth table showing an example relationship between the switch signal Si input into the combination circuit 52, the setting control signal output from the combination circuit 52, and the light emitter(s) set to the emissive state. The combination circuit 52 in this example yields various logical outputs to cause the inputs of the first switch signal Si0 and the second switch signal Si1 to be in the relationship with the outputs of the first setting control signal Se1, the second setting control signal Se2, and the third setting control signal Se3 in the manner shown in FIG. 11. As shown in the example in FIG. 11, four logical output patterns (more specifically, patterns 1A to 4A) may be yielded as combinations of the inputs of the first switch signal Si0 and the second switch signal Si1 and the outputs of the first setting control signal Se1, the second setting control signal Se2, and the third setting control signal Se3.

When, for example, pattern 1A is used, in response to a L signal as the first switch signal Si0 and a L signal as the second switch signal Si1, the combination circuit 52 outputs a L signal that is the first signal as the first setting control signal Se1, a L signal that is the first signal as the second setting control signal Se2, and a L signal that is the first signal as the third setting control signal Se3. In this case, the first setter 13 sets, for example, both the first light emitter 12a and the second light emitter 12b to the emissive state by switching both the fourth transistor 13a as the first switch and the fifth transistor 13b as the second switch to the conductive state. The second setter 23 selectively sets, for example, the third light emitter 22a to the emissive state by switching the ninth transistor 23a as the third switch to the conductive state and selectively sets the fourth light emitter 22b to the non-emissive state by switching the tenth transistor 23b as the fourth switch to the nonconductive state. This sets, for example, the first light emitter 12a, the second light emitter 12b, and the third light emitter 22a to the emissive state and the fourth light emitter 22b to the non-emissive state.

When, for example, pattern 2A is used, in response to a L signal as the first switch signal Si0 and a H signal as the second switch signal Si1, the combination circuit 52 outputs a L signal that is the first signal as the first setting control signal Se1, a L signal that is the first signal as the second setting control signal Se2, and a H signal that is the second signal as the third setting control signal Se3. In this case, the first setter 13 sets, for example, both the first light emitter 12a and the second light emitter 12b to the emissive state by switching both the fourth transistor 13a as the first switch and the fifth transistor 13b as the second switch to the conductive state. The second setter 23 selectively sets, for example the third light emitter 22a to the non-emissive state by switching the ninth transistor 23a as the third switch to the nonconductive state and selectively sets the fourth light emitter 22b to the emissive state by switching the tenth transistor 23b as the fourth switch to the conductive state. This sets, for example, the first light emitter 12a, the second light emitter 12b, and the fourth light emitter 22b to the emissive state and the third light emitter 22a to the non-emissive state.

When, for example, pattern 1A or pattern 2A described above is used, the emission status of the first light emitter 12a, the second light emitter 12b, the third light emitter 22a, and the fourth light emitter 22b enters the normal mode in the same or similar manner as in the first embodiment. More specifically, the pixel circuit 10 operates in, for example, the normal mode in which the first light emitter 12a and the second light emitter 12b connected in parallel are both set to the emissive state and one of the third light emitter 22a or the fourth light emitter 22b connected in parallel is selectively set to the emissive state. When, for example, pattern 1A described above is used, the pixel circuit 10 operates in the first normal mode described above. When pattern 2A described above is used, the pixel circuit 10 operates in the second normal mode described above. In this case, the display device 100 may achieve higher performance in the same or similar manner as in the first embodiment when, for example, the first subpixel circuit 1 and the second subpixel circuit 2 have at least different component characteristics or different use conditions of the light emitters.

When, for example, pattern 3A is used, in response to a H signal as the first switch signal Si0 and a L signal as the second switch signal Si1, the combination circuit 52 outputs a L signal that is the first signal as the first setting control signal Se1, a H signal that is the second signal as the second setting control signal Se2, and a L signal that is the first signal as the third setting control signal Se3. This sets, for example, the first light emitter 12a and the third light emitter 22a to the emissive state and the second light emitter 12b and the fourth light emitter 22b to the non-emissive state. When, for example, pattern 4A is used, in response to a H signal as the first switch signal Si0 and a H signal as the second switch signal Si1, the combination circuit 52 outputs a H signal that is the second signal as the first setting control signal Se1, a L signal that is the first signal as the second setting control signal Se2, and a H signal that is the second signal as the third setting control signal Se3. This sets, for example, the second light emitter 12b and the fourth light emitter 22b to the emissive state and the first light emitter 12a and the third light emitter 22a to the non-emissive state.

When, for example, pattern 3A or pattern 4A is used, the emission status of the first light emitter 12a, the second light emitter 12b, the third light emitter 22a, and the fourth light emitter 22b enters the failure mode for responding to an emission failure in the pixel circuit 10. In this case, the first setter 13 selectively sets, for example, one of the first light emitter 12a or the second light emitter 12b to the non-emissive state by switching one of the fourth transistor 13a as the first switch or the fifth transistor 13b as the second switch to the nonconductive state. This may selectively cause, for example, one of the first light emitter 12a or the second light emitter 12b with no emission failure to emit light in the first subpixel circuit 1.

Second Example of Second Embodiment

In this example, the setting control signal input from the setting controller 5 to the first setter 13 may be partially common to the setting control signal input from the setting controller 5 to the second setter 23.

FIG. 12 is a circuit diagram of a pixel circuit 10 according to a second example of the second embodiment. In the second example of the second embodiment, the pixel circuit 10 includes a first emission controller 11, a first light emitter unit 12, a first setter 13, a second emission controller 21, a second light emitter unit 22, and a second setter 23 having the same or similar structure as those in the pixel circuit 10 according to the first example of the second embodiment illustrated in FIG. 10. The gate electrode of each of the fourth transistor 13a, the ninth transistor 23a, and the tenth transistor 23b is connected to, for example, the setting controller 5 with the first setting control signal line SL1. More specifically, the first setting control signal line SL1 connected to the setting controller 5 branches at, for example, two points to the gate electrodes of the fourth transistor 13a, the ninth transistor 23a, and the tenth transistor 23b. The third setting control signal line SL3 is, for example, eliminated. This allows, for example, the gate electrodes of the fourth transistor 13a, the ninth transistor 23a, and the tenth transistor 23b to commonly receive the first setting control signal Se1 from the setting controller 5.

FIG. 13 is a truth table showing an example relationship between the switch signal Si input into the combination circuit 52, the setting control signal output from the combination circuit 52, and the light emitter(s) set to the emissive state. The combination circuit 52 in this example yields various logical outputs to cause the inputs of the first switch signal Si0 and the second switch signal Si1 to be in the relationship with the outputs of the first setting control signal Se1 and the second setting control signal Se2 in the manner shown in FIG. 13. As shown in the example in FIG. 13, three logical output patterns (more specifically, patterns 1B to 3B) may be yielded as combinations of the inputs of the first switch signal Si0 and the second switch signal Si1 and the outputs of the first setting control signal Se1 and the second setting control signal Se2.

When, for example, pattern 1B is used, in response to a L signal as the first switch signal Si0 and a L signal as the second switch signal Si1, the combination circuit 52 outputs a L signal that is the first signal as the first setting control signal Se1 and a L signal that is the first signal as the second setting control signal Se2. In this case, the first setter 13 sets, for example, both the first light emitter 12a and the second light emitter 12b to the emissive state by switching both the fourth transistor 13a as the first switch and the fifth transistor 13b as the second switch to the conductive state. The second setter 23 selectively sets, for example, the third light emitter 22a to the emissive state by switching the ninth transistor 23a as the third switch to the conductive state and selectively sets the fourth light emitter 22b to the non-emissive state by switching the tenth transistor 23b as the fourth switch to the nonconductive state. This sets, for example, the first light emitter 12a, the second light emitter 12b, and the third light emitter 22a to the emissive state and the fourth light emitter 22b to the non-emissive state.

When, for example, pattern 1B described above is used, the emission status of the first light emitter 12a, the second light emitter 12b, the third light emitter 22a, and the fourth light emitter 22b enters the normal mode in the same or similar manner as in the first embodiment. More specifically, the pixel circuit 10 operates in, for example, the normal mode in which the first light emitter 12a and the second light emitter 12b connected in parallel are both set to the emissive state and one of the third light emitter 22a or the fourth light emitter 22b connected in parallel is selectively set to the emissive state. When, for example, pattern 1B described above is used, the pixel circuit 10 operates in the first normal mode described above. In this case, the display device 100 may achieve higher performance in the same or similar manner as in the first embodiment when, for example, the first subpixel circuit 1 and the second subpixel circuit 2 have at least different component characteristics or different use conditions of the light emitters.

When, for example, pattern 2B is used, in response to a L signal as the first switch signal Si0 and a H signal as the second switch signal Si1, the combination circuit 52 outputs a L signal that is the first signal as the first setting control signal Se1 and a H signal that is the second signal as the second setting control signal Se2. This sets, for example, the first light emitter 12a and the third light emitter 22a to the emissive state and the second light emitter 12b and the fourth light emitter 22b to the non-emissive state. When, for example, pattern 3B is used, in response to a H signal as the first switch signal Si0 and a L signal as the second switch signal Si1, the combination circuit 52 outputs a H signal that is the second signal as the first setting control signal Se1 and a L signal that is the first signal as the second setting control signal Se2. This sets, for example, the second light emitter 12b and the fourth light emitter 22b to the emissive state and the first light emitter 12a and the third light emitter 22a to the non-emissive state.

When, for example, pattern 2B or pattern 3B is used, the emission status of the first light emitter 12a, the second light emitter 12b, the third light emitter 22a, and the fourth light emitter 22b enters the failure mode for responding to an emission failure in the pixel circuit 10. In this case, the first setter 13 selectively sets, for example, one of the first light emitter 12a or the second light emitter 12b to the non-emissive state by switching one of the fourth transistor 13a as the first switch or the fifth transistor 13b as the second switch to the nonconductive state. This may selectively cause, for example, one of the first light emitter 12a or the second light emitter 12b with no emission failure to emit light in the first subpixel circuit 1.

The gate electrode of each of the fifth transistor 13b, the ninth transistor 23a, and the tenth transistor 23b may be connected to, for example, the setting controller 5 with the second setting control signal line SL2. More specifically, the second setting control signal line SL2 connected to the setting controller 5 may branch at, for example, two points to the gate electrodes of the fifth transistor 13b, the ninth transistor 23a, and the tenth transistor 23b. This allows, for example, the gate electrodes of the fifth transistor 13b, the ninth transistor 23a, and the tenth transistor 23b to commonly receive the second setting control signal Se2 from the setting controller 5. In this case, the first setting control signal line SL1 connected to the setting controller 5 may be connected to, for example, the gate electrode of the fourth transistor 13a.

2-2. Third Embodiment

In the first embodiment, the pixel circuit 10 may have, for example, a second connection same state and a second emitter number different mode as the normal mode. In the second connection same state, for example, the connection between the first light emitter 12a and the second light emitter 12b and the connection between the third light emitter 22a and the fourth light emitter 22b are the same series connection. In the second emitter number different mode, for example, one of the first light emitter 12a or the second light emitter 12b connected in series is selectively set to the emissive state, and both the third light emitter 22a and the fourth light emitter 22b connected in series are set to the emissive state.

Structure of Pixel Circuit

FIG. 14 is a circuit diagram of an example pixel circuit 10 according to a third embodiment. The pixel circuit 10 according to the third embodiment is altered from the pixel circuit 10 according to the first embodiment illustrated in FIG. 4, with the structures of the first light emitter unit 12 and the first setter 13 in the first subpixel circuit 1 and the second light emitter unit 22 and the second setter 23 in the second subpixel circuit 2 being changed.

The first light emitter unit 12 in the first subpixel circuit 1 includes, for example, the first light emitter 12a and the second light emitter 12b connected in series. For example, the first light emitter 12a and the second light emitter 12b are connected in series between the drain electrode of the third transistor 11e and the first cathode potential input line 1s1. For example, the first light emitter 12a and the second light emitter 12b may be connected in series in this order or in the opposite order in the direction from the drain electrode of the third transistor 11e to the first cathode potential input line 1s1. In the example in FIG. 14, the first light emitter 12a includes the positive electrode connected to the drain electrode of the third transistor 11e and the negative electrode connected to the positive electrode of the second light emitter 12b. The negative electrode of the second light emitter 12b is connected to the first cathode potential input line 1s1.

The first setter 13 in the first subpixel circuit 1 includes, for example, the fourth transistor 13a as the first switch connected in parallel to the first light emitter 12a and the fifth transistor 13b as the second switch connected in parallel to the second light emitter 12b. Each of the fourth transistor 13a and fifth transistor 13b is, for example, an n-channel transistor. In this case, the fourth transistor 13a includes, for example, the drain electrode connected to the positive electrode of the first light emitter 12a and the source electrode connected to the negative electrode of the first light emitter 12a. The fifth transistor 13b includes, for example, the drain electrode connected to the positive electrode of the second light emitter 12b and the source electrode connected to the negative electrode of the second light emitter 12b. The gate electrode of the fourth transistor 13a is connected to, for example, the setting controller 5 with the first setting control signal line SL1. The gate electrode of the fifth transistor 13b is connected to, for example, the setting controller 5 with the second setting control signal line SL2.

In response to, for example, a L signal as the first signal input into the gate electrode, the fourth transistor 13a enters the nonconductive state to allow no current to flow through the source electrode and the drain electrode. This allows, for example, a drive current to flow through the first light emitter 12a, which is then set to the emissive state. In response to, for example, a H signal as the second signal input into the gate electrode, the fourth transistor 13a enters the conductive state to allow a current to flow through the source electrode and the drain electrode. This causes, for example, the current flowing through the first subpixel circuit 1 based on the potential difference between the anode potential Vdd from the first power line Lvd and the cathode potential Vss from the second power line Lvs to flow through the fourth transistor 13a without through the first light emitter 12a. This may set, for example, the first light emitter 12a to the non-emissive state. In this example, the first signal is an off-signal that disables conduction between the gate electrode and the source electrode of the transistor. The second signal is an on-signal that enables conduction between the gate electrode and the drain electrode of the transistor. In other words, the first signal sets the light emitter to the emissive state, and the second signal sets the light emitter to the non-emissive state.

In response to, for example, a L signal as the first signal input into the gate electrode, the fifth transistor 13b enters the nonconductive state to allow no current to flow through the source electrode and the drain electrode. This allows, for example, a drive current to flow through the second light emitter 12b, which is then set to the emissive state. In response to, for example, a H signal as the second signal input into the gate electrode, the fifth transistor 13b enters the conductive state to allow a current to flow through the source electrode and the drain electrode. This causes, for example, the current flowing through the first subpixel circuit 1 based on the potential difference between the anode potential Vdd from the first power line Lvd and the cathode potential Vss from the second power line Lvs to flow through the fifth transistor 13b without through the second light emitter 12b. This may set, for example, the second light emitter 12b to the non-emissive state.

The first setter 13 can selectively set, for example, one of the first light emitter 12a or the second light emitter 12b to the emissive state by selectively switching one of the fourth transistor 13a as the first switch or the fifth transistor 13b as the second switch to the nonconductive state to allow no current to flow through the source electrode and the drain electrode.

The second light emitter unit 22 in the second subpixel circuit 2 includes, for example, the third light emitter 22a and the fourth light emitter 22b connected in series. For example, the third light emitter 22a and the fourth light emitter 22b are connected in series between the drain electrode of the eighth transistor 21e and the second cathode potential input line 2s1. For example, the third light emitter 22a and the fourth light emitter 22b may be connected in series in this order or in the opposite order in the direction from the drain electrode of the eighth transistor 21e to the second cathode potential input line 2s1. In the example in FIG. 14, the third light emitter 22a includes the positive electrode connected to the drain electrode of the eighth transistor 21e and the negative electrode connected to the positive electrode of the fourth light emitter 22b. The negative electrode of the fourth light emitter 22b is connected to the second cathode potential input line 2s1.

The second setter 23 in the second subpixel circuit 2 includes, for example, the ninth transistor 23a as the third switch connected in parallel to the third light emitter 22a and the tenth transistor 23b as the fourth switch connected in parallel to the fourth light emitter 22b. Each of the ninth transistor 23a and the tenth transistor 23b is, for example, an n-channel transistor. In this case, the ninth transistor 23a includes, for example, the drain electrode connected to the positive electrode of the third light emitter 22a and the source electrode connected to the negative electrode of the third light emitter 22a. The tenth transistor 23b includes, for example, the drain electrode connected to the positive electrode of the fourth light emitter 22b and the source electrode connected to the negative electrode of the fourth light emitter 22b. The gate electrode of the ninth transistor 23a is connected to, for example, the setting controller 5 with the third setting control signal line SL3. The gate electrode of the tenth transistor 23b is connected to, for example, the setting controller 5 with the fourth setting control signal line SL4.

In response to, for example, a L signal as the first signal input into the gate electrode, the ninth transistor 23a enters the nonconductive state to allow no current to flow through the source electrode and the drain electrode. This allows, for example, a drive current to flow through the third light emitter 22a, which is then set to the emissive state. In response to, for example, a H signal as the second signal input into the gate electrode, the ninth transistor 23a enters the conductive state to allow a current to flow through the source electrode and the drain electrode. This causes, for example, the current flowing through the second subpixel circuit 2 based on the potential difference between the anode potential Vdd from the first power line Lvd and the cathode potential Vss from the second power line Lvs to flow through the ninth transistor 23a without through the third light emitter 22a. This may set, for example, the third light emitter 22a to the non-emissive state.

In response to, for example, a L signal as the first signal input into the gate electrode, the tenth transistor 23b enters the nonconductive state to allow no current to flow through the source electrode and the drain electrode. This allows, for example, a drive current to flow through the fourth light emitter 22b, which is then set to the emissive state. In response to, for example, a H signal as the second signal input into the gate electrode, the tenth transistor 23b enters the conductive state to allow a current to flow through the source electrode and the drain electrode. This causes, for example, the current flowing through the second subpixel circuit 2 based on the potential difference between the anode potential Vdd from the first power line Lvd and the cathode potential Vss from the second power line Lvs to flow through the tenth transistor 23b without through the fourth light emitter 22b. This may set, for example, the fourth light emitter 22b to the non-emissive state.

The second setter 23 can set, for example, both the third light emitter 22a and the fourth light emitter 22b to the emissive state by switching both the ninth transistor 23a as the third switch and the tenth transistor 23b as the fourth switch to the nonconductive state to allow no current to flow through the respective source electrodes and drain electrodes.

Improving Characteristics of Display Device

The first light emitter 12a and the second light emitter 12b are connected in, for example, series. The third light emitter 22a and the fourth light emitter 22b are connected in, for example, series. In other words, the pixel circuit 10 has, for example, the state (second connection same state) in which the connection between the first light emitter 12a and the second light emitter 12b and the connection between the third light emitter 22a and the fourth light emitter 22b are the same series connection.

The pixel circuit 10 can set, for example, one of the first light emitter 12a or the second light emitter 12b to the emissive state with the first setter 13 and can set both the third light emitter 22a and the fourth light emitter 22b to the emissive state with the second setter 23. In other words, the pixel circuit 10 selectively sets, for example, the emission status of the first light emitter 12a and the second light emitter 12b with the first setter 13 to the second emission setting (either emissive setting) in which one of the light emitters is selectively in the emissive state. The pixel circuit 10 can also set, for example, the emission status of the third light emitter 22a and the fourth light emitter 22b with the second setter 23 to the first emission setting (both emissive setting) in which both light emitters are in the emissive state.

Thus, the pixel circuit 10 has, for example, the emitter number different mode in which the emission status of the first light emitter 12a and the second light emitter 12b set by the first setter 13 is in one of the second emission setting to selectively cause one of the light emitters to be in the emissive state or the first emission setting to cause both light emitters to be in the emissive state and the emission status of the third light emitter 22a and the fourth light emitter 22b set by the second setter 23 is in the other of the second emission setting or the first emission setting. In the third embodiment, the pixel circuit 10 thus has, for example, the second connection same state and the emitter number different mode.

In this example, the normal mode in the pixel circuit 10 is a setting mode (second emitter number different mode) in which one of the first light emitter 12a or the second light emitter 12b connected in series is selectively in the emissive state and both the third light emitter 22a and the fourth light emitter 22b connected in series are in the emissive state. In other words, the pixel circuit 10 has, for example, the second connection same state and the second emitter number different mode as the normal mode.

When, for example, one of the third light emitter 22a or the fourth light emitter 22b connected in parallel or in series in the second subpixel circuit 2 selectively emits light, a lower forward voltage (also referred to as a second-C forward voltage) Vf2c may be applied to the third light emitter 22a and the fourth light emitter 22b due to at least the characteristics of the third light emitter 22a and the fourth light emitter 22b or the use conditions for light emission. For example, the second-C forward voltage Vf2c may decrease in the second subpixel circuit 2 when the third light emitter 22a and the fourth light emitter 22b have a low value in at least one of the internal resistance, the lower setting limit of the drive current, the lower setting limit of the forward voltage, or the lower setting limit of the luminance or have high light emission efficiency. In this example, the second-C forward voltage Vf2c may be lower than a forward voltage (also referred to as a first-C forward voltage) Vf1c applied to one of the first light emitter 12a and the second light emitter 12b when one of the first light emitter 12a or the second light emitter 12b connected in parallel or in series emits light. In this case, the seventh transistor 21d has a higher voltage (drain-source voltage) Vds across the drain electrode and the source electrode to consume more electric power, decreasing the energy efficiency of the second subpixel circuit 2. This may increase, for example, power consumption in the display device.

In the third embodiment, the normal mode described above sets, for example, both the third light emitter 22a and the fourth light emitter 22b connected in series in the second subpixel circuit 2 to the emissive state and causes both the third light emitter 22a and the fourth light emitter 22b to emit light. This may decrease the current flowing through each of the third light emitter 22a and the fourth light emitter 22b to substantially half the current flowing when, for example, one of the third light emitter 22a or the fourth light emitter 22b connected in series to have the same light intensity selectively emits light. With, for example, a substantially constant potential difference between the anode potential Vdd and the cathode potential Vss, the second subpixel circuit 2 may consume less power and achieve higher energy efficiency. This may reduce, for example, power consumption in the display device 100.

When, for example, both the first light emitter 12a and the second light emitter 12b connected in series in the first subpixel circuit 1 emit light, a higher forward voltage (also referred to as a first-D forward voltage) Vf1d may be applied to the first light emitter 12a and the second light emitter 12b due to at least the characteristics of the first light emitter 12a and the second light emitter 12b or the use conditions for light emission. For example, the first-D forward voltage applied to the first light emitter 12a and the second light emitter 12b in the first subpixel circuit 1 may increase both when the first light emitter 12a and the second light emitter 12b have a high value of at least the upper setting limit of the drive current, the upper setting limit of the forward voltage, or the upper setting limit of the luminance, and when the first light emitter 12a and the second light emitter 12b have low emission efficiency. In this example, the first-D forward voltage may be higher than the forward voltage (also referred to as a second-D forward voltage) applied to the third light emitter 22a and the fourth light emitter 22b when both the third light emitter 22a and the fourth light emitter 22b emit light. In this case, the second transistor 11d has, for example, a lower voltage (drain-source voltage) Vds between the drain electrode and the source electrode. The operating conditions for the second transistor 11d in the saturation region is thus stricter in response to a decrease in the potential difference (Vdd–Vss) resulting from a voltage drop at the anode potential Vdd. In the first subpixel circuit 1, the operating conditions for the second transistor 11d in the saturation region may also be stricter in response to a decrease in the potential difference between the anode potential Vdd and the cathode potential Vss when, for example, the second transistor 11d has a high saturation operation voltage.

In the third embodiment, the normal mode described above sets, for example, one of the first light emitter 12a or the second light emitter 12b connected in series in the first subpixel circuit 1 to the emissive state. In other words, the normal mode described above sets, for example, the other of the first light emitter 12a or the second light emitter 12b connected in series in the first subpixel circuit 1 to the non-emissive state. Thus, for example, one of the first light emitter 12a or the second light emitter 12b emits light. This decreases, for example, the threshold voltage for causing the first light emitter 12a and the second light emitter 12b to emit light to be substantially half the voltage used when both the first light emitter 12a and the second light emitter 12b connected in series to have the same light intensity emit light and may decrease the forward voltage applied to the first light emitter 12a and the second light emitter 12b. In this case, for example, a larger portion of the potential difference between the anode potential Vdd and the cathode potential Vss may be used by the drain-source voltage Vds of the second transistor 11d in the first emission controller 11. Thus, the operating conditions for the second transistor 11d in the saturation region are less likely to be stricter in response to, for example, a decrease in the potential difference (Vdd−Vss) resulting from a voltage drop at the anode potential Vdd. This reduces gradations (uneven luminance), or a gradual decrease in the luminance of the display device 100, thus improving the image quality of the display device 100.

In the third embodiment, when the first subpixel circuit 1 and the second subpixel circuit 2 have, for example, at least different component characteristics or different use conditions of the light emitters as described above, the second connection same state and the second emitter number different mode as the normal mode are used as appropriate for at least the component characteristics or the use conditions of the light emitters. This may improve, for example, the performance of the display device 100.

Input and Output of Combination Circuit and Light Emitter(s) set to Emissive State FIG. 15 is a truth table showing an example relationship between the switch signal Si input into the combination circuit 52, the setting control signal output from the combination circuit 52, and the light emitter(s) set to the emissive state. The combination circuit 52 yields various logical outputs to cause, for example, the inputs of the first switch signal Si0 and the second switch signal Si1 to be in the relationship with the outputs of the first setting control signal Se1, the second setting control signal Se2, the third setting control signal Se3, and the fourth setting control signal Se4 in the manner shown in FIG. 15. As shown in the example in FIG. 15, four logical output patterns (more specifically, patterns 1C to 4C) may be yielded as combinations of the inputs of the first switch signal Si0 and the second switch signal Si1 and the outputs of the first setting control signal Se1, the second setting control signal Se2, the third setting control signal Se3, and the fourth setting control signal Se4.

When, for example, pattern 1C is used, in response to a L signal as the first switch signal Si0 and a L signal as the second switch signal Si1, the combination circuit 52 outputs a L signal that is the first signal as the first setting control signal Se1, a H signal that is the second signal as the second setting control signal Se2, a L signal that is the first signal as the third setting control signal Se3, and a L signal that is the first signal as the fourth setting control signal Se4. In this case, the second setter 23 sets, for example, both the third light emitter 22a and the fourth light emitter 22b to the emissive state by switching both the ninth transistor 23a as the third switch and the tenth transistor 23b as the fourth switch to the nonconducting state. The first setter 13 selectively sets, for example, the first light emitter 12a to the emissive state by switching the fourth transistor 13a as the first switch to the nonconductive state and selectively sets the second light emitter 12b to the non-emissive state by switching the fifth transistor 13b as the second switch to the conductive state. This sets, for example, the first light emitter 12a, the third light emitter 22a, and the fourth light emitter 22b to the emissive state and the second light emitter 12b to the non-emissive state.

When, for example, pattern 2C is used, in response to a L signal as the first switch signal Si0 and a H signal as the second switch signal Si1, the combination circuit 52 outputs a H signal that is the second signal as the first setting control signal Se1, a L signal that is the first signal as the second setting control signal Se2, a L signal that is the first signal as the third setting control signal Se3, and a L signal that is the first signal as the fourth setting control signal Se4. In this case, the second setter 23 sets, for example, both the third light emitter 22a and the fourth light emitter 22b to the emissive state by switching both the ninth transistor 23a as the third switch and the tenth transistor 23b as the fourth switch to the nonconducting state. The first setter 13 selectively sets, for example, the first light emitter 12a to the non-emissive state by switching the fourth transistor 13a as the first switch to the conductive state and selectively sets the second light emitter 12b to the emissive state by switching the fifth transistor 13b as the second switch to the nonconductive state. This sets, for example, the second light emitter 12b, the third light emitter 22a, and the fourth light emitter 22b to the emissive state and the first light emitter 12a to the non-emissive state.

When, for example, pattern 3C is used, in response to a H signal as the first switch signal Si0 and a L signal as the second switch signal Si1, the combination circuit 52 outputs a L signal that is the first signal as the first setting control signal Se1, a H signal that is second signal as the second setting control signal Se2, a L signal that is the first signal as the third setting control signal Se3, and a H signal that is the second signal as the fourth setting control signal Se4. This sets, for example, the first light emitter 12a and the third light emitter 22a to the emissive state and the second light emitter 12b and the fourth light emitter 22b to the non-emissive state.

When, for example, pattern 4C is used, in response to a H signal as the first switch signal Si0 and a H signal as the second switch signal Si1, the combination circuit 52 outputs a H signal that is the second signal as the first setting control signal Se1, a L signal that is the first signal as the second setting control signal Se2, a H signal that is the second signal as the third setting control signal Se3, and a L signal that is the first signal as the fourth setting control signal Se4. This sets, for example, the second light emitter 12b and the fourth light emitter 22b to the emissive state and the first light emitter 12a and the third light emitter 22a to the non-emissive state.

Setting Normal Mode

In the third embodiment, the use of, for example, pattern 1C or pattern 2C described above causes the emission status of the first light emitter 12a, the second light emitter 12b, the third light emitter 22a, and the fourth light emitter 22b to enter the normal mode. More specifically, the normal mode used in the pixel circuit 10 causes, for example, both the third light emitter 22a and the fourth light emitter 22b connected in series to be in the emissive state and selectively causes one of the first light emitter 12a or the second light emitter 12b connected in series to be in the emissive state.

In this case, the second setter 23 sets, for example, both the third light emitter 22a and the fourth light emitter 22b to the emissive state by switching both the ninth transistor 23a as the third switch and the tenth transistor 23b as the fourth switch to the nonconducting state. The first setter 13 selectively sets, for example, one of the first light emitter 12a or the second light emitter 12b to the emissive state by selectively switching one of the fourth transistor 13a as the first switch or the fifth transistor 13b as the second switch to the conductive state. The display device 100 may thus achieve higher performance when, for example, the first subpixel circuit 1 and the second subpixel circuit 2 have at least different component characteristics or different use conditions of the light emitters as described above.

For any emission failure with the second light emitter 12b resulting from, for example, a connection failure or a defective component, pattern 1C may be used to cause the emission status of the first light emitter 12a, the second light emitter 12b, the third light emitter 22a, and the fourth light emitter 22b to enter the normal mode. For any emission failure with the first light emitter 12a resulting from, for example, a connection failure or a defective component, pattern 2C may be used to cause the emission status of the first light emitter 12a, the second light emitter 12b, the third light emitter 22a, and the fourth light emitter 22b to enter the normal mode.

An emission failure with the first light emitter 12a and the second light emitter 12b in each pixel circuit 10 may be detected in, for example, the pre-shipment inspection or the maintenance of the display device 100. Pattern 1C or pattern 2C may then be used as the pattern corresponding to the normal mode as appropriate for, for example, the emission failure with the first light emitter 12a or the second light emitter 12b. For example, the setting mode with the use of pattern 1C to set the first light emitter 12a, the third light emitter 22a, and the fourth light emitter 22b to the emissive state and set the second light emitter 12b to be non-emissive state may be referred to as a third normal mode. For example, the setting mode with the use of pattern 2C to set the second light emitter 12b, the third light emitter 22a, and the fourth light emitter 22b to the emissive state and set the first light emitter 12a to be non-emissive may be referred to as a fourth normal mode.

Setting Failure Mode

In the third embodiment, the use of pattern 3C or pattern 4C causes, for example, the emission status of the first light emitter 12a, the second light emitter 12b, the third light emitter 22a, and the fourth light emitter 22b to enter the mode (failure mode) for responding to an emission failure in the pixel circuit 10. In this case, the second setter 23 selectively sets, for example, one of the third light emitter 22a or the fourth light emitter 22b to the non-emissive state by selectively switching one of the ninth transistor 23a as the third switch or the tenth transistor 23b as the fourth switch to the conductive state. This may selectively cause, for example, one of the third light emitter 22a or the fourth light emitter 22b with no emission failure in the second subpixel circuit 2 to emit light.

For any emission failure with the fourth light emitter 22b resulting from, for example, a connection failure or a defective component, pattern 3C corresponding to the failure mode may be used instead of pattern 1C or pattern 2C corresponding to the normal mode. In this case, for example, the second setter 23 sets, for example, the fourth light emitter 22b to the non-emissive state selectively from the third light emitter 22a and the fourth light emitter 22b by switching the tenth transistor 23b as the fourth switch to the conductive state selectively from the ninth transistor 23a as the third switch and the tenth transistor 23b. This may allow, for example, the third light emitter 22a with no emission failure to emit light in the second subpixel circuit 2 selectively from the third light emitter 22a and the fourth light emitter 22b. In this manner, the setting mode (first failure mode) used in the above example sets, for example, each of the first light emitter 12a and the third light emitter 22a to the emissive state and each of the second light emitter 12b and the fourth light emitter 22b to the non-emissive state.

For any emission failure with the third light emitter 22a resulting from, for example, a connection failure or a defective component, pattern 4C corresponding to the failure mode may be used instead of pattern 1C or pattern 2C corresponding to the normal mode. In this case, the second setter 23 selectively sets, for example, the third light emitter 22a to the non-emissive state selectively from the third light emitter 22a and the fourth light emitter 22b by switching the ninth transistor 23a as the third switch to the conductive state selectively from the ninth transistor 23a and the tenth transistor 23b as the fourth switch. This may allow, for example, the fourth light emitter 22b with no emission failure to emit light selectively from the third light emitter 22a and the fourth light emitter 22b in the second subpixel circuit 2. In this manner, the setting mode (second failure mode) sets, for example, each of the second light emitter 12b and the fourth light emitter 22b to the emissive state and each of the first light emitter 12a and the third light emitter 22a to the non-emissive state.

Variation of Third Embodiment

The fourth transistor 13a as the first switch may be, for example, a p-channel transistor. In this case, the setting control signal input into the gate electrode of the fourth transistor 13a may include, for example, a H signal as the first signal and a L signal as the second signal. The fifth transistor 13b as the second switch may be, for example, a p-channel transistor. In this case, the setting control signal input into the gate electrode of the fifth transistor 13b may include, for example, a H signal as the first signal and a L signal as the second signal. The ninth transistor 23a as the third switch may be, for example, a p-channel transistor. In this case, the setting control signal input into the gate electrode of the ninth transistor 23a may include, for example, a H signal as the first signal and a L signal as the second signal. The tenth transistor 23b as the fourth switch may be a p-channel transistor. In this case, the setting control signal input into the gate electrode of the tenth transistor 23b may include, for example, a H signal as the first signal and a L signal as the second signal.

2-3. Fourth Embodiment

Figures 18, 19:
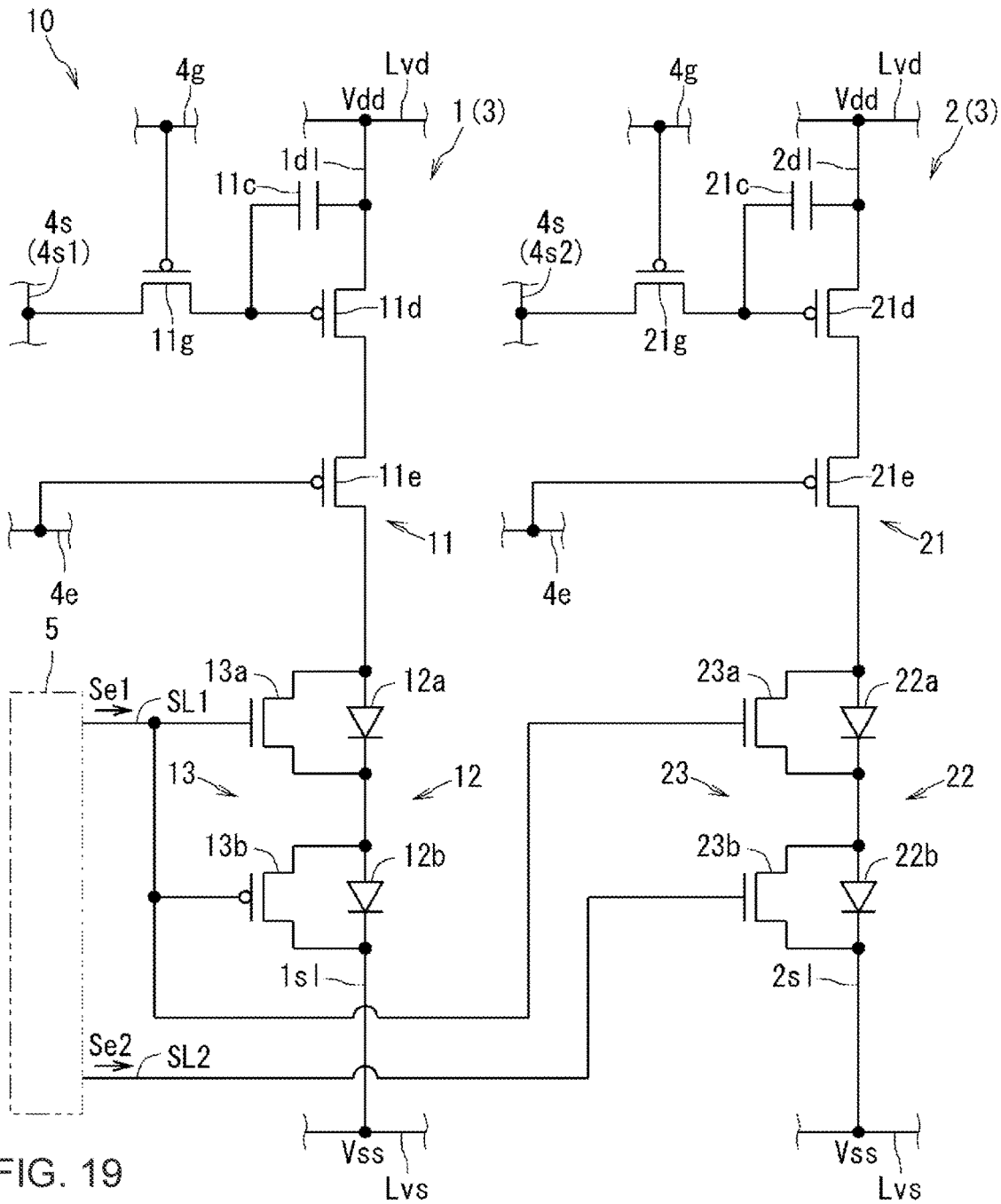
FIG. 18 is a circuit diagram of a pixel circuit in a second example of the fourth embodiment.
FIG. 19 is a truth table showing an example relationship between a switch signal, a setting control signal, and light emitter(s) set to the emissive state.

In the third embodiment, as illustrated in the examples in FIGS. 16 and 18, the first subpixel circuit 1 may include the fourth transistor 13a as the first switch that is a transistor of the first conductivity type (e.g., an n-channel transistor) and the fifth transistor 13b as the second switch that is a transistor of the second conductivity type (e.g., a p-channel transistor). In some embodiments, the fourth transistor 13a as the first switch may be a transistor of the second conductivity type, and the fifth transistor 13b as the second switch may be a transistor of the first conductivity type. This structure may allow one setting control signal input into the first setter 13 to selectively set one of the first light emitter 12a or the second light emitter 12b to the emissive state. This may simplify the wiring structure using, for example, fewer wires for providing the setting control signal to the first setter 13. The display device 100 and the display panel 100p may thus include, for example, multiple pixel circuits 10 arranged with narrower pitches to improve resolution. The display device 100 may thus achieve, for example, higher performance.

First Example of Fourth Embodiment

FIG. 16 is a circuit diagram of a pixel circuit 10 according to a first example of a fourth embodiment. The pixel circuit 10 according to the first example of the fourth embodiment is altered from the pixel circuit 10 according to the third embodiment illustrated in FIG. 14, with the fifth transistor 13b as the second switch being replaced with a p-channel transistor. In this example, the gate electrodes of the fourth transistor 13a and the fifth transistor 13b are connected to the setting controller 5 with the first setting control signal line SL1. More specifically, the first setting control signal line SL1 connected to the setting controller 5 branches to, for example, the gate electrode of the fourth transistor 13a and the gate electrode of the fifth transistor 13b. The gate electrode of the ninth transistor 23a is connected to, for example, the setting controller 5 with the second setting control signal line SL2. The gate electrode of the tenth transistor 23b is connected to, for example, the setting controller 5 with the third setting control signal line SL3. The fourth setting control signal line SL4 is, for example, eliminated. This allows, for example, the gate electrodes of the fourth transistor 13a and the fifth transistor 13b to commonly receive the first setting control signal Se1 from the setting controller 5.

FIG. 17 is a table showing an example relationship between the switch signal Si input into the combination circuit 52, the setting control signal output from the combination circuit 52, and the light emitter(s) set to the emissive state. The combination circuit 52 in this example yields various logical outputs to cause the inputs of the first switch signal Si0 and the second switch signal Si1 to be in the relationship with the outputs of the first setting control signal Se1, the second setting control signal Se2, and the third setting control signal Se3 in the manner shown in FIG. 17. As shown in the example in FIG. 17, four logical output patterns (more specifically, patterns 1D to 4D) may be yielded as combinations of the inputs of the first switch signal Si0 and the second switch signal Si1 and the outputs of the first setting control signal Se1, the second setting control signal Se2, and the third setting control signal Se3.

When, for example, pattern 1D is used, in response to a L signal as the first switch signal Si0 and a L signal as the second switch signal Si1, the combination circuit 52 outputs a L signal that is the first signal as the first setting control signal Se1, a L signal that is the first signal as the second setting control signal Se2, and a L signal that is the first signal as the third setting control signal Se3. The first setter 13 selectively sets, for example, the first light emitter 12a to the emissive state by switching the fourth transistor 13a as the first switch to the nonconductive state and selectively sets the second light emitter 12b to the non-emissive state by switching the fifth transistor 13b as the second switch to the conductive state. The second setter 23 sets, for example, both the third light emitter 22a and the fourth light emitter 22b to the emissive state by switching both the ninth transistor 23a as the third switch and the tenth transistor 23b as the fourth switch to the nonconducting state. This sets, for example, the first light emitter 12a, the third light emitter 22a, and the fourth light emitter 22b to the emissive state and the second light emitter 12b to the non-emissive state.

When, for example, pattern 2D is used, in response to a L signal as the first switch signal Si0 and a H signal as the second switch signal Si1, the combination circuit 52 outputs a H signal that is the second signal as the first setting control signal Se1, a L signal that is the first signal as the second setting control signal Se2, and a L signal that is the first signal as the third setting control signal Se3. The first setter 13 selectively sets, for example, the second light emitter 12b to the emissive state by switching the fifth transistor 13b as the second switch to the nonconductive state and selectively sets the first light emitter 12a to the non-emissive state by switching the fourth transistor 13a as the first switch to the conductive state. The second setter 23 sets, for example, both the third light emitter 22a and the fourth light emitter 22b to the emissive state by switching both the ninth transistor 23a as the third switch and the tenth transistor 23b as the fourth switch to the nonconducting state. This sets, for example, the second light emitter 12b, the third light emitter 22a, and the fourth light emitter 22b to the emissive state and the first light emitter 12a to the non-emissive state.

When, for example, pattern 1D or pattern 2D described above is used, the emission status of the first light emitter 12a, the second light emitter 12b, the third light emitter 22a, and the fourth light emitter 22b enters the normal mode in the same or similar manner as in the third embodiment. More specifically, the pixel circuit 10 operates in, for example, the normal mode in which one of the first light emitter 12a or the second light emitter 12b connected in series is selectively in the emissive state and both the third light emitter 22a and the fourth light emitter 22b connected in series are in the emissive state. When, for example, pattern 1D described above is used, the pixel circuit 10 operates in the third normal mode described above. When, for example, pattern 2D described above is used, the pixel circuit 10 operates in the fourth normal mode described above. In this case, the display device 100 may achieve higher performance as in the third embodiment when, for example, the first subpixel circuit 1 and the second subpixel circuit 2 have at least different component characteristics or different use conditions of the light emitters.

When, for example, pattern 3D is used, in response to a H signal as the first switch signal Si0 and a L signal as the second switch signal Si1, the combination circuit 52 outputs a L signal that is the first signal as the first setting control signal Se1, a L signal that is the first signal as the second setting control signal Se2, and a H signal that is the second signal as the third setting control signal Se3. This sets, for example, the first light emitter 12a and the third light emitter 22a to the emissive state and the second light emitter 12b and the fourth light emitter 22b to the non-emissive state. When, for example, pattern 4D is used, in response to a H signal as the first switch signal Si0 and a H signal as the second switch signal Si1, the combination circuit 52 outputs a H signal that is the second signal as the first setting control signal Se1, a H signal that is the second signal as the second setting control signal Se2, and a L signal that is the first signal as the third setting control signal Se3. This sets, for example, the second light emitter 12b and the fourth light emitter 22b to the emissive state and the first light emitter 12a and the third light emitter 22a to the non-emissive state.

When, for example, pattern 3D or pattern 4D is used, the emission status of the first light emitter 12a, the second light emitter 12b, the third light emitter 22a, and the fourth light emitter 22b enters the failure mode for responding to an emission failure in the pixel circuit 10. In this case, the second setter 23 selectively sets, for example, one of the third light emitter 22a or the fourth light emitter 22b to the non-emissive state by selectively switching one switch of the ninth transistor 23a as the third switch or the tenth transistor 23b as the fourth switch to the conductive state. This may selectively cause, for example, one of the third light emitter 22a or the fourth light emitter 22b with no emission failure in the second subpixel circuit 2 to emit light.

Second Example of Fourth Embodiment

In this example, the setting control signal input from the setting controller 5 to the second setter 23 may be partially common to the setting control signal input from the setting controller 5 to the first setter 13.

FIG. 18 is a circuit diagram of a pixel circuit 10 according to a second example of the fourth embodiment. In the second example of the fourth embodiment, the pixel circuit 10 includes a first emission controller 11, a first light emitter unit 12, a first setter 13, a second emission controller 21, a second light emitter unit 22, and a second setter 23 having the same or similar structure as those in the pixel circuit 10 according to the first example of the fourth embodiment illustrated in FIG. 16. The gate electrodes of the fourth transistor 13a, the fifth transistor 13b, and the ninth transistor 23a are connected to, for example, the setting controller 5 with the first setting control signal line SL1. More specifically, the first setting control signal line SL1 connected to the setting controller 5 branches at, for example, two points to the gate electrodes of the fourth transistor 13a, the fifth transistor 13b, and the ninth transistor 23a. The gate electrode of the tenth transistor 23b is connected to, for example, the setting controller 5 with the second setting control signal line SL2. The third setting control signal line SL3 is, for example, eliminated. This allows, for example, the gate electrodes of the fourth transistor 13a, the fifth transistor 13b, and the ninth transistor 23a to commonly receive the first setting control signal Se1 from the setting controller 5.

FIG. 19 is a truth table showing an example relationship between the switch signal Si input into the combination circuit 52, the setting control signal output from the combination circuit 52, and the light emitter(s) set to the emissive state. The combination circuit 52 in this example yields various logical outputs to cause the inputs of the first switch signal Si0 and the second switch signal Si1 to be in the relationship with the outputs of the first setting control signal Se1 and the second setting control signal Se2 in the manner shown in FIG. 19. As shown in the example in FIG. 19, three logical output patterns (more specifically, patterns 1E to 3E) may be yielded as combinations of the inputs of the first switch signal Si0 and the second switch signal Si1 and the outputs of the first setting control signal Se1 and the second setting control signal Se2.

When, for example, pattern 1E is used, in response to a L signal as the first switch signal Si0 and a L signal as the second switch signal Si1, the combination circuit 52 outputs a L signal that is the first signal as the first setting control signal Se1 and a L signal that is the first signal as the second setting control signal Se2. The first setter 13 selectively sets, for example, the first light emitter 12a to the emissive state by switching the fourth transistor 13a as the first switch to the nonconductive state and selectively sets the second light emitter 12b to the non-emissive state by switching the fifth transistor 13b as the second switch to the conductive state. The second setter 23 sets, for example, both the third light emitter 22a and the fourth light emitter 22b to the emissive state by switching both the ninth transistor 23a as the third switch and the tenth transistor 23b as the fourth switch to the nonconducting state. This sets, for example, the first light emitter 12a, the third light emitter 22a, and the fourth light emitter 22b to the emissive state and the second light emitter 12b to the non-emissive state.

When, for example, pattern 1E described above is used, the emission status of the first light emitter 12a, the second light emitter 12b, the third light emitter 22a, and the fourth light emitter 22b enters the normal mode in the same or similar manner as in the third embodiment. More specifically, the pixel circuit 10 operates in, for example, the normal mode in which one of the first light emitter 12a or the second light emitter 12b connected in series is selectively in the emissive state and both the third light emitter 22a and the fourth light emitter 22b connected in series are in the emissive state. When, for example, pattern 1E described above is used, the pixel circuit 10 operates in the third normal mode described above. In this case, the display device 100 may achieve higher performance in the same or similar manner as in the third embodiment when, for example, the first subpixel circuit 1 and the second subpixel circuit 2 have at least different component characteristics or different use conditions of the light emitters.

When, for example, pattern 2E is used, in response to a H signal as the first switch signal Si0 and a L signal as the second switch signal Si1, the combination circuit 52 outputs a L signal that is the first signal as the first setting control signal Se1 and a H signal that is the second signal as the second setting control signal Se2. This sets, for example, the first light emitter 12a and the third light emitter 22a to the emissive state and the second light emitter 12b and the fourth light emitter 22b to the non-emissive state. When, for example, pattern 3E is used, in response to a L signal as the first switch signal Si0 and a H signal as the second switch signal Si1, the combination circuit 52 outputs a H signal that is the second signal as the first setting control signal Se1 and a L signal that is the second signal as the second setting control signal Se2. This sets, for example, the second light emitter 12b and the fourth light emitter 22b to the emissive state and the first light emitter 12a and the third light emitter 22a to the non-emissive state.

When, for example, pattern 2E or pattern 3E is used, the emission status of the first light emitter 12a, the second light emitter 12b, the third light emitter 22a, and the fourth light emitter 22b enters the failure mode for responding to an emission failure in the pixel circuit 10. In this case, the second setter 23 selectively sets, for example, one of the third light emitter 22a or the fourth light emitter 22b to the non-emissive state by selectively switching one switch of the ninth transistor 23a as the third switch or the tenth transistor 23b as the fourth switch to the conductive state. This may selectively cause, for example, one of the third light emitter 22a or the fourth light emitter 22b with no emission failure in the second subpixel circuit 2 to emit light.

The gate electrodes of the fourth transistor 13a, the fifth transistor 13b, and the tenth transistor 23b may be connected to, for example, the setting controller 5 with the first setting control signal line SL1. More specifically, the first setting control signal line SL1 connected to the setting controller 5 may branch at, for example, two points to the gate electrodes of the fourth transistor 13a, the fifth transistor 13b, and the tenth transistor 23b. This may allow, for example, the gate electrodes of the fourth transistor 13a, the fifth transistor 13b, and the tenth transistor 23b to commonly receive the first setting control signal Se1 from the setting controller 5. In this case, the second setting control signal line SL2 connected to the setting controller 5 may be connected to, for example, the gate electrode of the ninth transistor 23a.

2-4. Fifth Embodiment

In the first embodiment, the pixel circuit 10 may have, for example, a connection different state and an emitter number same mode. In the connection different state, the connection between the first light emitter 12a and the second light emitter 12b is in, for example, one of a series connection or a parallel connection, and the connection between the third light emitter 22a and the fourth light emitter 22b is in the other of a series connection or a parallel connection. In the emitter number same modes, for example, the emission status of the first light emitter 12a and the second light emitter 12b set by the first setter 13 and the emission status of the third light emitter 22a and the fourth light emitter 22b set by the second setter 23 are in the same first emission setting to cause both sets of light emitters to be in the emissive state. In other words, the emitter number same mode (also referred to as an emitter number same state) is a mode (state) in which the number of emissive light emitters are set to be the same in the first subpixel circuit 1 and the second subpixel circuit 2.

Structure of Pixel Circuit

Figures 20, 21:
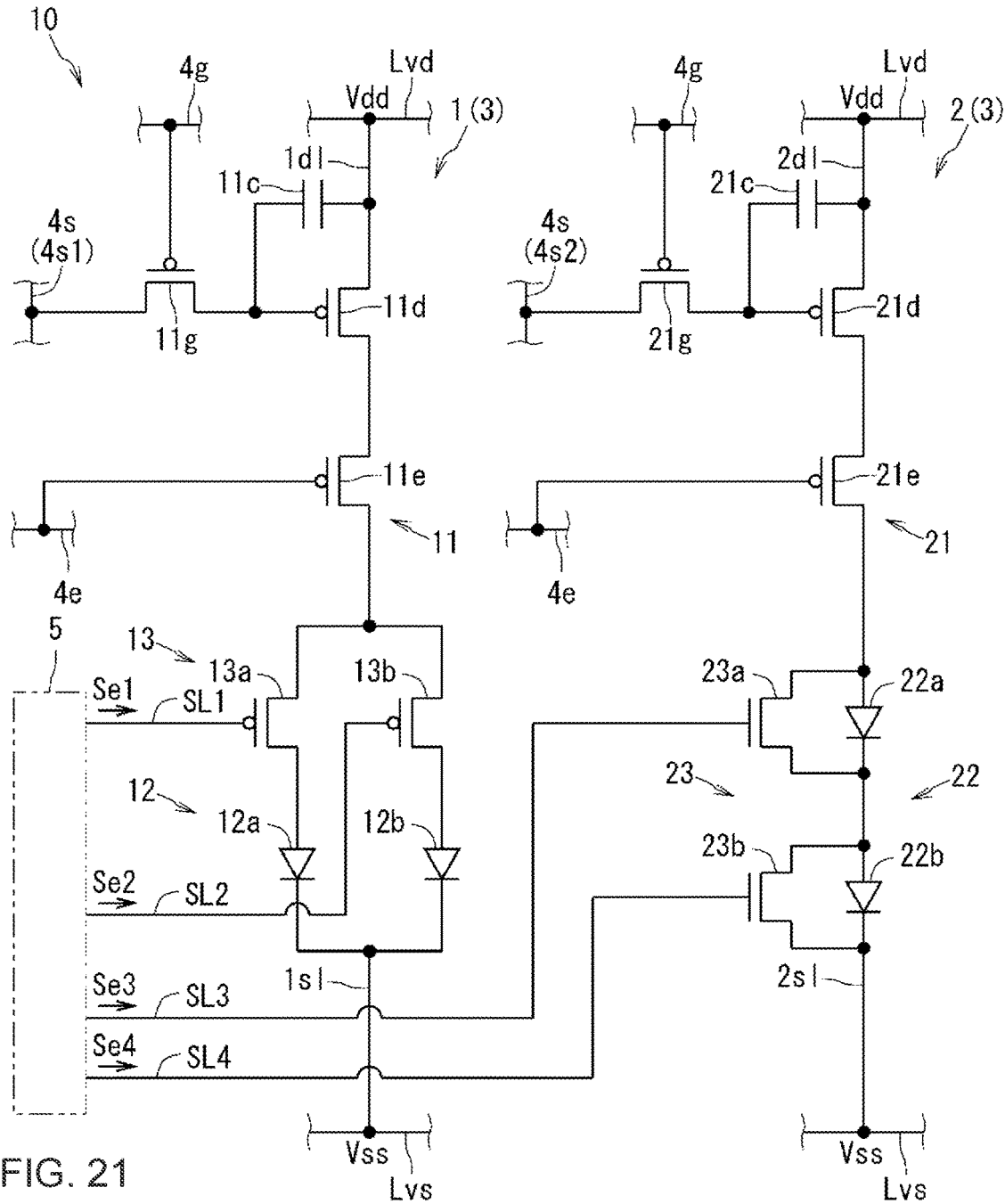
FIG. 20 is a circuit diagram of an example pixel circuit according to a fifth embodiment.
FIG. 21 is a truth table showing an example relationship between a switch signal, a setting control signal, and light emitter(s) set to the emissive state.

FIG. 20 is a circuit diagram of an example pixel circuit 10 according to a fifth embodiment. The pixel circuit 10 according to the fifth embodiment is altered from the pixel circuit 10 according to the first embodiment illustrated in FIG. 4, with the structures of the second light emitter unit 22 and the second setter 23 in the second subpixel circuit 2 being changed.

The second light emitter unit 22 in the second subpixel circuit 2 includes, for example, the third light emitter 22a and the fourth light emitter 22b connected in series. For example, the third light emitter 22a and the fourth light emitter 22b are connected in series between the drain electrode of the eighth transistor 21e and the second cathode potential input line 2s1. For example, the third light emitter 22a and the fourth light emitter 22b may be connected in series in this order or in the opposite order in the direction from the drain electrode of the eighth transistor 21e to the second cathode potential input line 2s1. In the example in FIG. 20, the third light emitter 22a includes the positive electrode connected to the drain electrode of the eighth transistor 21e and the negative electrode connected to the positive electrode of the fourth light emitter 22b. The negative electrode of the fourth light emitter 22b is connected to the second cathode potential input line 2s1.

The second setter 23 in the second subpixel circuit 2 includes, for example, the ninth transistor 23a as the third switch connected in parallel to the third light emitter 22a and the tenth transistor 23b as the fourth switch connected in parallel to the fourth light emitter 22b. Each of the ninth transistor 23a and the tenth transistor 23b is, for example, an n-channel transistor. In this case, the ninth transistor 23a includes, for example, the drain electrode connected to the positive electrode of the third light emitter 22a and the source electrode connected to the negative electrode of the third light emitter 22a. The tenth transistor 23b includes, for example, the drain electrode connected to the positive electrode of the fourth light emitter 22b and the source electrode connected to the negative electrode of the fourth light emitter 22b. The gate electrode of the ninth transistor 23a is connected to, for example, the setting controller 5 with the third setting control signal line SL3. The gate electrode of the tenth transistor 23b is connected to, for example, the setting controller 5 with the fourth setting control signal line SL4.

In response to, for example, a L signal as the first signal (off-signal) input into the gate electrode, the ninth transistor 23a as an n-channel transistor enters the nonconductive state to allow no current to flow through the source electrode and the drain electrode. This may set, for example, the third light emitter 22a to the emissive state. In response to, for example, a H signal as the second signal (on-signal) input into the gate electrode, the ninth transistor 23a enters the conductive state to allow a current to flow through the source electrode and the drain electrode. This causes, for example, the current flowing through the second subpixel circuit 2 based on the potential difference between the anode potential Vdd from the first power line Lvd and the cathode potential Vss from the second power line Lvs to flow through the ninth transistor 23a without through the third light emitter 22a. This may set, for example, the third light emitter 22a to the non-emissive state.

In response to, for example, a L signal as the first signal input into the gate electrode as an n-channel transistor, the tenth transistor 23b enters the nonconductive state to allow no current to flow through the source electrode and the drain electrode. This may set, for example, the fourth light emitter 22b to the emissive state. In response to, for example, a H signal as the second signal input into the gate electrode, the tenth transistor 23b enters the conductive state to allow a current to flow through the source electrode and the drain electrode. This causes, for example, the current flowing through the second subpixel circuit 2 based on the potential difference between the anode potential Vdd from the first power line Lvd and the cathode potential Vss from the second power line Lvs to flow through the tenth transistor 23b without through the fourth light emitter 22b. This may set, for example, the fourth light emitter 22b to the non-emissive state.

The second setter 23 can set, for example, both the third light emitter 22a and the fourth light emitter 22b to the emissive state by switching both the ninth transistor 23a as the third switch and the tenth transistor 23b as the fourth switch to the nonconductive state to allow no current to flow through the respective source electrodes and drain electrodes.

Improving Characteristics of Display Device

The first light emitter 12a and the second light emitter 12b are connected, for example, in parallel. The third light emitter 22a and the fourth light emitter 22b are connected in, for example, series. In other words, the pixel circuit 10 has, for example, the state (connection different state) in which the connection between the first light emitter 12a and the second light emitter 12b is one of a series connection or a parallel connection and the connection between the third light emitter 22a and the fourth light emitter 22b is other of a series connection or a parallel connection. More specifically, the pixel circuit 10 has, for example, the state (also referred to as a first connection different state) in which the connection between the first light emitter 12a and the second light emitter 12b is one of a series connection or a parallel connection and the connection between the third light emitter 22a and the fourth light emitter 22b is the other of the series connection or the parallel connection.

The pixel circuit 10 can set, for example, both the first light emitter 12a and the second light emitter 12b to the emissive state with the first setter 13 and both the third light emitter 22a and the fourth light emitter 22b to the emissive state with the second setter 23. In other words, the pixel circuit 10 sets, for example, the emission status of the first light emitter 12a and the second light emitter 12b with the first setter 13 to the first emission setting (both emitting state) in which both light emitters are in the emissive state. The pixel circuit 10 can also set, for example, the emission status of the third light emitter 22a and the fourth light emitter 22b with the second setter 23 to the first emission setting (both emissive setting) in which both light emitters are in the emissive state.

Thus, the pixel circuit 10 has, for example, a setting mode (emitter number same mode) in which the emission status of the first light emitter 12a and the second light emitter 12b set by the first setter 13 and the emission status of the third light emitter 22a and the fourth light emitter 22b set by the second setter 23 are in the same first emission setting to cause both sets of light emitters to be in the emissive state. In the fifth embodiment, the pixel circuit 10 thus has, for example, the first connection different state and the emitter number same mode.

In this example, the normal mode used in the pixel circuit 10 is a setting mode in which both the first light emitter 12a and the second light emitter 12b connected in parallel are in the emissive state and both the third light emitter 22a and the fourth light emitter 22b connected in series are in the emissive state. In other words, the pixel circuit 10 has, for example, the first connection different state and the emitter number same mode as the normal mode.

In the fifth embodiment, for example, the normal mode sets, in the same or similar manner as in the first embodiment, both the first light emitter 12a and the second light emitter 12b connected in parallel in the first subpixel circuit 1 to the emissive state and causes both the first light emitter 12a and the second light emitter 12b to emit light. This may decrease the forward voltage applied to each of the first light emitter 12a and the second light emitter 12b to be lower than the voltage applied when one of the first light emitter 12a or the second light emitter 12b connected in parallel to have the same light intensity selectively emits light. In this case, for example, a larger portion of the potential difference between the anode potential Vdd and the cathode potential Vss may be used by the drain-source voltage Vds of the second transistor 11d in the first emission controller 11. Thus, the operating conditions for the second transistor 11d in the saturation region are less likely to be stricter in response to, for example, a decrease in the potential difference between the anode potential Vdd and the cathode potential Vss. This reduces gradations (uneven luminance), or a gradual decrease in the luminance of the display device 100, thus improving the image quality of the display device 100.

In the fifth embodiment, for example, the normal mode sets, in the same or similar manner as in the first embodiment, both the first light emitter 12a and the second light emitter 12b connected in parallel in the first subpixel circuit 1 to the emissive state and causes both the first light emitter 12a and the second light emitter 12b to emit light. This may decrease the current flowing through each of the first light emitter 12a and the second light emitter 12b to substantially half the current flowing when, for example, one of the first light emitter 12a or the second light emitter 12b connected in parallel to have the same light intensity selectively emits light. The first light emitter 12a or the second light emitter 12b is thus, for example, less likely to deteriorate over time. The display device 100 may thus have higher image quality.

In the fifth embodiment, for example, the normal mode sets, in the same or similar manner as in the first embodiment, both the third light emitter 22a and the fourth light emitter 22b connected in series in the second subpixel circuit 2 to the emissive state and causes both the third light emitter 22a and the fourth light emitter 22b to emit light. This may decrease the current flowing through each of the third light emitter 22a and the fourth light emitter 22b to substantially half the current flowing when, for example, one of the third light emitter 22a or the fourth light emitter 22b connected in series to have the same light intensity selectively emits light. With, for example, a substantially constant potential difference between the anode potential Vdd and the cathode potential Vss, the second subpixel circuit 2 may consume less power and achieve higher energy efficiency. This may reduce, for example, power consumption in the display device 100.

In the fifth embodiment, when, for example, the first subpixel circuit 1 and the second subpixel circuit 2 have at least different component characteristics or different use conditions of the light emitters, the first connection different state and the emitter number same mode as the normal mode are used as appropriate for at least the component characteristics or the use conditions of the light emitters. This may improve, for example, the performance of the display device 100.

Input and Output of Combination Circuit and Light Emitter(s) Set to Emissive State FIG. 21 is a table showing an example relationship between the switch signal Si input into the combination circuit 52, the setting control signal output from the combination circuit 52, and the light emitter(s) set to the emissive state. The combination circuit 52 yields various logical outputs to cause, for example, the inputs of the first switch signal Si0 and the second switch signal Si1 to be in the relationship with the outputs of the first setting control signal Se1, the second setting control signal Se2, the third setting control signal Se3, and the fourth setting control signal Se4 in the manner shown in FIG. 21. As shown in the example in FIG. 21, three logical output patterns (more specifically, patterns 1F to 3F) may be yielded as combinations of the inputs of the first switch signal Si0 and the second switch signal Si1 and the outputs of the first setting control signal Se1, the second setting control signal Se2, the third setting control signal Se3, and the fourth setting control signal Se4.

When, for example, pattern 1F is used, in response to a L signal as the first switch signal Si0 and a L signal as the second switch signal Si1, the combination circuit 52 outputs a L signal that is the first signal as the first setting control signal Se1, a L signal that is the first signal as the second setting control signal Se2, a L signal that is the first signal as the third setting control signal Se3, and a L signal that is the first signal as the fourth setting control signal Se4. In this case, the first setter 13 sets, for example, both the first light emitter 12a and the second light emitter 12b to the emissive state by switching both the fourth transistor 13a as the first switch and the fifth transistor 13b as the second switch to the conductive state. The second setter 23 sets, for example, both the third light emitter 22a and the fourth light emitter 22b to the emissive state by switching the ninth transistor 23a as the third switch and the tenth transistor 23b as the fourth switch to the nonconductive state. This sets, for example, all of the first light emitter 12a, the second light emitter 12b, the third light emitter 22a, and the fourth light emitter 22b to the emissive state.

When, for example, pattern 2F is used, in response to a L signal as the first switch signal Si0 and a H signal as the second switch signal Si1, the combination circuit 52 outputs a L signal that is the first signal as the first setting control signal Se1, a H signal that is the second signal as the second setting control signal Se2, a L signal that is the first signal as the third setting control signal Se3, and a H signal that is the second signal as the fourth setting control signal Se4. This sets, for example, the first light emitter 12a and the third light emitter 22a to the emissive state and the second light emitter 12b and the fourth light emitter 22b to the non-emissive state.

When, for example, pattern 3F is used, in response to a H signal as the first switch signal Si0 and a L signal as the second switch signal Si1, the combination circuit 52 outputs a H signal that is the second signal as the first setting control signal Se1, a L signal that is the first signal as the second setting control signal Se2, a H signal that is the second signal as the third setting control signal Se3, and a L signal that is the first signal as the fourth setting control signal Se4. This sets, for example, the second light emitter 12b and the fourth light emitter 22b to the emissive state and the first light emitter 12a and the third light emitter 22a to the non-emissive state.

Setting Normal Mode

In the fifth embodiment, the use of, for example, pattern 1F described above causes the emission status of the first light emitter 12a, the second light emitter 12b, the third light emitter 22a, and the fourth light emitter 22b to enter the normal mode. More specifically, the pixel circuit 10 operates in, for example, the normal mode (also referred to as a fifth normal mode) in which both the first light emitter 12a and the second light emitter 12b connected in parallel are in the emissive state and both the third light emitter 22a and the fourth light emitter 22b connected in series are in the emissive state.

In this case, the first setter 13 sets, for example, both the first light emitter 12a and the second light emitter 12b to the emissive state by switching both the fourth transistor 13a as the first switch and the fifth transistor 13b as the second switch to the conductive state. The second setter 23 sets, for example, both the third light emitter 22a and the fourth light emitter 22b to the emissive state by switching the ninth transistor 23a as the third switch and the tenth transistor 23b as the fourth switch to the nonconductive state. The display device 100 may thus achieve higher performance when, for example, the first subpixel circuit 1 and the second subpixel circuit 2 have at least different component characteristics or different use conditions of the light emitters as described above.

Setting Failure Mode

In the fifth embodiment, the use of, for example, pattern 2F or pattern 3F causes the emission status of the first light emitter 12a, the second light emitter 12b, the third light emitter 22a, and the fourth light emitter 22b to enter the mode (failure mode) for responding to an emission failure in the pixel circuit 10. In this case, the first setter 13 selectively sets, for example, one of the first light emitter 12a or the second light emitter 12b to the non-emissive state by switching one of the fourth transistor 13a as the first switch or the fifth transistor 13b as the second switch to the nonconductive state. This may selectively cause, for example, one of the first light emitter 12a or the second light emitter 12b with no emission failure in the first subpixel circuit 1 to emit light. The second setter 23 selectively sets, for example, one of the third light emitter 22a or the fourth light emitter 22b to the non-emissive state by selectively switching one of the ninth transistor 23a as the third switch or the tenth transistor 23b as the fourth switch to the conductive state. This may selectively cause, for example, one of the third light emitter 22a or the fourth light emitter 22b with no emission failure in the second subpixel circuit 2 to emit light.

For any emission failure with at least one of the second light emitter 12b or the fourth light emitter 22b resulting from, for example, a connection failure or a defective component, pattern 2F corresponding to the failure mode may be used instead of pattern 1F corresponding to the normal mode. In this case, for example, the first setter 13 sets the second light emitter 12b to the non-emissive state selectively from the first light emitter 12a and the second light emitter 12b by switching the fifth transistor 13b as the second switch to the nonconductive state selectively from the fourth transistor 13a as the first switch or the fifth transistor 13b. The second setter 23 sets, for example, the fourth light emitter 22b to the non-emissive state selectively from the third light emitter 22a and the fourth light emitter 22b by switching the tenth transistor 23b as the fourth switch to the conductive state selectively from the ninth transistor 23a as the third switch and the tenth transistor 23b. Thus, the first subpixel circuit 1 includes, for example, the first light emitter 12a with no emission failure to emit light selectively from the from the first light emitter 12a and the second light emitter 12b. The second subpixel circuit 2 includes, for example, the third light emitter 22a with no emission failure to emit light selectively from the third light emitter 22a and the fourth light emitter 22b. In this manner, the setting mode (first failure mode) used in the above example sets, for example, each of the first light emitter 12a and the third light emitter 22a to the emissive state and each of the second light emitter 12b and the fourth light emitter 22b to the non-emissive state.

For any emission failure with at least one of the first light emitter 12a or the third light emitter 22a resulting from, for example, a connection failure or a defective component, pattern 3F corresponding to the failure mode may be used instead of pattern 1F corresponding to the normal mode. In this case, for example, the first setter 13 sets the first light emitter 12a to the non-emissive state selectively from the first light emitter 12a and the second light emitter 12b by switching the fourth transistor 13a as the first switch to the nonconductive state selectively from the fourth transistor 13a and the fifth transistor 13b as the second switch. The second setter 23 selectively sets, for example, the third light emitter 22a to the non-emissive state selectively from the third light emitter 22a and the fourth light emitter 22b by switching the ninth transistor 23a as the third switch to the conductive state selectively from the ninth transistor 23a and the tenth transistor 23b as the fourth switch. Thus, the first subpixel circuit 1 includes, for example, the second light emitter 12b with no emission failure to emit light selectively from the from the first light emitter 12a and the second light emitter 12b. The second subpixel circuit 2 includes, for example, the fourth light emitter 22b with no emission failure to emit light selectively from the third light emitter 22a and the fourth light emitter 22b. In this manner, the setting mode (second failure mode) sets, for example, each of the second light emitter 12b and the fourth light emitter 22b to the emissive state and each of the first light emitter 12a and the third light emitter 22a to the non-emissive state.

Variations of Fifth Embodiment

Figures 22, 23:
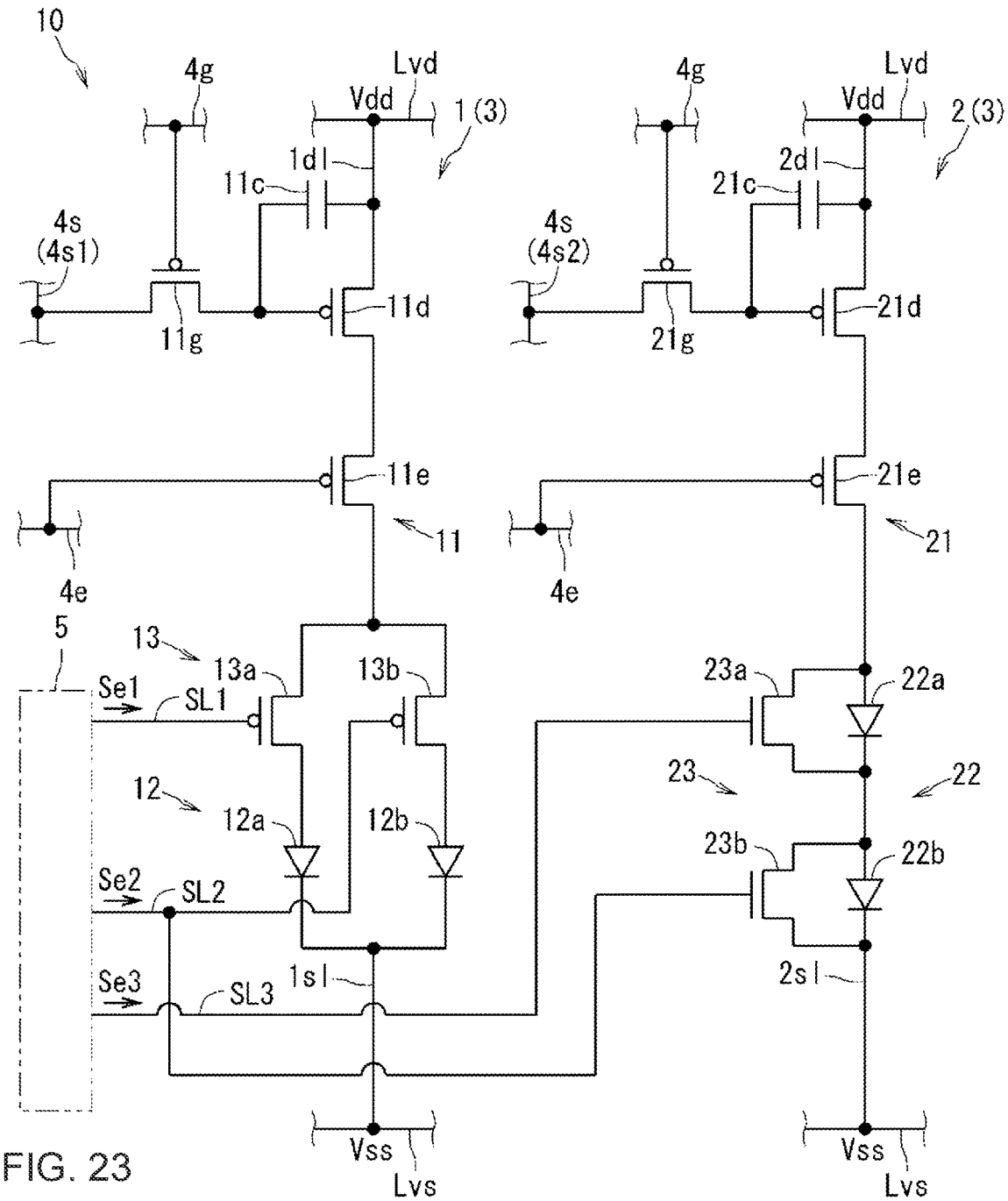
FIG. 22 is a circuit diagram of a pixel circuit according to a first variation of the fifth embodiment.
FIG. 23 is a truth table showing an example relationship between a switch signal, a setting control signal, and light emitter(s) set to the emissive state.
Figures 24, 25:
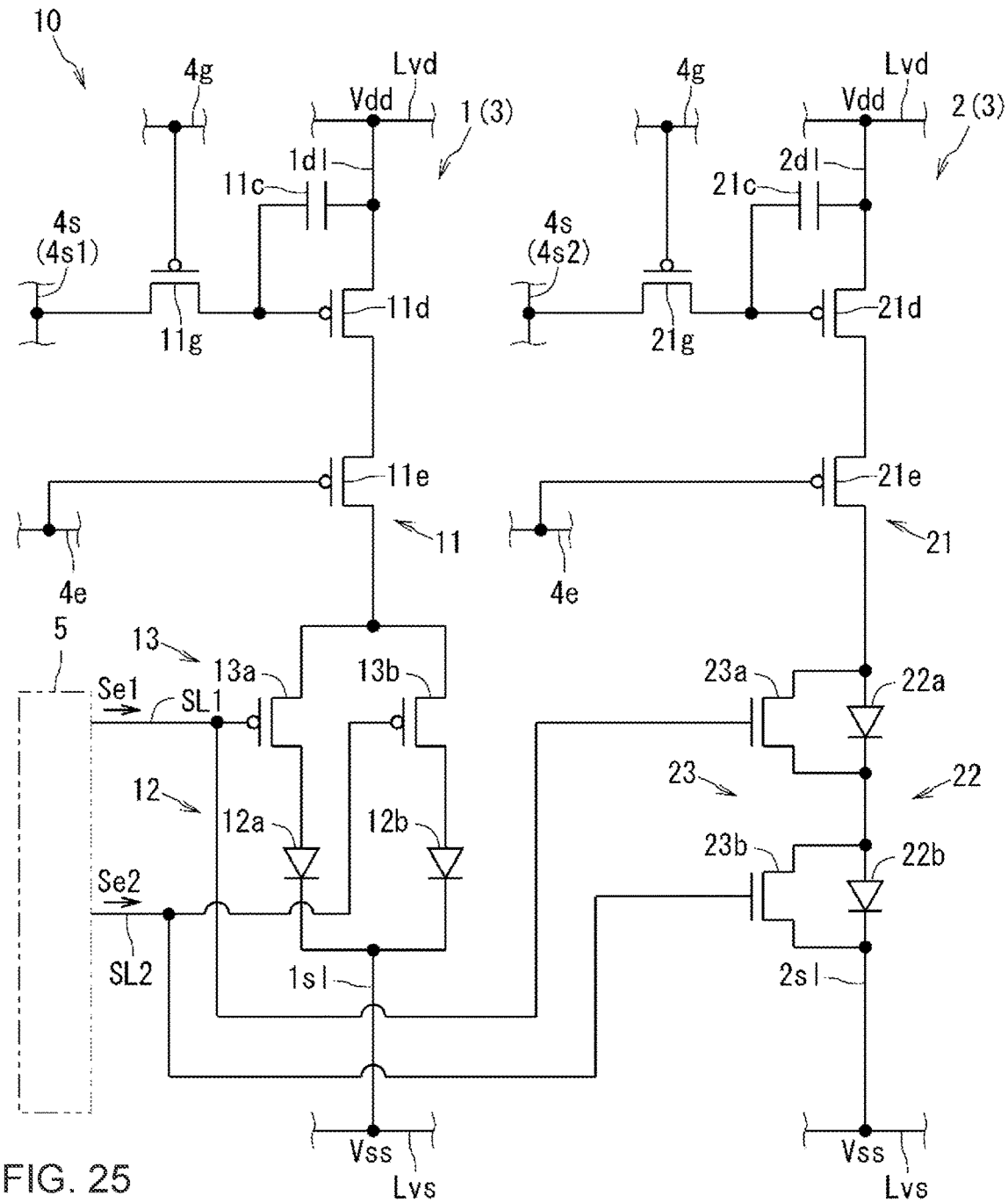
FIG. 24 is a circuit diagram of a pixel circuit according to a second variation of the fifth embodiment.
FIG. 25 is a truth table showing an example relationship between a switch signal, a setting control signal, and light emitter(s) set to the emissive state.

In the fifth embodiment, as illustrated in the example illustrated in FIGS. 22 and 24, the setting control signal input from the setting controller 5 to the first setter 13 and the setting control signal input from the setting controller 5 to the second setter 23 may be partially common to each other. This structure may simplify the wiring structure using, for example, fewer wires for providing the setting control signal to the first setter 13 and the second setter 23. The display device 100 and the display panel 100p may thus include, for example, multiple pixel circuits 10 arranged with narrower pitches to improve resolution. The display device 100 may thus achieve, for example, higher performance.

FIG. 22 is a circuit diagram of a pixel circuit 10 according to a first variation of the fifth embodiment. In the first variation of the fifth embodiment, the pixel circuit 10 includes a first emission controller 11, a first light emitter unit 12, a first setter 13, a second emission controller 21, a second light emitter unit 22, and a second setter 23 having the same or similar structure as those in the pixel circuit 10 according to the fifth embodiment illustrated in FIG. 20. In this example, the gate electrodes of the fifth transistor 13b and the tenth transistor 23b are connected to the setting controller 5 with the second setting control signal line SL2. More specifically, the second setting control signal line SL2 connected to the setting controller 5 branches to, for example, the gate electrode of the fifth transistor 13b and the gate electrode of the tenth transistor 23b. The gate electrode of the fourth transistor 13a is connected to, for example, the setting controller 5 with the first setting control signal line SL1. The gate electrode of the ninth transistor 23a is connected to, for example, the setting controller 5 with the third setting control signal line SL3. The fourth setting control signal line SL4 is, for example, eliminated. This allows, for example, the gate electrodes of the fifth transistor 13b and the tenth transistor 23b to commonly receive the second setting control signal Se2 from the setting controller 5.

FIG. 23 is a truth table showing an example relationship between the switch signal Si input into the combination circuit 52, the setting control signal output from the combination circuit 52, and the light emitter(s) set to the emissive state. The combination circuit 52 in this example yields various logical outputs to cause the inputs of the first switch signal Si0 and the second switch signal Si1 to be in the relationship with the outputs of the first setting control signal Se1, the second setting control signal Se2, and the third setting control signal Se3 in the manner shown in FIG. 23. As shown in the example in FIG. 23, three logical output patterns (more specifically, patterns 1G to 3G) may be yielded as combinations of the inputs of the first switch signal Si0 and the second switch signal Si1 and the outputs of the first setting control signal Se1, the second setting control signal Se2, and the third setting control signal Se3.

When, for example, pattern 1G is used, in response to a L signal as the first switch signal Si0 and a L signal as the second switch signal Si1, the combination circuit 52 outputs a L signal that is the first signal as the first setting control signal Se1, a L signal that is the first signal as the second setting control signal Se2, and a L signal that is the first signal as the third setting control signal Se3. In this case, the first setter 13 sets, for example, both the first light emitter 12a and the second light emitter 12b to the emissive state by switching both the fourth transistor 13a as the first switch and the fifth transistor 13b as the second switch to the conductive state. The second setter 23 sets, for example, both the third light emitter 22a and the fourth light emitter 22b to the emissive state by switching the ninth transistor 23a as the third switch and the tenth transistor 23b as the fourth switch to the nonconductive state. This sets, for example, all of the first light emitter 12a, the second light emitter 12b, the third light emitter 22a, and the fourth light emitter 22b to the emissive state.

In this example, the use of, for example, pattern 1G described above causes the emission status of the first light emitter 12a, the second light emitter 12b, the third light emitter 22a, and the fourth light emitter 22b to enter the normal setting mode. More specifically, the pixel circuit 10 operates in, for example, the normal mode (fifth normal mode) in which both the first light emitter 12a and the second light emitter 12b connected in parallel are in the emissive state and both the third light emitter 22a and the fourth light emitter 22b connected in series are in the emissive state. In this case, the display device 100 may thus achieve higher performance when, for example, the first subpixel circuit 1 and the second subpixel circuit 2 have at least different component characteristics or different use conditions of the light emitters as described above.

When, for example, pattern 2G is used, in response to a L signal as the first switch signal Si0 and a H signal as the second switch signal Si1, the combination circuit 52 outputs a L signal that is the first signal as the first setting control signal Se1, a H signal that is the second signal as the second setting control signal Se2, and a L signal that is the first signal as the third setting control signal Se3. This sets, for example, the first light emitter 12a and the third light emitter 22a to the emissive state and the second light emitter 12b and the fourth light emitter 22b to the non-emissive state. When, for example, pattern 3G is used, in response to a H signal as the first switch signal Si0 and a L signal as the second switch signal Si1, the combination circuit 52 outputs a H signal that is the second signal as the first setting control signal Se1, a L signal that is the first signal as the second setting control signal Se2, and a H signal that is the second signal as the third setting control signal Se3. This sets, for example, the second light emitter 12b and the fourth light emitter 22b to the emissive state and the first light emitter 12a and the third light emitter 22a to the non-emissive state.

When, for example, pattern 2G or pattern 3G is used, the emission status of the first light emitter 12a, the second light emitter 12b, the third light emitter 22a, and the fourth light emitter 22b enters the failure mode for responding to an emission failure in the pixel circuit 10. In this case, the first setter 13 selectively sets, for example, one of the first light emitter 12a or the second light emitter 12b to the non-emissive state by switching one of the fourth transistor 13a as the first switch or the fifth transistor 13b as the second switch to the nonconductive state. This may selectively cause, for example, one of the first light emitter 12a or the second light emitter 12b with no emission failure in the first subpixel circuit 1 to emit light. The second setter 23 selectively sets, for example, one of the third light emitter 22a or the fourth light emitter 22b to the non-emissive state by selectively switching one of the ninth transistor 23a as the third switch or the tenth transistor 23b as the fourth switch to the conductive state. This may selectively cause, for example, one of the third light emitter 22a or the fourth light emitter 22b with no emission failure in the second subpixel circuit 2 to emit light.

FIG. 24 is a circuit diagram of a pixel circuit 10 according to a second variation of the fifth embodiment. In the second example of the fifth embodiment, the pixel circuit 10 includes a first emission controller 11, a first light emitter unit 12, a first setter 13, a second emission controller 21, a second light emitter unit 22, and a second setter 23 with the same or similar structure as those in the pixel circuit 10 according to the fifth embodiment illustrated in FIG. 20. In this example, the gate electrodes of the fourth transistor 13a and the ninth transistor 23a are connected to the setting controller 5 with the first setting control signal line SL1. More specifically, the first setting control signal line SL1 connected to the setting controller 5 branches to, for example, the gate electrode of the fourth transistor 13a and the gate electrode of the ninth transistor 23a. The gate electrodes of the fifth transistor 13b and the tenth transistor 23b are connected to, for example, the setting controller 5 with the second setting control signal line SL2. More specifically, the second setting control signal line SL2 connected to the setting controller 5 branches to, for example, the gate electrode of the fifth transistor 13b and the gate electrode of the tenth transistor 23b. The third setting control signal line SL3 and the fourth setting control signal line SL4 are, for example, eliminated. This allows, for example, the gate electrodes of the fourth transistor 13a and the ninth transistor 23a to commonly receive the first setting control signal Se1 from the setting controller 5 and the gate electrodes of the fifth transistor 13b and the tenth transistor 23b to commonly receive the second setting control signal Se2 from the setting controller 5.

FIG. 25 is a table showing an example relationship between the switch signal Si input into the combination circuit 52, the setting control signal output from the combination circuit 52, and the light emitter(s) set to the emissive state. The combination circuit 52 in this example yields various logical outputs to cause the inputs of the first switch signal Si0 and the second switch signal Si1 to be in the relationship with the outputs of the first setting control signal Se1 and the second setting control signal Se2 in the manner shown in FIG. 25. As shown in the example in FIG. 25, three logical output patterns (more specifically, patterns 1H to 3H) may be yielded as combinations of the inputs of the first switch signal Si0 and the second switch signal Si1 and the outputs of the first setting control signal Se1 and the second setting control signal Se2.

When, for example, pattern 1H is used, in response to a L signal as the first switch signal Si0 and a L signal as the second switch signal Si1, the combination circuit 52 outputs a L signal that is the first signal as the first setting control signal Se1 and a L signal that is the first signal as the second setting control signal Se2. In this case, the first setter 13 sets, for example, both the first light emitter 12a and the second light emitter 12b to the emissive state by switching both the fourth transistor 13a as the first switch and the fifth transistor 13b as the second switch to the conductive state. The second setter 23 sets, for example, both the third light emitter 22a and the fourth light emitter 22b to the emissive state by switching the ninth transistor 23a as the third switch and the tenth transistor 23b as the fourth switch to the nonconductive state. This sets, for example, all of the first light emitter 12a, the second light emitter 12b, the third light emitter 22a, and the fourth light emitter 22b to the emissive state.

In this example, the use of pattern 1H described above causes the emission status of the first light emitter 12a, the second light emitter 12b, the third light emitter 22a, and the fourth light emitter 22b to enter the normal setting mode. More specifically, the pixel circuit 10 operates in, for example, the normal mode (fifth normal mode) in which both the first light emitter 12a and the second light emitter 12b connected in parallel are in the emissive state and both the third light emitter 22a and the fourth light emitter 22b connected in series are in the emissive state. In this case, the display device 100 may thus achieve higher performance when, for example, the first subpixel circuit 1 and the second subpixel circuit 2 have at least different component characteristics or different use conditions of the light emitters as described above.

When, for example, pattern 2H is used, in response to a L signal as the first switch signal Si0 and a H signal as the second switch signal Si1, the combination circuit 52 outputs a L signal that is the first signal as the first setting control signal Se1 and a H signal that is the second signal as the second setting control signal Se2. This sets, for example, the first light emitter 12a and the third light emitter 22a to the emissive state and the second light emitter 12b and the fourth light emitter 22b to the non-emissive state. When, for example, pattern 3H is used, in response to a H signal as the first switch signal Si0 and a L signal as the second switch signal Si1, the combination circuit 52 outputs a H signal that is the second signal as the first setting control signal Se1 and a L signal that is the first signal as the second setting control signal Se2. This sets, for example, the second light emitter 12b and the fourth light emitter 22b to the emissive state and the first light emitter 12a and the third light emitter 22a to the non-emissive state.

When, for example, pattern 2H or pattern 3H is used, the emission status of the first light emitter 12a, the second light emitter 12b, the third light emitter 22a, and the fourth light emitter 22b enters the failure mode for responding to an emission failure in the pixel circuit 10. In this case, the first setter 13 selectively sets, for example, one of the first light emitter 12a or the second light emitter 12b to the non-emissive state by switching one of the fourth transistor 13a as the first switch or the fifth transistor 13b as the second switch to the nonconductive state. This may selectively cause, for example, one of the first light emitter 12a or the second light emitter 12b with no emission failure in the first subpixel circuit 1 to emit light. The second setter 23 selectively sets, for example, one of the third light emitter 22a or the fourth light emitter 22b to the non-emissive state by selectively switching one of the ninth transistor 23a as the third switch or the tenth transistor 23b as the fourth switch to the conductive state. This may selectively cause, for example, one of the third light emitter 22a or the fourth light emitter 22b with no emission failure in the second subpixel circuit 2 to emit light.

The fourth transistor 13a as the first switch may be, for example, an n-channel transistor. In this case, the setting control signal input into the gate electrode of the fourth transistor 13a may include, for example, a H signal as the first signal and a L signal as the second signal. The fifth transistor 13b as the second switch may be, for example, an n-channel transistor. In this case, the setting control signal input into the gate electrode of the fifth transistor 13b may include, for example, a H signal as the first signal and a L signal as the second signal. The ninth transistor 23a as the third switch may be, for example, a p-channel transistor. In this case, the setting control signal input into the gate electrode of the ninth transistor 23a may include, for example, a H signal as the first signal and a L signal as the second signal. The tenth transistor 23b as the fourth switch may be, for example, a p-channel transistor. In this case, the setting control signal input into the gate electrode of the tenth transistor 23b may include, for example, a H signal as the first signal and a L signal as the second signal.

The pixel circuit 10 may have, for example, the connection different state and the emitter number different mode as the normal mode.

For example, the normal setting mode may be a setting mode (also referred to as a third emitter number different mode) in which the first light emitter 12a and the second light emitter 12b connected in parallel are both in the emissive state and one of the third light emitter 22a or the fourth light emitter 22b connected in series is selectively in the emissive state. In this case, for example, the normal setting mode sets, in the same or similar manner as in the first embodiment and the second embodiment, both the first light emitter 12a and the second light emitter 12b connected in parallel in the first subpixel circuit 1 to the emissive state and causes both the first light emitter 12a and the second light emitter 12b to emit light. This may decrease the forward voltage applied to each of the first light emitter 12a and the second light emitter 12b to be lower than the voltage applied when one of the first light emitter 12a or the second light emitter 12b connected in parallel to have the same light intensity selectively emits light. This reduces gradations (uneven luminance), or a gradual decrease in the luminance of the display device 100, thus improving the image quality of the display device 100. This may also decrease the current flowing through each of the first light emitter 12a and the second light emitter 12b to substantially half the current flowing when, for example, one the first light emitter 12a and the second light emitter 12b connected in parallel to have the same light intensity selectively emits light. The first light emitter 12a and the second light emitter 12b are thus, for example, less likely to deteriorate over time. The display device 100 may thus have higher image quality.

For example, the normal setting mode may be a setting mode (also referred to as a fourth emitter number different mode) in which one of the first light emitter 12a or the second light emitter 12b connected in parallel is selectively in the emissive state and the third light emitter 22a and the fourth light emitter 22b connected in series are both in the emissive state. In this case, for example, the normal setting mode sets, in the same or similar manner as in the third embodiment and the fourth embodiment, both the third light emitter 22a and the fourth light emitter 22b connected in series in the second subpixel circuit 2 to the emissive state and causes both the third light emitter 22a and the fourth light emitter 22b to emit light. This may decrease the current flowing through each of the third light emitter 22a and the fourth light emitter 22b to substantially half the current flowing when, for example, one of the third light emitter 22a or the fourth light emitter 22b connected in series to have the same light intensity selectively emits light. This may reduce, for example, power consumption in the display device 100.

Thus, the pixel circuit 10 having, for example, at least one of the connection different state or the emitter number different mode may achieve higher performance when the first subpixel circuit 1 and the second subpixel circuit 2 have at least different component characteristics or different use conditions of the light emitters. In other words, for example, the pixel circuit 10 including the first subpixel circuit 1 and the second subpixel circuit 2 that are in at least one of the connection different state or the emitter number different state may improve the performance of the display device 100 when the first subpixel circuit 1 and the second subpixel circuit 2 have different component characteristics and different use conditions of the light emitters. When, for example, each of the first light emitter 12a and the second light emitter 12b emits light of the first color and each of the third light emitter 22a and the fourth light emitter 22b emits light of the second color, the pixel circuit 10 includes the first subpixel circuit 1 and the second subpixel circuit 2 that emit different colors of light. The display device 100 including such pixel circuits 10 may achieve higher performance when the first subpixel circuit 1 and the second subpixel circuit 2 have at least different component characteristics or different use conditions of the light emitters.

2-5. Sixth Embodiment

In each of the above embodiments, the first subpixel circuit 1, the second subpixel circuit 2, and the third subpixel circuit 3 may have, for example, the same or similar structure. Each of the first subpixel circuit 1, the second subpixel circuit 2, and the third subpixel circuit 3 may have the setting for the light emitters switchable between the first emission setting (both emissive setting) and the second emission setting (either emissive setting). In the example below, each of the second subpixel circuit 2 and the third subpixel circuit 3 has, for example, the same or similar structure to the first subpixel circuit 1. The first subpixel circuit 1 is thus described as an example. The light of the first color emitted by the light emitters in the first subpixel circuit 1, the light of the second color emitted by the light emitters in the second subpixel circuit 2, and the light of the third color emitted by the light emitters in the third subpixel circuit 3 may be different from one another.

First Example of Sixth Embodiment

Figures 26, 27:
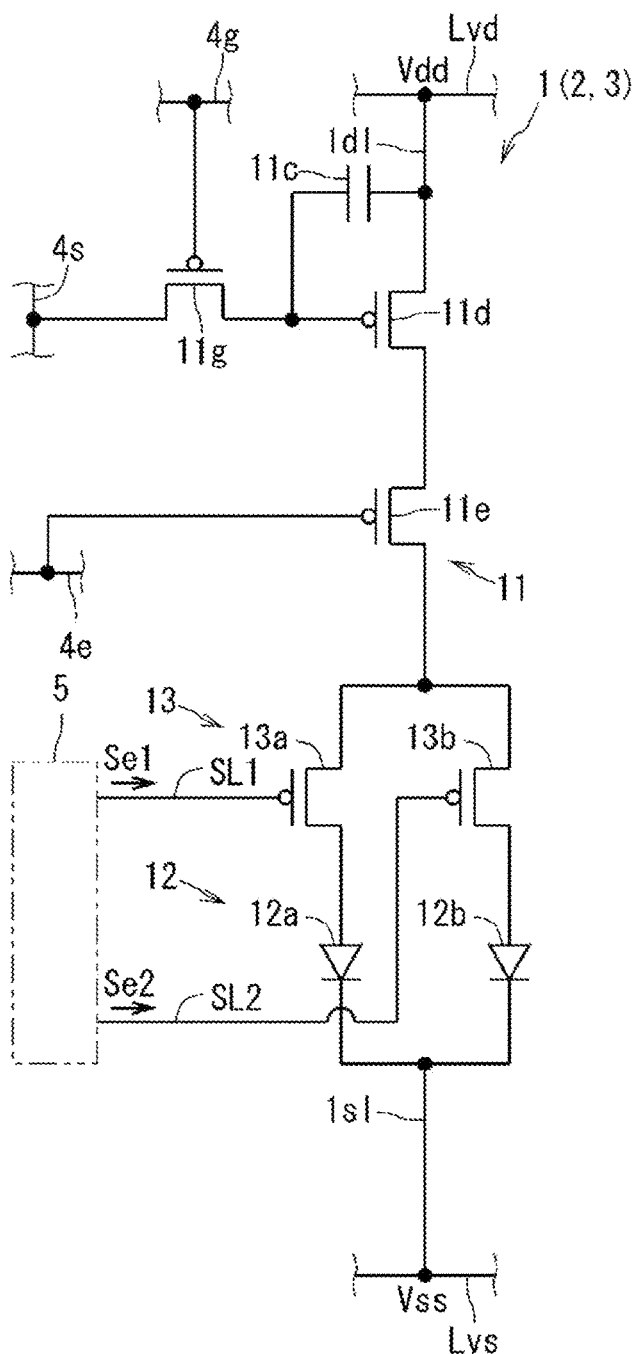
FIG. 26 is a circuit diagram of a first subpixel circuit in a first example of a sixth embodiment.
FIG. 27 is a truth table showing an example relationship between a switch signal, a setting control signal, and light emitter(s) set to the emissive state.

FIG. 26 is a circuit diagram of a first subpixel circuit 1 in a first example of a sixth embodiment. As illustrated in FIG. 26, in the first example of the sixth embodiment, the first subpixel circuit 1 has the same or similar structure as the first subpixel circuit 1 in the first embodiment. The first subpixel circuit 1 includes, for example, the first light emitter unit 12 and the first setter 13. The first subpixel circuit 1 includes, for example, the first emission controller 11. The first light emitter unit 12 includes, for example, the first light emitter 12a and the second light emitter 12b. For example, the first light emitter 12a and the second light emitter 12b are connected in parallel. The first setter 13 can selectively set, for example, each of the first light emitter 12a and the second light emitter 12b to one of the emissive state in which the light emitters can emit light or the non-emissive state in which the light emitters cannot emit light. The first setter 13 includes, for example, the fourth transistor 13a as the first switch and the fifth transistor 13b as the second switch. The fourth transistor 13a is connected in series to, for example, the first light emitter 12a. The fifth transistor 13b is connected in series to, for example, the second light emitter 12b. The fourth transistor 13a and the fifth transistor 13b are, for example, p-channel transistors.

The first setter 13 can set, for example, both the first light emitter 12a and the second light emitter 12b to the emissive state by switching both the fourth transistor 13a as the first switch and the fifth transistor 13b as the second switch to the conductive state. This allows, for example, both the first light emitter 12a and the second light emitter 12b connected in parallel in the first subpixel circuit 1 to emit light to improve the usage of the light emitters used for light emission in the pixel circuit 10, the display panel 100p, and the display device 100. This reduces, for example, an excess number of light emitters to be arranged wastefully. This also reduces, for example, the current flowing through each of the first light emitter 12a and the second light emitter 12b, which are thus less likely to deteriorate over time. This may improve the image quality of the display device 100.

The first setter 13 can set, for example, the first light emitter 12a to the emissive state by switching the fourth transistor 13a as the first switch to the conductive state and set the second light emitter 12b to the non-emissive state by switching the fifth transistor 13b as the second switch to the nonconductive state. The first setter 13 can set, for example, the first light emitter 12a to the non-emissive state by switching the fourth transistor 13a as the first switch to the nonconductive state and set the second light emitter 12b to the emissive state by switching the fifth transistor 13b as the second switch to the conductive state. This structure allows, for example, selective emission of one of the first light emitter 12a or the second light emitter 12b that has no emission failure.

The first setter 13 can set, for example, each of the first light emitter 12a and the second light emitter 12b to one of the emissive state or the non-emissive state in response to a setting control signal from the setting controller 5. The gate electrode of the fourth transistor 13a is connected to, for example, the setting controller 5 with the first setting control signal line SL1. The gate electrode of the fifth transistor 13b is connected to, for example, the setting controller 5 with the second setting control signal line SL2. The setting controller 5 includes, for example, the multiple signal output circuits 51 and the combination circuit 52. The setting controller 5 may be located for, for example, each first subpixel circuit 1, each pixel circuit 10, or each set of pixel circuits 10.

FIG. 27 is a table showing an example relationship between the switch signal Si input into the combination circuit 52, the setting control signal output from the combination circuit 52, and the light emitter(s) set to the emissive state. The combination circuit 52 in this example yields various logical outputs to cause the inputs of the first switch signal Si0 and the second switch signal Si1 to be in the relationship with the outputs of the first setting control signal Se1 and the second setting control signal Se2 in the manner shown in FIG. 27. As shown in the example in FIG. 27, three logical output patterns (more specifically, patterns 1I to 3I) may be yielded as combinations of the inputs of the first switch signal Si0 and the second switch signal Si1 and the outputs of the first setting control signal Se1 and the second setting control signal Se2.

When, for example, pattern 1I is used, in response to a L signal as the first switch signal Si0 and a L signal as the second switch signal Si1, the combination circuit 52 outputs a L signal that is the first signal as the first setting control signal Se1 and a L signal that is the first signal as the second setting control signal Se2. In this case, the first setter 13 sets, for example, both the first light emitter 12a and the second light emitter 12b to the emissive state by switching both the fourth transistor 13a as the first switch and the fifth transistor 13b as the second switch to the conductive state. This sets, example, the first light emitter 12a and the second light emitter 12b to the emissive state.

When, for example, pattern 2I is used, in response to a L signal as the first switch signal Si0 and a H signal as the second switch signal Si1, the combination circuit 52 outputs a L signal that is the first signal as the first setting control signal Se1 and a H signal that is the second signal as the second setting control signal Se2. The first setter 13 sets, for example, the first light emitter 12a to the emissive state by switching the fourth transistor 13a as the first switch to the conductive state and sets the second light emitter 12b to the non-emissive state by switching the fifth transistor 13b as the second switch to the nonconductive state. This allows, for example, the first light emitter 12a with no emission failure in the first subpixel circuit 1 to emit light selectively from the first light emitter 12a and the second light emitter 12b.

When, for example, pattern 3I is used, in response to a H signal as the first switch signal Si0 and a L signal as the second switch signal Si1, the combination circuit 52 outputs a H signal that is the second signal as the first setting control signal Se1 and a L signal that is the first signal as the second setting control signal Se2. The first setter 13 sets, for example, the first light emitter 12a to the non-emissive state by switching the fourth transistor 13a as the first switch to the nonconductive state and sets the second light emitter 12b to the missive state by switching the fifth transistor 13b as the second switch to the conductive state. This allows, for example, the second light emitter 12b with no emission failure in the first subpixel circuit 1 to emit light selectively from the first light emitter 12a and the second light emitter 12b.

The fourth transistor 13a as the first switch may be, for example, an n-channel transistor. In this case, the setting control signal input into the gate electrode of the fourth transistor 13a includes, for example, a H signal as the first signal or a L signal as the second signal. The fifth transistor 13b as the second switch may be, for example, an n-channel transistor. In this case, the setting control signal input into the gate electrode of the fifth transistor 13b includes, for example, a H signal as the first signal or a L signal as the second signal.

Second Example of Sixth Embodiment

Figure 28:
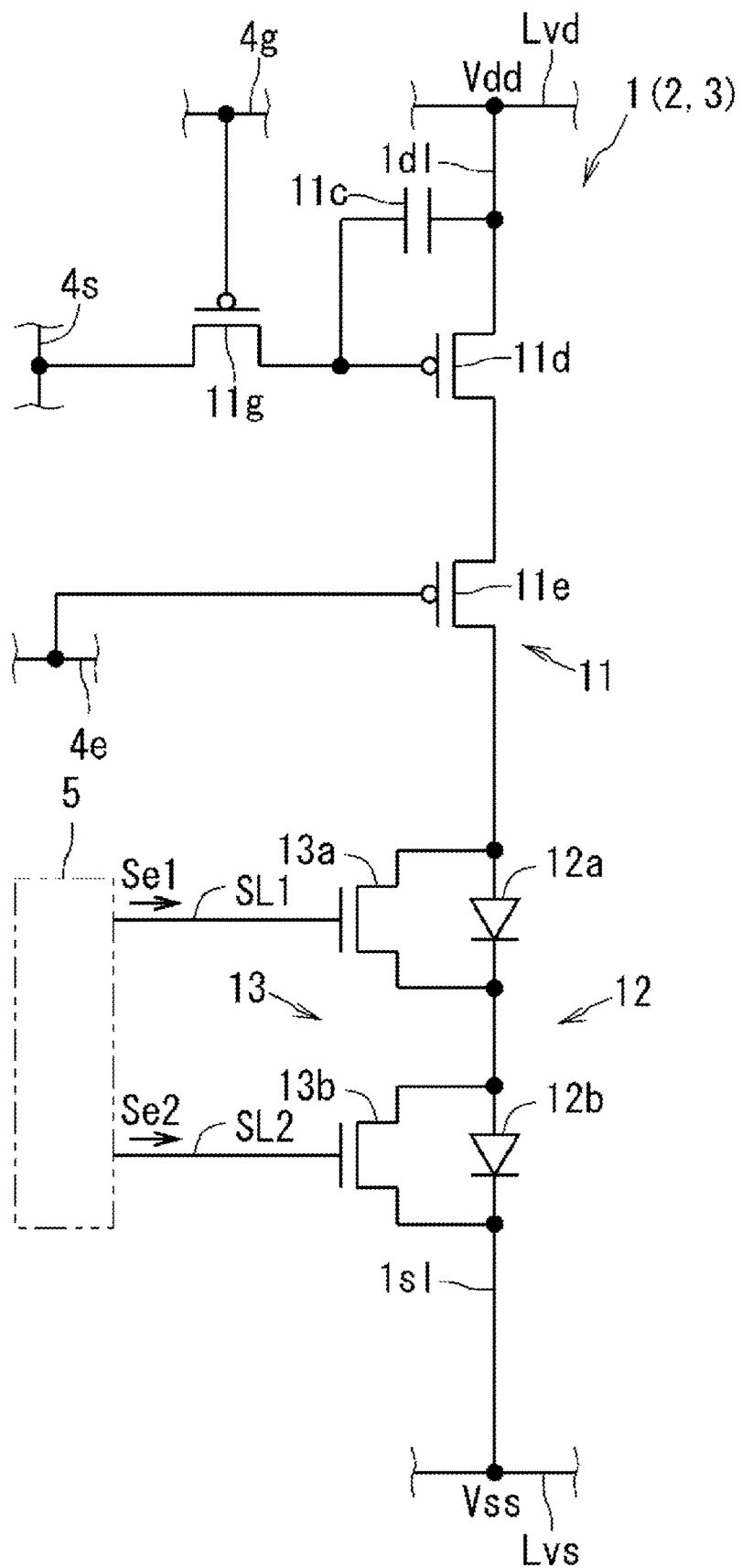
FIG. 28 is a circuit diagram of a first subpixel circuit in a second example of the sixth embodiment.

FIG. 28 is a circuit diagram of a first subpixel circuit 1 in a second example of the sixth embodiment. As illustrated in FIG. 28, in the second example of the sixth embodiment, the first subpixel circuit 1 has the same or similar structure as the first subpixel circuit 1 in the third embodiment. The first subpixel circuit 1 includes, for example, the first light emitter unit 12 and the first setter 13. The first subpixel circuit 1 includes, for example, the first emission controller 11. The first light emitter unit 12 includes, for example, the first light emitter 12a and the second light emitter 12b. The first light emitter 12a and the second light emitter 12b are connected in, for example, series. The first setter 13 can selectively set, for example, each of the first light emitter 12a and the second light emitter 12b to one of the emissive state in which the light emitters can emit light or the non-emissive state in which the light emitters cannot emit light. The first setter 13 includes, for example, the fourth transistor 13a as the first switch and the fifth transistor 13b as the second switch. The fourth transistor 13a is connected in parallel to, for example, the first light emitter 12a. The fifth transistor 13b is connected in parallel to, for example, the second light emitter 12b. The fourth transistor 13a and the fifth transistor 13b may be, for example, n-channel transistors.

The first setter 13 can set, for example, both the first light emitter 12a and the second light emitter 12b to the emissive state by switching both the fourth transistor 13a as the first switch and the fifth transistor 13b as the second switch to the nonconductive state. The first setter 13 can set, for example, the first light emitter 12a to the emissive state by switching the fourth transistor 13a as the first switch to the nonconductive state and set the second light emitter 12b to the non-emissive state by switching the fifth transistor 13b as the second switch to the conductive state. The first setter 13 can set, for example, the first light emitter 12a to the non-emissive state by switching the fourth transistor 13a as the first switch to the conductive state and set the second light emitter 12b to the emissive state by switching the fifth transistor 13b as the second switch to the nonconductive state. This structure allows, for example, selective emission of one of the first light emitter 12a or the second light emitter 12b that has no emission failure in the first subpixel circuit 1.

The first setter 13 can set, for example, each of the first light emitter 12a and the second light emitter 12b to one of the emissive state or the non-emissive state in response to a setting control signal from the setting controller 5. The gate electrode of the fourth transistor 13a is connected to, for example, the setting controller 5 with the first setting control signal line SL1. The gate electrode of the fifth transistor 13b is connected to, for example, the setting controller 5 with the second setting control signal line SL2. The setting controller 5 includes, for example, the multiple signal output circuits 51 and the combination circuit 52. The setting controller 5 may be located for, for example, each first subpixel circuit 1, each pixel circuit 10, or each set of pixel circuits 10.

In this example well, as shown in FIG. 27, three logical output patterns (more specifically, patterns 1I to 3I) may be yielded as combinations of the inputs of the first switch signal Si0 and the second switch signal Si1 and the outputs of the first setting control signal Se1 and the second setting control signal Se2.

When, for example, pattern 1I is used, in response to a L signal as the first switch signal Si0 and a L signal as the second switch signal Si1, the combination circuit 52 outputs a L signal that is the first signal as the first setting control signal Se1 and a L signal that is the first signal as the second setting control signal Se2. The first setter 13 sets, for example, both the first light emitter 12a and the second light emitter 12b to the emissive state by switching both the fourth transistor 13a as the first switch and the fifth transistor 13b as the second switch to the nonconductive state. This sets, example, the first light emitter 12a and the second light emitter 12b to the emissive state.

When, for example, pattern 2I is used, in response to a L signal as the first switch signal Si0 and a H signal as the second switch signal Si1, the combination circuit 52 outputs a L signal that is the first signal as the first setting control signal Se1 and a H signal that is the second signal as the second setting control signal Se2. The first setter 13 sets, for example, the first light emitter 12a to the emissive state by switching the fourth transistor 13a as the first switch to the nonconductive state and sets the second light emitter 12b to the non-emissive state by switching the fifth transistor 13b as the second switch to the conductive state. This allows, for example, the first light emitter 12a with no emission failure in the first subpixel circuit 1 to emit light selectively from the first light emitter 12a and the second light emitter 12b.

When, for example, pattern 3I is used, in response to a H signal as the first switch signal Si0 and a L signal as the second switch signal Si1, the combination circuit 52 outputs a H signal that is the second signal as the first setting control signal Se1 and a L signal that is the first signal as the second setting control signal Se2. The first setter 13 sets, for example, the first light emitter 12a to the non-emissive state by switching the fourth transistor 13a as the first switch to the conductive state and sets the second light emitter 12b to the missive state by switching the fifth transistor 13b as the second switch to the nonconductive state. This allows, for example, the second light emitter 12b with no emission failure in the first subpixel circuit 1 to emit light selectively from the first light emitter 12a and the second light emitter 12b.

The fourth transistor 13a as the first switch may be, for example, a p-channel transistor. In this case, the setting control signal input into the gate electrode of the fourth transistor 13a may include, for example, a H signal as the first signal and a L signal as the second signal. The fifth transistor 13b as the second switch may be a p-channel transistor. In this case, the setting control signal input into the gate electrode of the fifth transistor 13b may include, for example, a H signal as the first signal and a L signal as the second signal.

2-6. Seventh Embodiment

Figure 39:
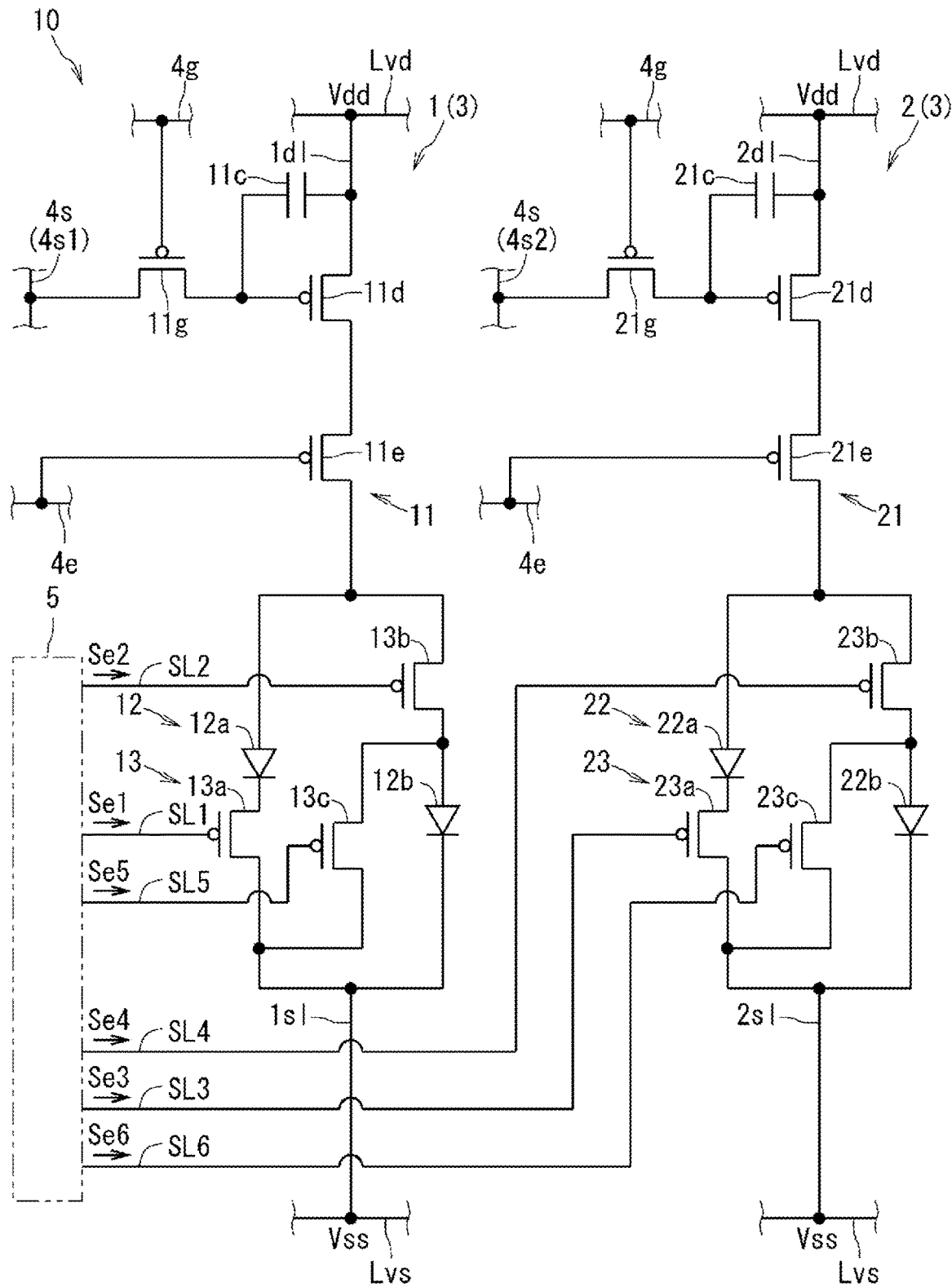
FIG. 39 is a circuit diagram of an example pixel circuit according to a seventh embodiment.

FIG. 39 is a circuit diagram of an example pixel circuit 10 according to a seventh embodiment. The pixel circuit 10 according to the seventh embodiment is altered from the pixel circuit 10 according to the first embodiment illustrated in FIG. 4, with the structures of the first setter 13 in the first subpixel circuit 1 and the second setter 23 in the second subpixel circuit 2 being changed. The first setter 13 allows the connection between the first light emitter 12a and the second light emitter 12b to be settable selectively to one of a series connection or a parallel connection. In other words, the connection between the first light emitter 12a and the second light emitter 12b is settable selectively to one of a series connection or a parallel connection. The second setter 23 allows the connection between the third light emitter 22a and the fourth light emitter 22b to be settable selectively to one of a series connection or a parallel connection. In other words, the connection between the third light emitter 22a and the fourth light emitter 22b is settable selectively to one of a series connection or a parallel connection.

In the first setter 13, the fourth transistor 13a includes the source electrode connected to the negative electrode of the first light emitter 12a. The first setter 13 includes an eleventh transistor 13c connecting the drain electrode of the fourth transistor 13a and the drain electrode of the fifth transistor 13b. The eleventh transistor 13c is a switch (also referred to as a first connection select switch) operable to connect the first light emitter 12a and the second light emitter 12b selectively in series or in parallel. The eleventh transistor 13c includes the source electrode connected to the drain electrode of the fourth transistor 13a and the drain electrode connected to the drain electrode of the fifth transistor 13b. In this case, the gate voltage of the fourth transistor 13a is controlled with the first setting control signal Se1. The gate voltage of the fifth transistor 13b is controlled with the second setting control signal Se2. The gate voltage of the eleventh transistor 13c is controlled with a fifth setting control signal Se5 transmitted from the setting controller 5 through a signal line (also referred to as a fifth setting control signal line) SL5 connected to the setting controller 5. This allows the connection between the first light emitter 12a and the second light emitter 12b to be settable selectively to one of a series connection or a parallel connection.

For the first light emitter 12a and the second light emitter 12b connected in series, for example, the states of the fourth transistor 13a, the fifth transistor 13b, and the eleventh transistor 13c are set in the manner described below. The fourth transistor 13a is set to the conductive state (also referred to as an on-state) in response to a L signal that is the first signal as the first setting control signal Se1 input from the setting controller 5 into the gate electrode to allow a current to flow through the source electrode and the drain electrode. The fifth transistor 13b is set to the nonconductive state (also referred to as an off-state) in response to a H signal that is the second signal as the second setting control signal Se2 input from the setting controller 5 to the gate electrode to allow no current to flow through the source electrode and the drain electrode. The eleventh transistor 13c is set to the conductive state (on-state) in response to a L signal that is the first signal as the fifth setting control signal Se5 input from the setting controller 5 to the gate electrode.

For the first light emitter 12a and the second light emitter 12b connected in parallel, for example, the states of the fourth transistor 13a, the fifth transistor 13b, and the eleventh transistor 13c are set in the manner described below. The fourth transistor 13a is set to the conductive state (on-state) in response to a L signal that is the first signal as the first setting control signal Se1 input from the setting controller 5 into the gate electrode. The fifth transistor 13b is set to the conductive state (on-state) in response to a L signal that is the first signal as the second setting control signal Se2 input from the setting controller 5 to the gate electrode. The eleventh transistor 13c is set to the nonconductive state (off-state) in response to a H signal that is the second signal as the fifth setting control signal Se5 input from the setting controller 5 to the gate electrode.

The first setter 13 can set one of the first light emitter 12a or the second light emitter 12b to the emissive state and the other to be non-emissive state. In other words, the first setter 13 can selectively set each of the first light emitter 12a and the second light emitter 12b to one of the emissive state or the non-emissive state in response to the setting control signals such as the first setting control signal Se1, the second setting control signal Se2, and the fifth setting control signal Se5 from the setting controller 5.

To set, for example, the first light emitter 12a to the emissive state and the second light emitter 12b to the non-emissive state, the states of the fourth transistor 13a, the fifth transistor 13b, and the eleventh transistor 13c are set in the manner described below. The fourth transistor 13a is set to the conductive state (on-state) in response to a L signal that is the first signal as the first setting control signal Se1 input from the setting controller 5 into the gate electrode. The fifth transistor 13b is set to the nonconductive state (off-state) in response to a H signal that is the second signal as the second setting control signal Se2 input from the setting controller 5 to the gate electrode. The eleventh transistor 13c is set to the nonconductive state (off-state) in response to a H signal that is the second signal as the fifth setting control signal Se5 input from the setting controller 5 to the gate electrode.

To set, for example, the first light emitter 12a to the non-emissive state and the second light emitter 12b to the emissive state, the states of the fourth transistor 13a, the fifth transistor 13b, and the eleventh transistor 13c are set in the manner described below. The fourth transistor 13a is set to the nonconductive state (off-state) in response to a H signal that is the second signal as the first setting control signal Se1 input from the setting controller 5 into the gate electrode. The fifth transistor 13b is set to the conductive state (on-state) in response to a L signal that is the first signal as the second setting control signal Se2 input from the setting controller 5 to the gate electrode. The eleventh transistor 13c is set to the nonconductive state (off-state) in response to a H signal that is the second signal as the fifth setting control signal Se5 input from the setting controller 5 to the gate electrode.

The second setter 23 in the second subpixel circuit 2 has the same or similar structure and functions as the first setter 13 in the first subpixel circuit 1. The second setter 23 will not be described in detail. The second setter 23 includes a twelfth transistor 23c corresponding to the eleventh transistor 13c. The twelfth transistor 23c is a switch (also referred to as a second connection select switch) operable to connect the third light emitter 22a and the fourth light emitter 22b selectively in series or in parallel. In the second setter 23, the ninth transistor 23a corresponds to the fourth transistor 13a, and the tenth transistor 23b corresponds to the fifth transistor 13b. In this case, the gate voltage of the ninth transistor 23a is controlled by the third setting control signal Se3. The gate voltage of the tenth transistor 23b is controlled by the fourth setting control signal Se4. The gate voltage of the twelfth transistor 23c is controlled by a sixth setting control signal Se6 transmitted from the setting controller 5 through a signal line (also referred to as a sixth setting control signal line) SL6 connected to the setting controller 5. This allows the connection between the third light emitter 22a and the fourth light emitter 22b to be set selectively to one of a series connection or a parallel connection. The second setter 23 can set one of the third light emitter 22a or the fourth light emitter 22b to the emissive state and the other to be non-emissive state. In other words, the second setter 23 can selectively set each of the third light emitter 22a and the fourth light emitter 22b to one of the emissive state or the non-emissive state in response to the setting control signals such as the third setting control signal Se3, the fourth setting control signal Se4, and the sixth setting control signal Se6 from the setting controller 5.

In the example in FIG. 39, the eleventh transistor 13c and the twelfth transistor 23c are p-channel transistors, but are not limited to p-channel transistors. The eleventh transistor 13c may be replaced with an n-channel transistor. The twelfth transistor 23c may be replaced with an n-channel transistor. In other words, each of the eleventh transistor 13c and the twelfth transistor 23c may be either a p-channel transistor or an n-channel transistor.

3. Others

In each of the above embodiments, the first emission controller 11 and the second emission controller 21 may be replaced with any circuit component as appropriate.

First Variation of Emission Controller

In each of the above embodiments, the second transistor 11d in the first subpixel circuit 1 may be, for example, an n-channel transistor. In this case, for example, the first emission controller 11, the first setter 13, and the first light emitter unit 12 may be arranged between the first power line Lvd and the second power line Lvs in the order opposite to the order in each of the above embodiments. In each of the above embodiments, the seventh transistor 21d in the second subpixel circuit 2 may be, for example, an n-channel transistor. In this case, for example, the second emission controller 21, the second setter 23, and the second light emitter unit 22 may be arranged between the first power line Lvd and the second power line Lvs in the order opposite to the order in each of the above embodiments. The first subpixel circuit 1 and the second subpixel circuit 2 may have the same or similar circuit configuration. In the example described below, the second transistor 11d in the first subpixel circuit 1 is an n-channel transistor.

Figure 29:
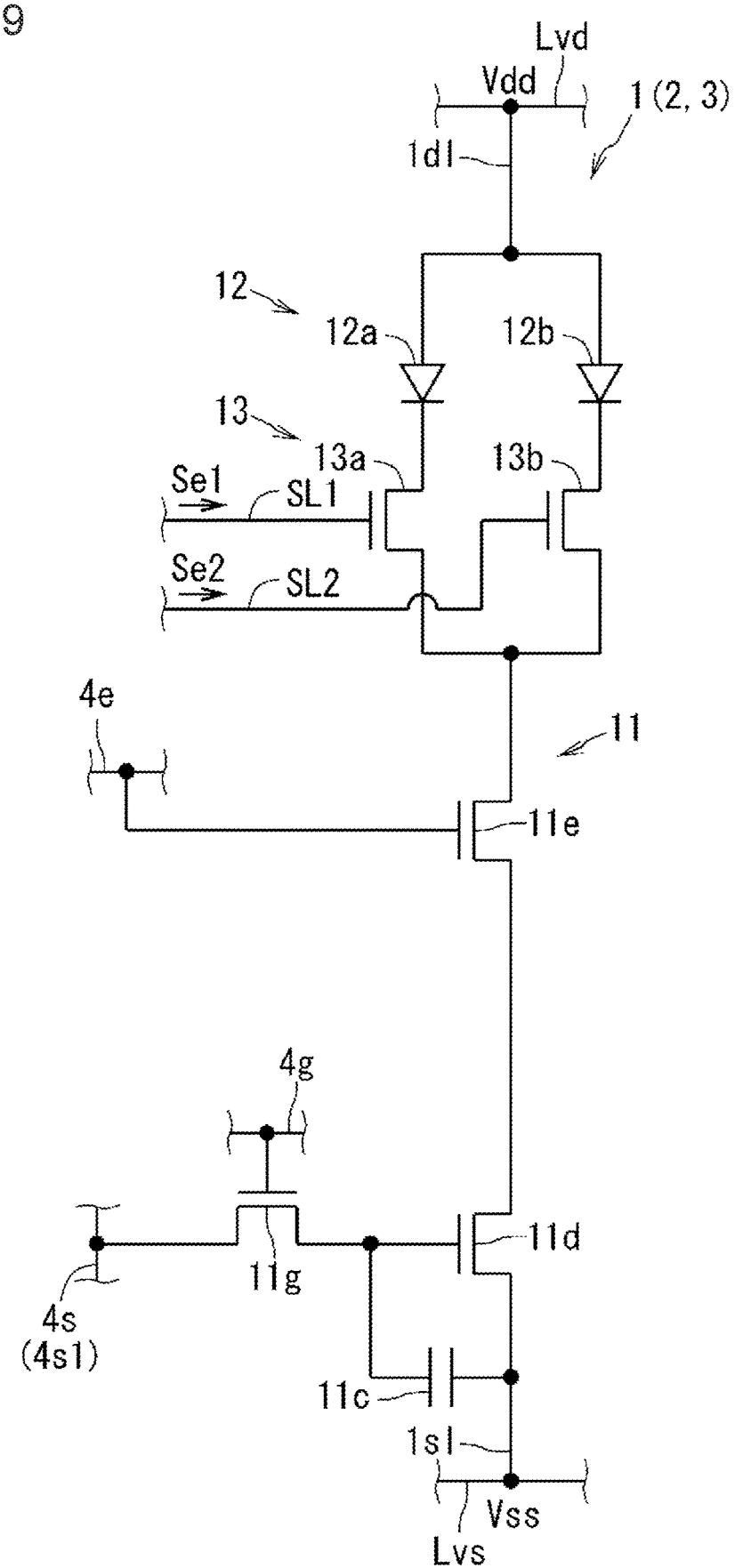
FIG. 29 is a circuit diagram of an example first subpixel circuit including an n-channel transistor as a second transistor.

FIG. 29 is a circuit diagram of an example first subpixel circuit 1 including an n-channel transistor as the second transistor. The first subpixel circuit 1 illustrated in FIG. 29 may be used in, for example, the first embodiment, the second embodiment, the fifth embodiment, and the first example of the sixth embodiment. In the example in FIG. 29, each of the first transistor 11g, the second transistor 11d, the third transistor 11e, the fourth transistor 13a, and the fifth transistor 13b is an n-channel transistor.

In this example, the first light emitter 12a and the second light emitter 12b are connected in parallel. The first light emitter unit 12 is connected to the first power line Lvd with the first anode potential input line 1d1. More specifically, the positive electrode as a first electrode of each of the first light emitter 12a and the second light emitter 12b is connected to the first power line Lvd with the first anode potential input line 1d1. The first light emitter unit 12 is also connected to the second power line Lvs as a power line on the cathode potential end through the first setter 13, the first emission controller 11, and the first cathode potential input line 1s1. More specifically, the negative electrode as a second electrode of each of the first light emitter 12a and the second light emitter 12b is connected to the second power line Lvs through the first setter 13, the first emission controller 11, and the first cathode potential input line 1s1.

In the first emission controller 11, the first transistor 11g includes the gate electrode connected to the scanning signal line 4g, the drain electrode (source electrode) connected to the first image signal line 4s1, the source electrode (drain electrode) connected to the gate electrode of the second transistor 11d. In response to an on-signal (H signal in this example) as a scanning signal input from the scanning signal line 4g into the gate electrode, the first transistor 11g enters the conductive state to allow a current to flow through the drain electrode and the source electrode. This causes an image signal from the first image signal line 4s1 to be provided to the gate electrode of the second transistor 11d through the first transistor 11g. The second transistor 11d includes the source electrode connected to the first cathode potential input line 1s1 and the drain electrode connected to the first anode potential input line 1d1 through the third transistor 11e, the first setter 13, and the first light emitter unit 12. The second transistor 11d enters the conductive state in response to a H signal as the image signal from the first image signal line 4s1 input into the gate electrode to allow a current to flow through the drain electrode and the source electrode. This allows a drive current to flow from the first anode potential input line 1d1 to the first light emitter unit 12. The first light emitter unit 12 may have the light intensity (luminance) controllable based on the level (potential) of the image signal. The first capacitor 11c is located on the connection line connecting the gate electrode and the source electrode of the second transistor 11d. The third transistor 11e is located on the connection line (first drive line) connecting the second transistor 11d and the first light emitter unit 12. The third transistor 11e includes the source electrode connected to the drain electrode of the second transistor 11d and the drain electrode connected to the first light emitter unit 12 through the first setter 13. More specifically, the drain electrode of the third transistor 11e is connected to the negative electrode of each of the first light emitter 12a and the second light emitter 12b through the first setter 13. The gate electrode of the third transistor 11e is connected to the emission control signal line 4e. The third transistor 11e enters the conductive state in response to an on-signal (H signal in this example) as an emission control signal input from the emission control signal line 4e into the gate electrode to allow a current to flow through the drain electrode and the source electrode. This may allow a drive current to flow from the first anode potential input line 1d1 to the first light emitter unit 12 to cause the first light emitter unit 12 to emit light.

In the first setter 13, the fourth transistor 13a as the first switch is connected in series to the first light emitter 12a. The fourth transistor 13a includes the source electrode connected to the drain electrode of the third transistor 11e, the drain electrode connected to the negative electrode of the first light emitter 12a, and the gate electrode connected to the first setting control signal line SL1. The fourth transistor 13a enters the conductive state in response to a H signal that is the first signal as the first setting control signal Se1 input into the gate electrode through the first setting control signal line SL1 to allow a current to flow through the drain electrode and the source electrode. This sets the first light emitter 12a to the emissive state. The fourth transistor 13a enters the nonconductive state in response to a L signal that is the second signal as the first setting control signal Se1 input into the gate electrode through the first setting control signal line SL1 to allow no current to flow through the drain electrode and the source electrode. This sets the first light emitter 12a to the non-emissive state. The fifth transistor 13b as the second switch is connected in series to the second light emitter 12b. The fifth transistor 13b includes the source electrode connected to the drain electrode of the third transistor 11e, the drain electrode connected to the negative electrode of the second light emitter 12b, and the gate electrode connected to the second setting control signal line SL2. The fifth transistor 13b enters the conductive state in response to a H signal that is the first signal as the second setting control signal Se2 input into the gate electrode through the second setting control signal line SL2 to allow a current to flow through the drain electrode and the source electrode. This sets the second light emitter 12b to the emissive state. The fifth transistor 13b enters the nonconductive state in response to a L signal that is the second signal as the second setting control signal Se2 input into the gate electrode through the second setting control signal line SL2 to allow no current to flow through the drain electrode and the source electrode. This sets the second light emitter 12b to the non-emissive state.

In the first subpixel circuit 1, the first setter 13 can set, for example, both the first light emitter 12a and the second light emitter 12b to the emissive state by switching both the fourth transistor 13a as the first switch and the fifth transistor 13b as the second switch to the conductive state. The fourth transistor 13a as the first switch may be located on, for example, the positive electrode end of the first light emitter 12a. In this case, the first light emitter 12a includes, for example, the negative electrode connected to the drain electrode of the third transistor 11e and the positive electrode connected to the first power line Lvd through the fourth transistor 13a as the first switch and the first anode potential input line 1d1. More specifically, the fourth transistor 13a includes, for example, the source electrode connected to the positive electrode of the first light emitter 12a and the drain electrode connected to the first power line Lvd with the first anode potential input line 1d1. The fifth transistor 13b as the second switch may be located on, for example, the positive electrode end of the second light emitter 12b. In this case, the second light emitter 12b includes, for example, the negative electrode connected to the drain electrode of the third transistor 11e and the positive electrode connected to the first power line Lvd through the fifth transistor 13b as the second switch and the first anode potential input line 1d1. More specifically, the fifth transistor 13b includes, for example, the source electrode connected to the positive electrode of the second light emitter 12b and the drain electrode connected to the first power line Lvd with the first anode potential input line 1d1.

In each of the first embodiment, the second embodiment, and the first example of the sixth embodiment, each of the second subpixel circuit 2 and the third subpixel circuit 3 may have the same or similar circuit configuration as the first subpixel circuit 1 illustrated in FIG. 29. In this case, in the second subpixel circuit 2 and the third subpixel circuit 3, the first setter 13 can set, for example, one of the first light emitter 12a or the second light emitter 12b to the emissive state by switching one switch of the ninth transistor 23a as the third switch or the tenth transistor 23b as the fourth switch to the conductive state.

Second Variation of Emission Controller

In each of the above embodiments, the first emission controller 11 in the first subpixel circuit 1 may incorporate, for example, at least one circuit having various functions, such as a circuit that corrects the level (or potential) of an image signal based on a threshold voltage of a drive element (also referred to as a threshold voltage correction circuit). In each of the above embodiments, the second emission controller 21 in the second subpixel circuit 2 may incorporate, for example, at least one circuit having various functions such as a threshold voltage correction circuit. The first subpixel circuit 1 and the second subpixel circuit 2 can each incorporate, for example, the same or similar circuit. In the specific example described below, the first subpixel circuit 1 incorporates a threshold voltage correction circuit.

Figure 30:
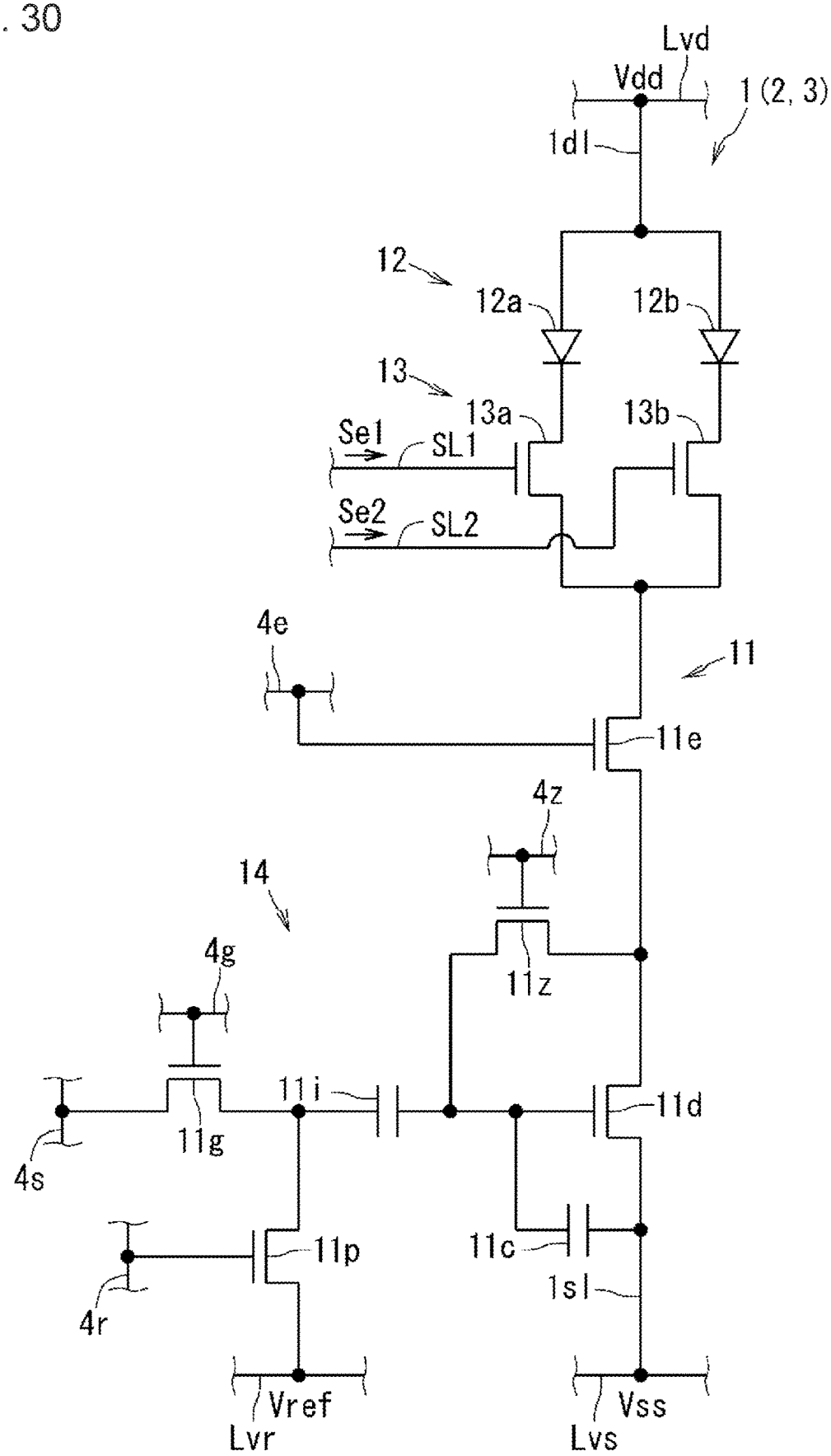
FIG. 30 is a circuit diagram of an example first subpixel circuit incorporating a threshold voltage correction circuit.

FIG. 30 is a circuit diagram of an example first subpixel circuit 1 incorporating a threshold voltage correction circuit 14. Each of the second subpixel circuit 2 and the third subpixel circuit 3 may incorporate, for example, the threshold voltage correction circuit 14 illustrated in FIG. 30. The first subpixel circuit 1 illustrated in FIG. 30 includes the threshold voltage correction circuit 14 in addition to the components of the first subpixel circuit 1 illustrated in FIG. 29. As illustrated in FIG. 30, the threshold voltage correction circuit 14 includes, for example, a correction transistor (also referred to as a first correction transistor) 11p as a fifth switch, a correction transistor (also referred to as a second correction transistor) 11z as a sixth switch, and a correction capacitor 11i. The correction capacitor 11i is located on the connection line connecting the first transistor 11g and the gate electrode of the second transistor 11d. The first correction transistor 11p applies a reference potential Vref to the gate electrode of the second transistor 11d through the correction capacitor 11i. The first correction transistor 11p may be, for example, an n-channel transistor. In this case, for example, the gate electrode of the first correction transistor 11p is connected to a signal line (also referred to as a first on-off switch signal line) 4r that provides a signal (also referred to as a first on-off switch signal line) for switching the first correction transistor 11p between the conductive state and the nonconductive state. The first on-off switch signal line 4r receives, for example, a signal from the drive 30 through a predetermined wire. The drain electrode of the first correction transistor 11p is connected to, for example, a power line (also referred to as a third power line) Lvr to supply the reference potential Vref. The third power line Lvr is connected to, for example, a power supply that supplies the reference potential to the third power line Lvr. The reference potential is, for example, a predetermined positive potential. The source electrode of the first correction transistor 11p is connected to the connection line connecting the source electrode of the first transistor 11g and the correction capacitor 11i. The second correction transistor 11z is located on, for example, the connection line connecting the gate electrode of the second transistor 11d and the drain electrode of the second transistor 11d. The second correction transistor 11z can connect the gate electrode and the drain electrode of the second transistor 11d (form a diode connection). The second correction transistor 11z may be an n-channel transistor. In this case, the gate electrode of the second correction transistor 11z is connected to, for example, a signal line (also referred to as a second on-off switch signal line) 4z that provides a signal (also referred to as a second on-off switch signal line) for switching the second correction transistor 11z between the conductive state and the nonconductive state. The second on-off switch signal line 4z receives, for example, a signal from the drive 30 through a predetermined wire. The second correction transistor 11z includes the drain electrode connected to, for example, the gate electrode of the second transistor 11d and the source electrode connected to, for example, the drain electrode of the second transistor 11d.

Figure 31:
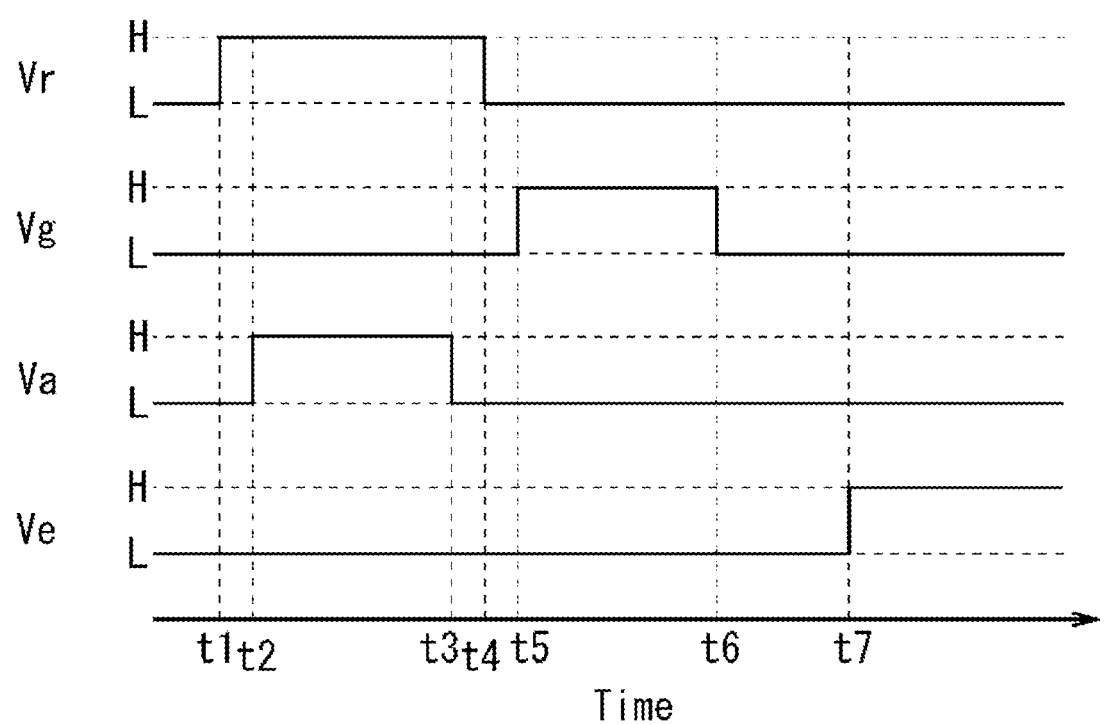
FIG. 31 is a timing chart of an example operation of the first subpixel circuit incorporating the threshold voltage correction circuit.

FIG. 31 is a timing chart showing an example operation of the first subpixel circuit 1 incorporating the threshold voltage correction circuit 14. FIG. 31 shows the trends over time of a potential Vr of the first on-off switch signal provided to the first on-off switch signal line 4r, a potential Vg of the scanning signal provided to the scanning signal line 4g, a potential Va of the second on-off switch signal provided to the second on-off switch signal line 4z, and a potential Ve of the emission control signal provided to the emission control signal line 4e when the first subpixel circuit 1 emits light once in response to an image signal. As shown in FIG. 31, the operations in (i) to (vii) described below are performed in sequence.

(i) At time t1, the first correction transistor 11p enters the conductive state in response to a H signal input into the gate electrode through the first on-off switch signal line 4r to allow a current to flow through the source electrode and the drain electrode. In this state, the gate electrode of the second transistor 11d receives a positive potential corresponding to the reference potential Vref through the correction capacitor 11i.

(ii) At time t2, the second correction transistor 11z enters the conductive state in response to a H signal input into the gate electrode through the second on-off switch signal line 4z to allow a current to flow through the source electrode and the drain electrode. In this state, the second transistor 11d is in diode connection in which the gate electrode and the drain electrode of the second transistor 11d are connected. This causes a current to flow through the second transistor 11d from the gate electrode to the source electrode through the drain electrode until the voltage Vgs across the gate electrode and the source electrode of the second transistor 11d reaches a threshold voltage Vth of the second transistor 11d.

(iii) At time t3, the second correction transistor 11z enters the nonconductive state in response to a L signals input into the gate electrode through the second on-off switch signal line 4z to allow no current to flow through the source electrode and the drain electrode. In this state, the gate voltage Vgs of the second transistor 11d is maintained at the threshold voltage Vth.

(iv) At time t4, the first correction transistor 11p enters the nonconductive state in response to a L signals input into the gate electrode through the first on-off switch signal line 4r to allow no current to flow through the source electrode and the drain electrode. In this state, the gate voltage Vgs of the second transistor 11d is maintained at the threshold voltage Vth with the first capacitor 11c.

At time t5, the first transistor 11g enters the conductive state in response to a H signal input into the gate electrode through the scanning signal line 4g to allow a current to flow through the source electrode and the drain electrode. In this state, the gate electrode of the second transistor 11d receives a potential corresponding to the potential Vsig of the image signal from the image signal line 4s through the first transistor 11g and the correction capacitor 11i. This allows, for example, the second transistor 11d to receive an input of the potential (refresh) of the image signal to have the gate voltage Vgs satisfying the relationship of Vgs=Vth+(Vsig−Vref). Thus, the gate voltage Vgs of the second transistor 11d corresponding to the potential of the image signal is compensated for based on the threshold voltage Vth of the second transistor 11d that differs for each first subpixel circuit 1. In this example, the voltage (Vsig−Vref) portion of the total gate voltage Vgs of the second transistor 11d controls the level of a current (also referred to as a drain current) Id flowing through the drain electrode and the source electrode of the second transistor 11d.

(vi) At time t6, the first transistor 11g enters the nonconductive state in response to a L signal input into the gate electrode through the scanning signal line 4g to allow no current to flow through the source electrode and the drain electrode. This ends the potential input (refresh) of the image signal into the second transistor 11d.

(vii) At time t7, the third transistor 11e enters the conductive state in response to a H signal input into the gate electrode through the emission control signal line 4e to allow a current to flow through the source electrode and the drain electrode. This allows a current corresponding to the gate voltage Vgs (substantially, the voltage (Vg−Vref)) of the second transistor 11d to flow through the second power line Lvs from the first power line Lvd, thus causing the first light emitter unit 12 to emit light. In this state, at least one of the first light emitter 12a or the second light emitter 12b in the first light emitter unit 12 emits light based on the conductive state or nonconductive state of the fourth transistor 13a and the fifth transistor 13b.

Third Variation of Emission Controller

In the first embodiment, the second embodiment, the fifth embodiment, and the first example of the sixth embodiment, the first emission controller 11 in the first subpixel circuit 1 may have, for example, a circuit configuration in which each component is replaced redundantly with two components as appropriate to correspond to the first light emitter 12a and the second light emitter 12b connected in parallel redundantly. For example, the first emission controller 11 may include two third transistors 11e, include two third transistors 11e and two second transistors 11d, or include two third transistors 11e, two second transistors 11d, and two first capacitors 11c. In the first embodiment and the second embodiment, the second emission controller 21 in the second subpixel circuit 2 may have, for example, a circuit configuration in which each component is replaced redundantly with two components as appropriate to correspond to the third light emitter 22a and the fourth light emitter 22b connected in parallel redundantly. For example, the second emission controller 21 may include two eighth transistors 21e, include two eighth transistors 21e and two seventh transistors 21d, or include two eighth transistors 21e, two seventh transistors 21d, and two second capacitors 21c. Each of the first emission controller 11 in the first subpixel circuit 1 and the second emission controller 21 in the second subpixel circuit 2 can have, for example, the circuit configuration in which each component is replaced redundantly with two components in the same or similar manner. In the specific example described below, the first emission controller 11 in the first subpixel circuit 1 has the circuit configuration in which each component is replaced redundantly with two elements.

Figure 32:
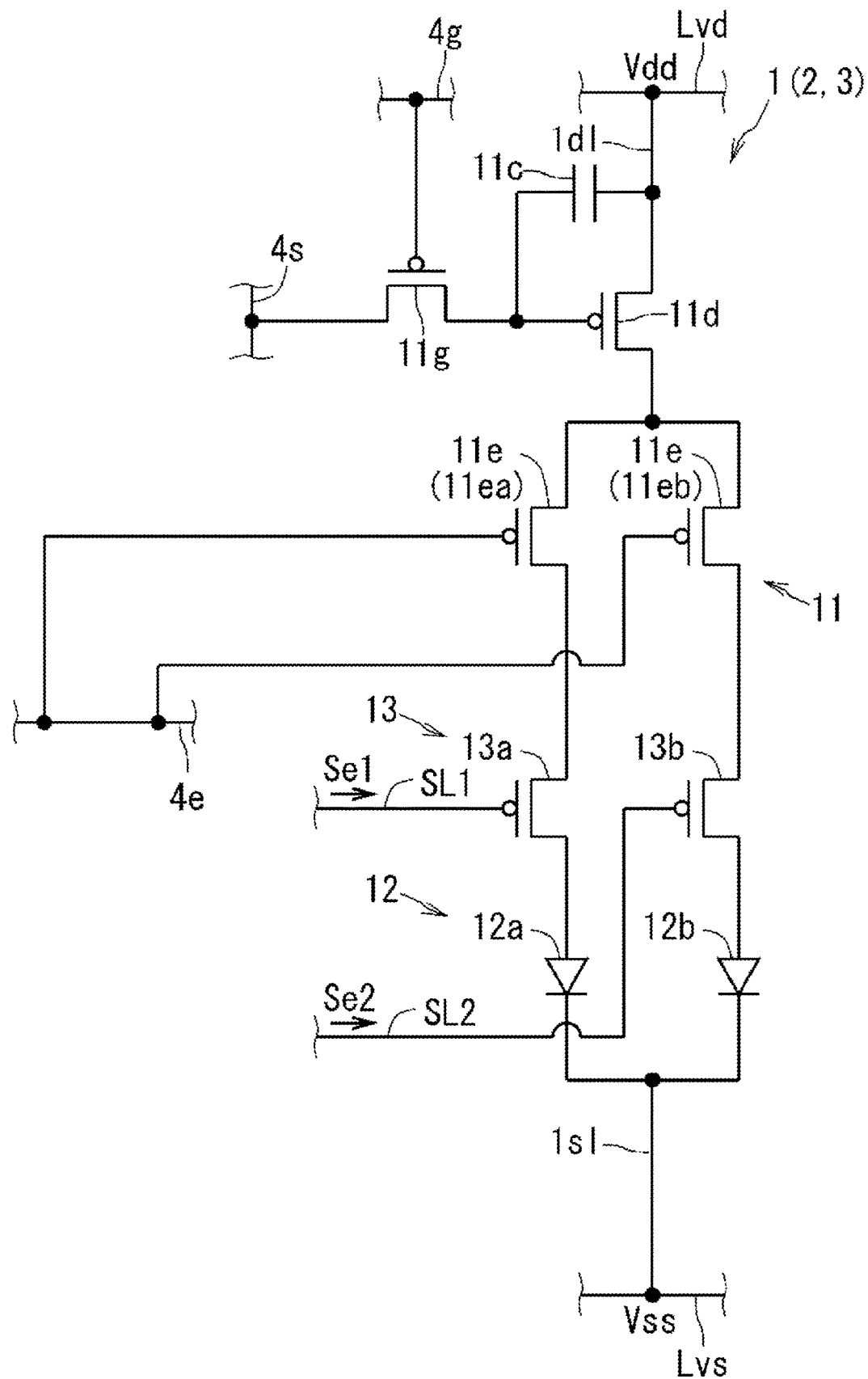
FIG. 32 is a circuit diagram of an example first subpixel circuit including two third transistors redundantly.

FIG. 32 is a circuit diagram of an example first subpixel circuit 1 including two third transistors 11e redundantly. As illustrated in FIG. 32, the two third transistors 11e include a third-A transistor 11ea and a third-B transistor 11eb. In this example, the third-A transistor 11ea, the fourth transistor 13a, and the first light emitter 12a that are connected in series are connected in parallel to the third-B transistor 11eb, the fifth transistor 13b, and the second light emitter 12b that are connected in series between the second transistor 11d and the first cathode potential input line 1s1. In the example in FIG. 32, the third-A transistor 11ea and the fourth transistor 13a are p-channel transistors. The third-A transistor 11ea includes the source electrode connected to the drain electrode of the second transistor 11d and the drain electrode connected to the source electrode of the fourth transistor 13a. The first light emitter 12a includes the positive electrode connected to the drain electrode of the fourth transistor 13a and the negative electrode connected to the first cathode potential input line 1s1. In the example in FIG. 32, the third-B transistor 11eb and the fifth transistor 13b are p-channel transistors. The third-B transistor 11eb includes the source electrode connected to the drain electrode of the second transistor 11d and the drain electrode connected to the source electrode of the fifth transistor 13b. The second light emitter 12b includes the positive electrode connected to the drain electrode of the fifth transistor 13b and the negative electrode connected to the first cathode potential input line 1s1. The third-A transistor 11ea, the fourth transistor 13a, and the first light emitter 12a may be connected in, for example, series in any order. The third-B transistor 11eb, the fifth transistor 13b, and the second light emitter 12b may be connected in series in any order. The gate electrode of the third-A transistor 11ea and the gate electrode of the third-B transistor 11eb are connected to, for example, the emission control signal line 4e.

Figure 33:
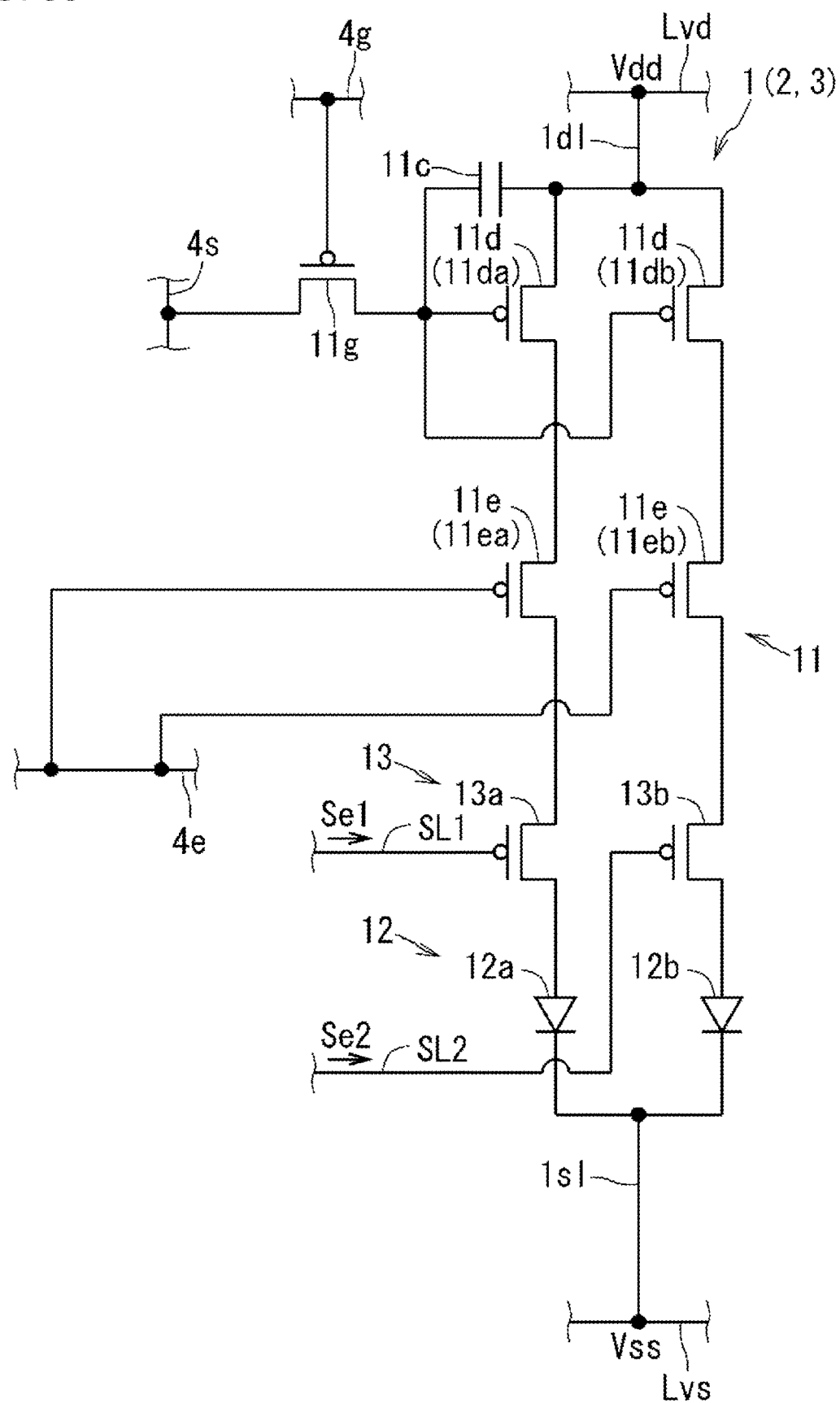
FIG. 33 is a circuit diagram of an example first subpixel circuit including two second transistors and two third transistors redundantly.

FIG. 33 is a circuit diagram of an example first subpixel circuit 1 including two second transistors 11d and two third transistors 11e redundantly. As illustrated in FIG. 33, the two second transistors 11d include a second-A transistor 11da and a second-B transistor 11db. The two third transistors 11e include a third-A transistor 11ea and a third-B transistor 11eb. In this example, the second-A transistor 11da, the third-A transistor 11ea, the fourth transistor 13a, and the first light emitter 12a that are connected in series are connected in parallel to the second-B transistor 11db, the third-B transistor 11eb, the fifth transistor 13b, and the second light emitter 12b that connected in series between the first anode potential input line 1d1 and the first cathode potential input line 1s1. In the example in FIG. 33, the second-A transistor 11da, the third-A transistor 11ea, and the fourth transistor 13a are p-channel transistors. The first anode potential input line 1d1 is connected to the source electrode of the second-A transistor 11da. The drain electrode of the second-A transistor 11da is connected to the source electrode of the third-A transistor 11ea. The drain electrode of the third-A transistor 11ea is connected to connected to the source electrode of the fourth transistor 13a. The drain electrode of the fourth transistor 13a is connected to the positive electrode of the first light emitter 12a. The negative electrode of the first light emitter 12a is connected to the first cathode potential input line 1s1. In the example in FIG. 33, the second-B transistor 11db, the third-B transistor 11eb, and the fifth transistor 13b are p-channel transistors. The first anode potential input line 1d1 is connected to the source electrode of the second-B transistor 11db. The drain electrode of the second-B transistor 11db is connected to the source electrode of the third-B transistor 11eb. The drain electrode of the third-B transistor 11eb is connected to the source electrode of the fifth transistor 13b. The drain electrode of the fifth transistor 13b is connected to the positive electrode of the second light emitter 12b. The negative electrode of the second light emitter 12b is connected to the first cathode potential input line 1s1. The second-A transistor 11da, the third-A transistor 11ea, the fourth transistor 13a, and the first light emitter 12a may be connected in, for example, series in any order. The second-B transistor 11db, the third-B transistor 11eb, the fifth transistor 13b, and the second light emitter 12b may be connected in series in any order. The first capacitor 11c is located on, for example, the connection line connecting the gate electrode and the source electrode of the second-A transistor 11da and connecting the gate electrode and the source electrode of the second-B transistor 11db. The gate electrode of the second-A transistor 11da and the gate electrode of the second-B transistor 11db are connected to, for example, the drain electrode of the first transistor 11g. The gate electrode of the third-A transistor 11ea and the gate electrode of the third-B transistor 11eb are connected to, for example, the emission control signal line 4e.

Figure 34:
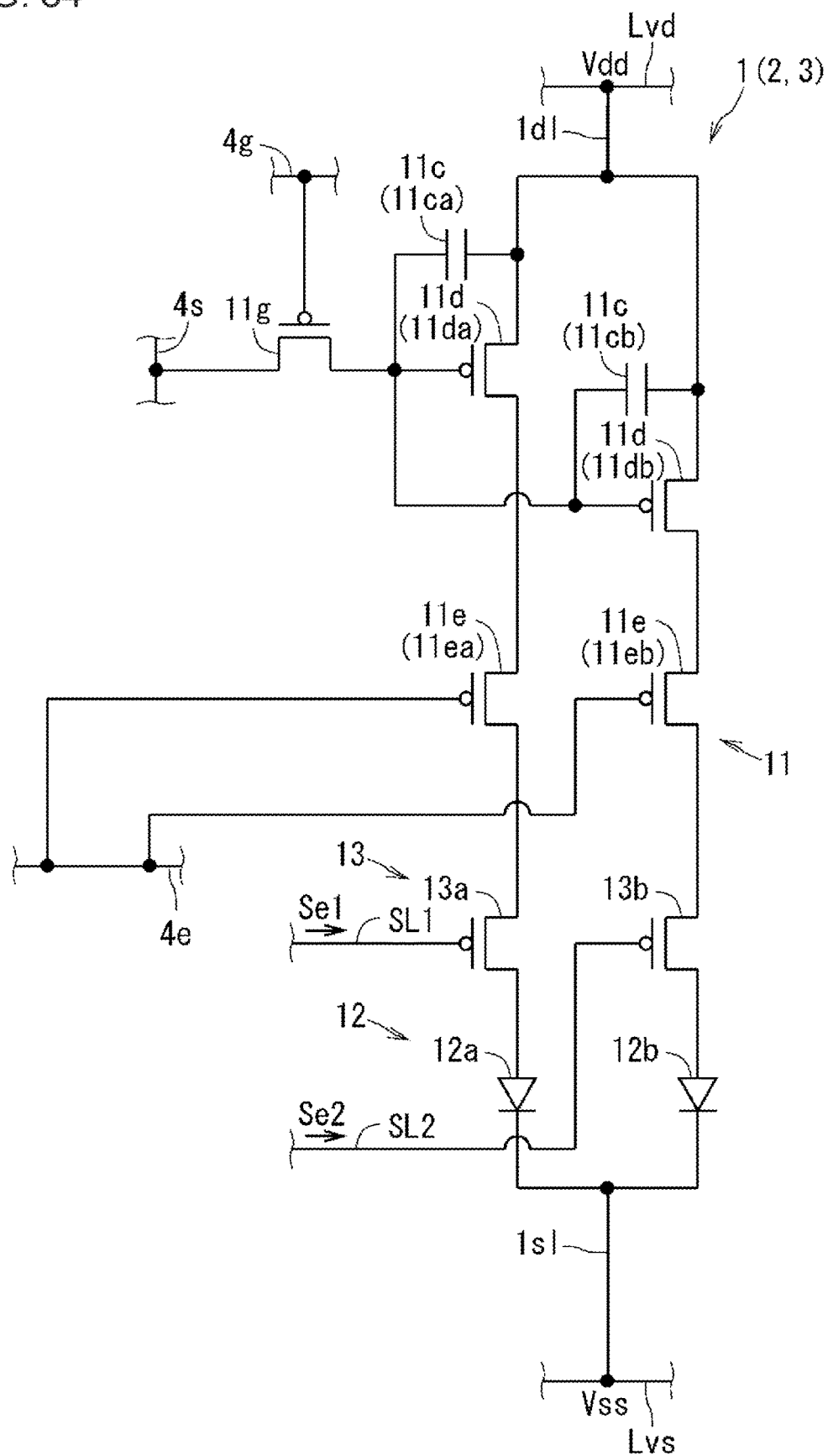
FIG. 34 is a circuit diagram of an example first subpixel circuit including two first capacitors, two second transistors, and two third transistors redundantly.
Figure 35:
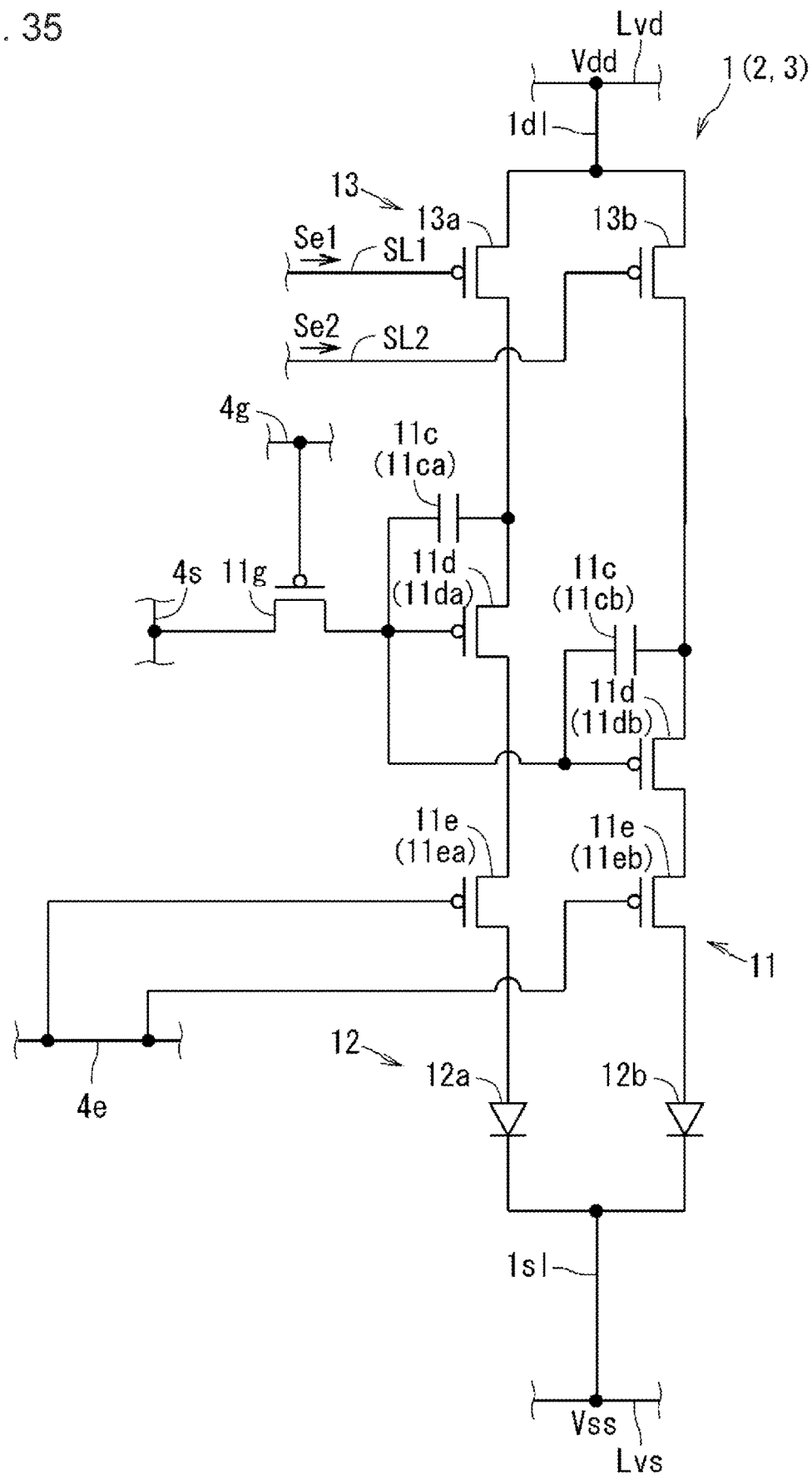
FIG. 35 is a circuit diagram of an example first subpixel circuit including a first setter and a first light emitter unit connected through a first emission controller.

FIG. 34 is a circuit diagram of an example first subpixel circuit 1 including two first capacitors 11c, two second transistors 11d, and two third transistors 11e redundantly. The first subpixel circuit 1 illustrated in FIG. 34 is altered from the first subpixel circuit 1 in FIG. 33, with the first capacitor 11c being replaced with two first capacitors 11c included redundantly. As illustrated in FIG. 34, the two first capacitors 11c include a first-A capacitor 11ca and a first-B capacitor 11cb. The first-A capacitor 11ca is located on, for example, the connection line connecting the gate electrode and the source electrode of the second-A transistor 11da. The first-B capacitor 11cb is located on, for example, the connection line connecting the gate electrode and the source electrode of the second-B transistor 11db. The second-A transistor 11da, the third-A transistor 11ea, the fourth transistor 13a, and the first light emitter 12a may be connected in, for example, series in any order. The second-B transistor 11db, the third-B transistor 11eb, the fifth transistor 13b, and the second light emitter 12b may be connected in series in any order. FIG. 35 is a circuit diagram of an example first subpixel circuit 1 including the first setter 13 and the first light emitter unit 12 connected to each other through the first emission controller 11. In the example in FIG. 35, the fourth transistor 13a in the first setter 13 is connected to the first light emitter 12a in the first light emitter unit 12 through the second-A transistor 11da and the third-A transistor 11ea in the first emission controller 11. In the example in FIG. 35, the fifth transistor 13b in the first setter 13 is connected to the second light emitter 12b in the first light emitter unit 12 through the second-B transistor 11db and the third-B transistor 11eb in the first emission controller 11.

In each of the above embodiments, as illustrated in the example in FIG. 36, multiple display devices 100 may be tiled together into a single display (also referred to as a tiled display or a multi-display) 700. FIG. 36 is a schematic front view of an example of the tiled display 700. In the example in FIG. 36, the tiled display 700 includes a matrix of multiple display devices 100 in an XZ plane. Each of the display devices 100 is, for example, a flat plate.

More specifically, the multi-display 700 as a composite display device includes multiple display devices 100. In other words, the composite display device includes multiple display devices 100 that are integrated into a single display device. The display devices 100 include the side surfaces F3 of the substrates 20 adjacent to or in contact with one another to form a composite display surface. The composite display surface may be an integral display surface including multiple display surfaces (first surfaces F1) combined together. The side surfaces F3 of the substrates 20 may be bonded together with an adhesive. The multi-display 700 as a composite display device may include multiple display devices 100 on a base substrate. The multiple display devices 100 may be fixed to the base substrate with the side surfaces F3 of the substrates 20 being adjacent to or in contact with one another. In this structure, the side surfaces F3 of the substrates 20 may not be bonded to one another. The display devices 100 may be fastened to the base substrate by, for example, screwing, fitting the display devices 100 into the frame, or bonding. The composite display surface may be entirely a flat surface, a curved surface such as a spherical surface, or a complex stereoscopic surface.

In each of the above embodiments, the pixel circuit 10 may include, for example, at least the first subpixel circuit 1 and the second subpixel circuit 2. The pixel circuit 10 may include, for example, one or more subpixel circuits having the same or similar structure as the first subpixel circuit 1, in addition to the first subpixel circuit 1 and the second subpixel circuit 2. In this case, for example, the gate electrode of the fourth transistor 13a as the first switch in each of the first subpixel circuit 1 and the other subpixel circuits may be connected to the same setting control signal line (e.g., first setting control signal line SL1). The gate electrode of the fifth transistor 13b as the second switch in each of the first subpixel circuit 1 and the other subpixel circuits may be connected to the same setting control signal line (e.g., second setting control signal line SL2). In the seventh embodiment, for example, the gate electrode of the eleventh transistor 13c as the first connection select switch in each of the first subpixel circuit 1 and in the other subpixel circuits may be connected to the same setting control signal line (e.g., fifth setting control signal line SL5). The pixel circuit 10 may include, for example, one or more subpixel circuits having the same or similar structure as the second subpixel circuit 2, in addition to the first subpixel circuit 1 and the second subpixel circuit 2. In this case, for example, the gate electrode of the ninth transistor 23a as the third switch in each of the second subpixel circuit 2 and the other subpixel circuits may be connected to the same setting control signal line (e.g., third setting control signal line SL3). The gate electrode of the tenth transistor 23b as the fourth switch in each of the second subpixel circuit 2 and the other subpixel circuits may be connected to the same setting control signal line (e.g., fourth setting control signal line SL4). In the seventh embodiment, for example, the gate electrode of the twelfth transistor 23c as the second connection select switch in each of the second subpixel circuit 2 and the other subpixel circuits may be connected to the same setting control signal line (e.g., sixth setting control signal line SL6).

In each of the above embodiments, the setting controller 5 may be, for example, a function of the drive 30. In this case, for example, the drive 30 may output, to the first setter 13 and the second setter 23 in each pixel circuit 10, setting control signals such as the first setting control signal Se1, the second setting control signal Se2, the third setting control signal Se3, and the fourth setting control signal Se4 through a signal line such as the first setting control signal line SL1, the second setting control signal line SL2, the third setting control signal line SL3, and the fourth setting control signal line SL4. This structure may allow, for example, the drive 30 to collectively change the setting modes of all the pixel circuits 10 from the normal mode to the failure mode. In the seventh embodiment, for example, the drive 30 may output a setting control signal such as the fifth setting control signal Se5 or the sixth setting control signal Se6 to the first setter 13 and the second setter 23 in each pixel circuit 10 through a signal line such as the fifth setting control signal line SL5 or the sixth setting control signal line SL6.

In each of the above embodiments, for example, all or some of the pixel circuits 10 in the display device 100 or the display panel 100p may have the normal mode, or have the failure mode in addition to the normal mode.

The components described in the above embodiments and variations may be entirely or partially combined as appropriate unless any contradiction arises.

REFERENCE SIGNS LIST 1 first subpixel circuit
10 pixel circuit
100 display device
100p display panel
11 first emission controller
11c first capacitor
11d second transistor
11e third transistor
11g first transistor
12 first light emitter unit 12a first light emitter
12b second light emitter
13 first setter
13a fourth transistor
13b fifth transistor
2 second subpixel circuit
21 second emission controller
21c second capacitor
21d seventh transistor
21e eighth transistor
21g sixth transistor
22 second light emitter unit
22a third light emitter
22b fourth light emitter
23 second setter
23a ninth transistor
23b tenth transistor
3 third subpixel circuit
30 drive
5 setting controller
700 multi-display (tiled display, composite display)
F1 display surface (first surface)
F2 non-display surface (second surface)
F3 side surface
Se1 first setting control signal
Se2 second setting control signal
Se3 third setting control signal
Se4 fourth setting control signal

The invention claimed is:

1. A pixel circuit, comprising:
a first subpixel circuit including a first light emitter, a second light emitter, and a first setter, the first setter being configured to set each of the first light emitter and the second light emitter selectively to one of an emissive state or a non-emissive state; and
a second subpixel circuit including a third light emitter, a fourth light emitter, and a second setter, the second setter being configured to set each of the third light emitter and the fourth light emitter selectively to one of the emissive state or the non-emissive state,
wherein the first subpixel circuit and the second subpixel circuit are in at least one of a connection different state or an emitter number different state, where the connection different state is a state in which a connection between the first light emitter and the second light emitter is one of a series connection or a parallel connection and a connection between the third light emitter and the fourth light emitter is the other of the series connection or the parallel connection, and the emitter number different state is a state in which an emission status of the first light emitter and the second light emitter set by the first setter is in one of a first emission setting or a second emission setting and an emission status of the third light emitter and the fourth light emitter set by the second setter is in the other of the first emission setting or the second emission setting, where the first emission setting is a setting to cause the first light emitter and the second light emitter or the third light emitter and the fourth light emitter to be in the emissive state, and the second emission setting is a setting to selectively cause one of the first light emitter or the second light emitter or one of the third light emitter or the fourth light emitter to be in the emissive state.

2. The pixel circuit according to claim 1, wherein
the first light emitter and the second light emitter emits light of a first color, and
the third light emitter and the fourth light emitter emits light of a second color different from the first color.

3. The pixel circuit according to claim 1, wherein
the first light emitter and the second light emitter are connected in parallel,
the first setter includes a first switch connected in series to the first light emitter and a second switch connected in series to the second light emitter, and the first setter is configured to set the first light emitter and the second light emitter to the emissive state by switching the first switch and the second switch to a conductive state,
the third light emitter and the fourth light emitter are connected in parallel, and
the second setter includes a third switch connected in series to the third light emitter and a fourth switch connected in series to the fourth light emitter, and the second setter is configured to selectively set one of the third light emitter or the fourth light emitter to the emissive state by selectively switching one of the third switch or the fourth switch to the conductive state.

4. The pixel circuit according to claim 3, wherein
the third switch includes a transistor of a first conductivity type and the fourth switch includes a transistor of a second conductivity type opposite to the first conductivity type, or
the third switch includes a transistor of the second conductivity type and the fourth switch includes a transistor of the first conductivity type.

5. The pixel circuit according to claim 3, wherein
the first setter is configured to selectively set one of the first light emitter or the second light emitter to the non-emissive state by selectively switching one of the first switch or the second switch to a nonconductive state.

6. The pixel circuit according to claim 1, wherein
the first light emitter and the second light emitter are connected in series,
the first setter includes a first switch connected in parallel to the first light emitter and a second switch connected in parallel to the second light emitter, and the first setter is configured to selectively set one of the first light emitter or the second light emitter to the emissive state by selectively switching one of the first switch or the second switch to a nonconductive state,
the third light emitter and the fourth light emitter are connected in series, and
the second setter includes a third switch connected in parallel to the third light emitter and a fourth switch connected in parallel to the fourth light emitter, and the second setter is configured to set the third light emitter and the fourth light emitter to the emissive state by switching the third switch and the fourth switch to the nonconductive state.

7. The pixel circuit according to claim 6, wherein
the first switch includes a transistor of a first conductivity type and the second switch includes a transistor of a second conductivity type opposite to the first conductivity type, or
the first switch includes a transistor of the second conductivity type and the second switch includes a transistor of the first conductivity type.

8. The pixel circuit according to claim 6, wherein
the second setter is configured to selectively set one of the third light emitter or the fourth light emitter to the non-emissive state by selectively switching one of the third switch or the fourth switch to a conductive state.

9. The pixel circuit according to claim 1, wherein
the first light emitter and the second light emitter are connected in parallel,
the first setter includes a first switch connected in series to the first light emitter and a second switch connected in series to the second light emitter, and the first setter is configured to set the first light emitter and the second light emitter to the emissive state by switching the first switch and the second switch to a conductive state,
the third light emitter and the fourth light emitter are connected in series, and
the second setter includes a third switch connected in parallel to the third light emitter and a fourth switch connected in parallel to the fourth light emitter, and the second setter is configured to set the third light emitter and the fourth light emitter to the emissive state by switching the third switch and the fourth switch to a nonconductive state.

10. The pixel circuit according to claim 1, further comprising:
a setting controller configured to output a setting control signal to the first setter and the second setter,
wherein the first setter is configured to set each of the first light emitter and the second light emitter selectively to one of the emissive state or the non-emissive state in response to the setting control signal, and
the second setter is configured to set each of the third light emitter and the fourth light emitter selectively to one of the emissive state or the non-emissive state in response to the setting control signal.

11. A display panel, comprising:
a plurality of the pixel circuits according to claim 10, each of the plurality of pixel circuits including the setting controller.

12. The pixel circuit according to claim 1, wherein
the connection between the first light emitter and the second light emitter is settable selectively to one of the series connection or the parallel connection, and
the connection between the third light emitter and the fourth light emitter is settable selectively to one of the series connection or the parallel connection.

13. A display panel, comprising:
a plurality of the pixel circuits according to claim 1; and
a setting controller configured to output a setting control signal to the first setter and the second setter in each of the plurality of pixel circuits,
wherein the first setter is configured to set each of the first light emitter and the second light emitter selectively to one of the emissive state or the non-emissive state in response to the setting control signal, and
the second setter is configured to set each of the third light emitter and the fourth light emitter selectively to one of the emissive state or the non-emissive state in response to the setting control signal.

14. A display device, comprising:
the display panel according to claim 13; and
a drive electrically connected to the plurality of pixel circuits.

15. The display device according to claim 14, further comprising:
a substrate including a display surface, a non-display surface opposite to the display surface, and a side surface connecting the display surface and the non-display surface,
wherein the plurality of pixel circuits is located on the display surface of the substrate, and
the drive is located on the non-display surface of the substrate.

16. A composite display device, comprising:
a plurality of the display devices according to claim 15, the plurality of display devices including a composite display surface with side surfaces of substrates of the plurality of display devices being adjacent to or in contact with one another.

17. A display device, comprising:
a plurality of the pixel circuits according to claim 1; and
a drive electrically connected to the plurality of pixel circuits, the drive being configured to output a setting control signal to the first setter and the second setter in each of the plurality of pixel circuits,
wherein in each of the plurality of pixel circuits, the first setter is configured to set each of the first light emitter and the second light emitter selectively to one of the emissive state or the non-emissive state in response to the setting control signal, and in each of the plurality of pixel circuits, the second setter is configured to set each of the third light emitter and the fourth light emitter selectively to one of the emissive state or the non-emissive state in response to the setting control signal.

* * * * *